(12) United States Patent
Kim

(10) Patent No.: US 12,238,965 B2
(45) Date of Patent: Feb. 25, 2025

(54) LIGHT EMITTING DISPLAY APPARATUS AND MULTI-SCREEN DISPLAY APPARATUS INCLUDING THE SAME

(71) Applicant: LG Display Co., Ltd., Seoul (KR)

(72) Inventor: Byungjin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 476 days.

(21) Appl. No.: 17/524,686

(22) Filed: Nov. 11, 2021

(65) Prior Publication Data

US 2022/0158139 A1 May 19, 2022

(30) Foreign Application Priority Data

Nov. 17, 2020 (KR) .......................... 10-2020-0153377

(51) Int. Cl.
| | | |
|---|---|---|
| H10K 50/86 | (2023.01) | |
| G09F 9/302 | (2006.01) | |
| H10K 50/844 | (2023.01) | |

(52) U.S. Cl.
CPC ........... *H10K 50/86* (2023.02); *G09F 9/3026* (2013.01); *H10K 50/844* (2023.02)

(58) Field of Classification Search
CPC ................... H10K 59/18; H10K 59/38; H10K 59/871–8723; H10K 59/873; H10K 59/8722–8723; H10K 50/844; H10K 59/87; H10K 50/84; H10K 59/122; H10K 50/8426

See application file for complete search history.

(56) References Cited

U.S. PATENT DOCUMENTS

| | | | |
|---|---|---|---|
| 2016/0044751 A1* | 2/2016 | Ikeda | .............. H10K 59/40 |
| | | | 362/227 |
| 2016/0285038 A1* | 9/2016 | Kim | ............. H10K 59/8731 |
| 2021/0384461 A1* | 12/2021 | Kim | .............. H10K 59/126 |

FOREIGN PATENT DOCUMENTS

| | | | | |
|---|---|---|---|---|
| CN | 110518145 A | * | 11/2019 | ............ H10K 71/00 |
| KR | 20170135587 A | | 12/2017 | |
| KR | 20200062635 A | | 6/2020 | |

* cited by examiner

*Primary Examiner* — Evan G Clinton
(74) *Attorney, Agent, or Firm* — Seed IP Law Group LLP

(57) ABSTRACT

A light emitting display apparatus and a multi-screen display apparatus including the same are disclosed. The light emitting display apparatus include a substrate, a light emitting device layer including a light emitting device disposed on the substrate, a dam pattern portion disposed at an edge portion of the substrate, an encapsulation layer disposed on the light emitting device layer and including an organic material disposed in an inner region surrounded by the dam pattern portion, and a device isolation portion disposed at the edge portion of the substrate to isolate the light emitting device, the dam pattern portion includes a discontinuous dam pattern disposed along the edge portion of the substrate.

20 Claims, 16 Drawing Sheets

LIGHT EMITTING DISPLAY APPARATUS AND MULTI-SCREEN DISPLAY APPARATUS INCLUDING THE SAME

CROSS-REFERENCE TO RELATED APPLICATIONS

This application claims the benefit of the Korean Patent Application No. 10-2020-0153377 filed on Nov. 17, 2020, which is hereby incorporated by reference as if fully set forth herein.

BACKGROUND

Technical Field

The present disclosure relates to a light emitting display apparatus and a multi-screen display apparatus including the same.

Description of the Related Art

Light emitting display apparatuses which are self-emitting light emitting display apparatuses, do not need a separate light source unlike liquid crystal display (LCD) apparatuses, and thus, they may be manufactured to be lightweight and thin. Also, light emitting display apparatuses are driven with a low voltage and thus is reduced in power consumption. Further, light emitting display apparatuses are good in color implementation, response time, viewing angle, and contrast ratio, and thus, are attracting much attention as the next-generation display apparatuses.

Light emitting display apparatuses display an image based on the light emission of a light emitting device layer including a light emitting device disposed between two electrodes. In this case, light emitted by the light emitting device is discharged to the outside through an electrode and a substrate.

Light emitting display apparatuses include a display panel implemented to display an image. The display panel may include a display area, including a plurality of pixels for displaying an image, and a bezel area surrounding the display area.

A light emitting display apparatus of the related art needs a bezel or a mechanism for covering a bezel area disposed at a border (or a periphery portion) of a display panel. Further, the light emitting display apparatus of the related art has a large bezel width (e.g., a large width of the bezel) due to the presence of the bezel. Also, when the bezel width of the light emitting display apparatus is reduced below a certain limit, a light emitting device may be degraded by penetration of external, foreign materials such as water or moisture, and due to this, the reliability of the light emitting device may be reduced.

Recently, multi-screen light emitting display apparatuses have been commercialized where a large screen is implemented by arranging the light emitting display apparatuses as a lattice type.

However, in a multi-screen light emitting display apparatus of the related art, a boundary portion such as a seam is formed between adjacent light emitting display apparatuses due to a bezel area or a bezel of each of a plurality of light emitting display apparatuses. The boundary portion may cause a sense of discontinuity (or non-continuously) of an image when one image is being displayed on a total screen of the multi-screen light emitting display apparatus, and due to this, the immersion of a viewer watching the image may be reduced.

BRIEF SUMMARY

Accordingly, the present disclosure is directed to providing a light emitting display apparatus and a multi-screen display apparatus including the same that substantially obviate one or more problems due to limitations and disadvantages of the related art.

Embodiments of the present disclosure are directed to providing a light emitting display apparatus and a multi-screen display apparatus including the same, which have a thin bezel width and prevent the reliability of a light emitting device from being reduced by penetration of water.

Embodiments of the present disclosure are directed to providing a light emitting display apparatus and a multi-screen display apparatus including the same, which have a zero bezel and prevent the reliability of a light emitting device from being reduced by penetration of water.

Additional advantages and features of the disclosure will be set forth in part in the description which follows and in part will become apparent to those having ordinary skill in the art upon examination of the following or may be learned from practice of the disclosure. The technical features and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a light emitting display apparatus comprises a substrate, a light emitting device layer including a light emitting device disposed on the substrate, a dam pattern portion disposed at an edge portion of the substrate, an encapsulation layer disposed on the light emitting device layer and including an organic material disposed in an inner region surrounded by the dam pattern portion, and a device isolation portion disposed at the edge portion of the substrate to isolate the light emitting device, the dam pattern portion including a discontinuous dam pattern disposed along the edge portion of the substrate.

In another embodiment of the present disclosure, a light emitting display apparatus comprises a substrate, a device isolation portion including a first device isolation pattern and a second device isolation pattern disposed at an edge portion of the substrate to have an eaves structure, a light emitting device layer disposed on the substrate, a dam pattern portion disposed between the first device isolation pattern and the second device isolation pattern, and an encapsulation layer including an organic material disposed on the light emitting device layer and disposed in an inner region surrounded by the dam pattern portion, the light emitting device layer comprises a light emitting device including an isolation region isolated by the device isolation portion, and the dam pattern portion comprises a first dam pattern including a plurality of line dam patterns spaced apart from one another and a second dam pattern filled between the plurality of line dam patterns and disposed on the plurality of line dam patterns.

In another embodiment of the present disclosure, a multi-screen display apparatus comprises a plurality of display apparatuses disposed along at least one direction of a first direction and a second direction crossing the first direction, each of the plurality of display apparatuses comprises a light emitting display apparatus, the light emitting display apparatus comprises a substrate, a light emitting device layer including a light emitting device disposed on the substrate, a dam pattern portion disposed at an edge portion of the substrate, an encapsulation layer disposed on the light emitting device layer and including an organic material disposed in an inner region surrounded by the dam pattern portion, and a device isolation portion disposed at the edge portion of the substrate to isolate the light emitting device, the dam pattern portion comprises a discontinuous dam pattern disposed along the edge portion of the substrate.

In another embodiment of the present disclosure, a multi-screen display apparatus comprises a plurality of display apparatuses disposed along at least one direction of a first direction and a second direction crossing the first direction, each of the plurality of display apparatuses comprises a light emitting display apparatus, the light emitting display apparatus comprises a substrate, a device isolation portion including a first device isolation pattern and a second device isolation pattern disposed at an edge portion of the substrate to have an eaves structure, a light emitting device layer disposed on the substrate, a dam pattern portion disposed between the first device isolation pattern and the second device isolation pattern, and an encapsulation layer including an organic material disposed on the light emitting device layer and disposed in an inner region surrounded by the dam pattern portion, the light emitting device layer comprises a light emitting device including an isolation region isolated by the device isolation portion, and the dam pattern portion comprises a first dam pattern including a plurality of line dam patterns spaced apart from one another and a second dam pattern filled between the plurality of line dam patterns and disposed on the plurality of line dam patterns.

According to the embodiments of the present disclosure, a light emitting display apparatus and a multi-screen display apparatus including the same, which have a thin bezel width and prevent the reliability of a light emitting device from being reduced by penetration of water, may be provided.

According to the embodiments of the present disclosure, a light emitting display apparatus and a multi-screen display apparatus including the same, which have a zero bezel and prevent the reliability of a light emitting device from being reduced by penetration of water, may be provided.

According to the embodiments of the present disclosure, a reduction in reliability of a light emitting device caused by the lateral penetration of water or moisture occurring due to the loss or non-formation of a device isolation portion may be prevented, reduced or minimized.

According to some embodiments of the present disclosure, a display apparatus including no bezel or a zero bezel and a multi-screen display apparatus including the display apparatus may be provided.

According to some embodiments of the present disclosure, a multi-screen light emitting display apparatus for displaying an image without a sense of discontinuity may be provided.

It is to be understood that both the foregoing general description and the following detailed description of the present disclosure present embodiments and examples which may be explanatory, and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
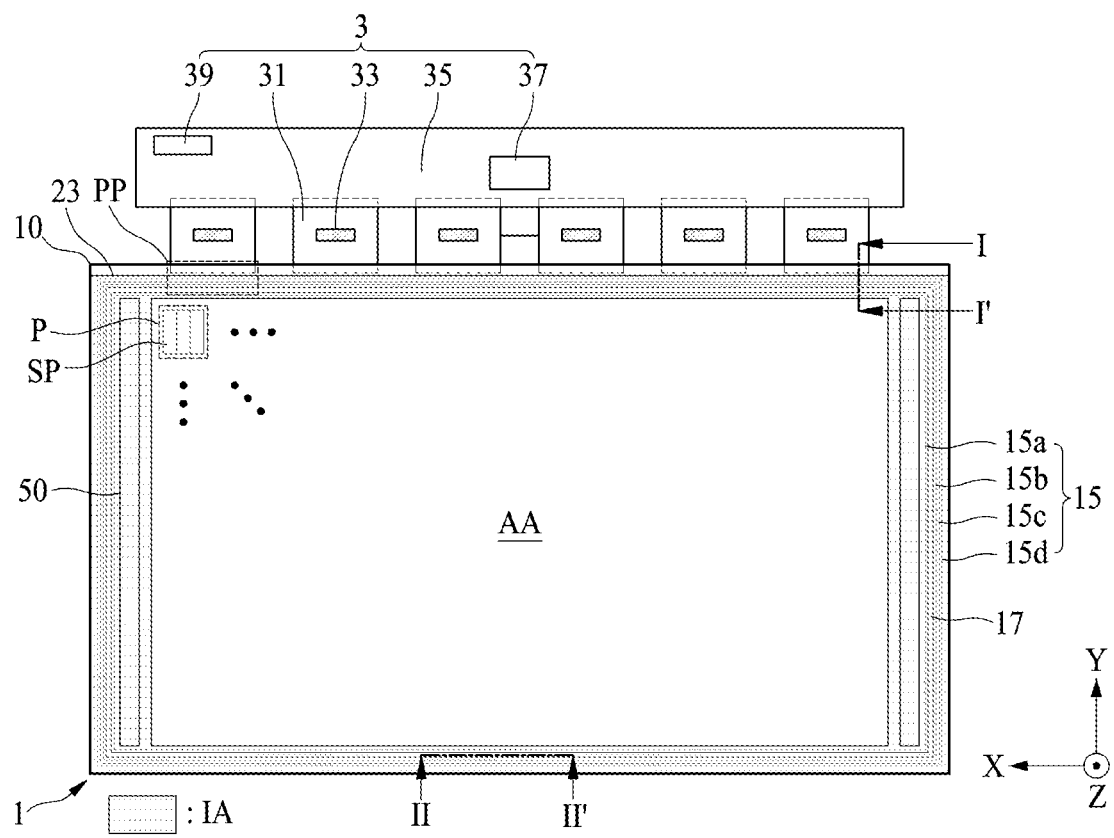
FIG. 1 is a diagram illustrating a light emitting display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the embodiments of the present disclosure are not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "coupled to" another element or layer, it may be directly on or directly coupled to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements. For example, if an encapsulation layer surrounds a dam pattern, this may be construed as the encapsulation layer at least partially surrounding the dam pattern. However, in some embodiments, the encapsulation layer may entirely surround the dam pattern. The meaning in which the term "surround" is used herein may be further specified based on the associated drawings and embodiments. In the present disclosure, the terms "surround," "at least partially surround," "completely surround" or the like is used. In accordance with the definition of "surround" as set forth above, when only the term "surround" is used in an embodiment, it may mean either at least partially surrounding or entirely surrounding one or more of the associated elements. The same applies for the term "cover."

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together with in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

Figure 2:
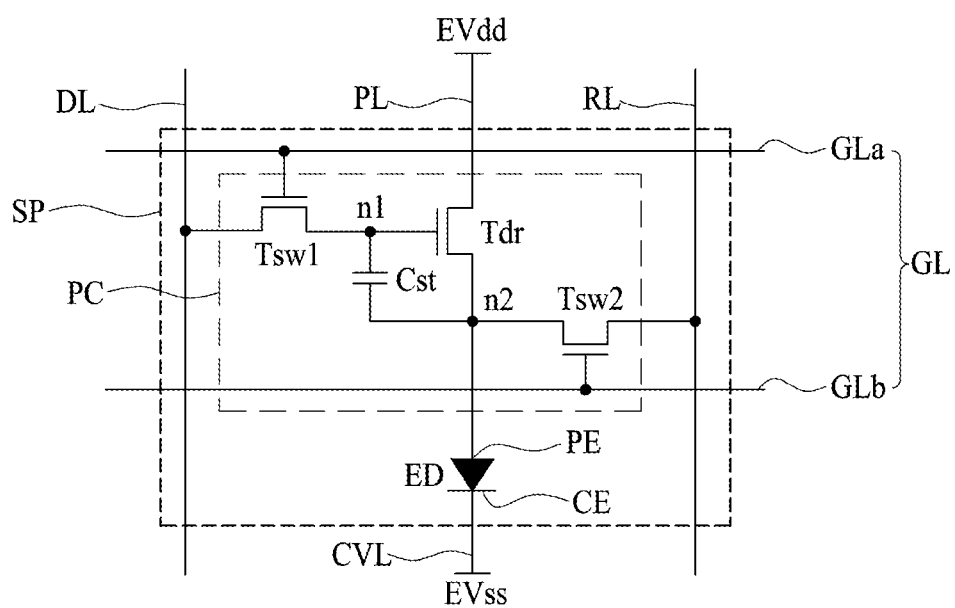
FIG. 2 is an equivalent circuit diagram illustrating one subpixel illustrated in FIG. 1.

FIG. 1 is a diagram illustrating a light emitting display apparatus according to an embodiment of the present disclosure, and FIG. 2 is an equivalent circuit diagram illustrating one subpixel illustrated in FIG. 1.

Referring to FIGS. 1 and 2, the light emitting display apparatus according to an embodiment of the present disclosure may include a light emitting display panel 1 and a panel driving circuit unit or circuitry 3.

The light emitting display panel 1 may include a substrate 10, a display area AA, a non-display area IA, a plurality of pixels P, a device isolation portion 15, and a dam pattern portion 17.

The substrate 10 may be a glass substrate, or may be a thin glass substrate or a plastic substrate, which may be bent or curved.

The display area AA may be an area which displays an image, and thus, may be referred to as a first area, a display portion, an active area, or an active portion. For example, the display area AA may be disposed at a remaining portion other than an edge portion of the substrate 10.

The non-display area IA may be an area which does not display an image, and thus, may be referred to as a second area, a non-display portion, an inactive area, or an inactive portion. For example, the non-display area IA may be disposed at the edge portion of the substrate 10 to surround the display area AA.

Each of the plurality of pixels P may be individually disposed in a corresponding pixel area of a plurality of pixel areas defined in the display area AA. The plurality of pixel areas may be defined by a plurality of pixel driving lines disposed in the display area AA.

Each of the plurality of pixels P may be disposed in a corresponding pixel area of the substrate 10 and may display an image corresponding to a data signal based on a scan signal and the data signal supplied through pixel driving lines adjacent thereto.

Each of the plurality of pixels P may include a plurality of subpixels SP adjacent to one another. The subpixel SP may be defined as a minimum unit area which emits real light. For example, at least three subpixels adjacent to one another may configure one pixel P or a unit pixel P for displaying a color image.

The pixel P according to an embodiment of the present disclosure may include first to third subpixels SP which are arranged to be adjacent to one another in a first direction X. In this case, the first subpixel may be a red subpixel, the second subpixel may be a green subpixel, and the third subpixel may be a blue subpixel. However, the embodiments of the present disclosure are not limited thereto. According to an embodiment of the present disclosure, a light emitting device layer disposed in each of the first to third subpixels SP may emit common light having the same color. For example, the common light may be white light, but embodiments of the present disclosure are not limited thereto and may be blue light. Each of the first to third subpixels SP may further include a wavelength conversion member which converts white light (or blue light) into different color light. For example, the wavelength conversion member may include at least one of a color filter layer and a quantum dot layer.

According to another embodiment of the present disclosure, the pixel P may include first to fourth subpixels SP which are arranged to be adjacent to one another in at least one direction of the first direction X and a second direction Y. In this case, the first subpixel may be a red subpixel, the second subpixel may be a white subpixel, the third subpixel may be a blue subpixel, and the fourth subpixel may be a green subpixel. However, embodiments of the present disclosure are not limited thereto. According to an embodiment of the present disclosure, a light emitting device layer disposed in each of the first to fourth subpixels SP may emit common light having the same color. For example, the common light may be white light, but embodiments of the present disclosure are not limited thereto and may be blue light. Each of the first, third, and fourth subpixels SP may further include a wavelength conversion member which converts white light (or blue light) into different color light. For example, the wavelength conversion member may include at least one of a color filter layer and a quantum dot layer. For example, the second subpixel may include a step height compensation layer instead of the wavelength conversion member.

The subpixel SP may be coupled to pixel driving lines adjacent thereto and may display an image corresponding to a data signal based on a scan signal and the data signal supplied through the pixel driving lines.

The subpixel SP according to an embodiment of the present disclosure may be coupled to a gate line GL, a data line DL, a pixel driving power line PL, and a reference voltage line RL. For example, in response to the scan signal supplied through the gate line GL, the subpixel SP may emit light with a data current which flows from the pixel driving power line PL to a common electrode CE based on a difference voltage between a data voltage supplied through the data line DL and a reference voltage supplied through the reference voltage line RL, thereby displaying an image.

The gate line GL may be disposed in the display area AA of the substrate 10. For example, the gate line GL may extend long in the first direction X. The gate line GL according to an embodiment of the present disclosure may include first and second gate lines GLa and GLb which are arranged in parallel in the first direction X.

The data line DL may be disposed in the display area AA of the substrate 10 to overlap the gate line GL. For example, the data line DL may extend long in the second direction Y crossing the first direction X.

The pixel driving power line PL may be disposed in the display area AA of the substrate 10 in parallel with the data line DL.

The reference voltage line RL may be disposed in the display area AA of the substrate 10 in parallel with the data line DL. For example, one reference voltage line RL may be provided for each pixel P disposed in the first direction X, and in this case, one reference voltage line RL may be coupled to a plurality of subpixels SP configuring one pixel P in common. Optionally, the reference voltage line RL may be omitted based on a driving (or operation) scheme of the pixel P.

The common electrode CE may be disposed in the display area AA of the substrate 10 and may be electrically coupled to the subpixel SP of each of the plurality of pixels P. For example, the common electrode CE may be coupled to each of the plurality of subpixels SP in common.

The common electrode CE may be electrically coupled to a plurality of pixel common voltage lines CVL disposed in the display area AA of the substrate 10 in parallel with the data line DL. For example, each of the plurality of pixel common voltage lines CVL may be electrically coupled to the common electrode CE in the display area AA. For example, each of the plurality of pixel common voltage lines CVL may be electrically coupled to the common electrode CE, between at least two or more adjacent pixels P disposed in the display area AA or in a boundary region between at least two or more adjacent pixels P. For example, one pixel common voltage line CVL may be electrically coupled to the common electrode CE through at least two or more line (or electrode) contact portions.

The subpixel SP according to an embodiment of the present disclosure may include a light emitting device ED and a pixel circuit PC.

The light emitting device ED may be implemented between a pixel electrode (or an anode electrode) PE electrically coupled to a pixel circuit PC and a common electrode (or a cathode electrode) CE. The light emitting device ED may emit light by a data current supplied from the pixel circuit PC and may emit light having a luminance corresponding to the data current. For example, a pixel electrode PE disposed at each of the plurality of subpixels SP, a light emitting device disposed at the pixel electrode PE of each of the plurality of subpixels SP and a portion of non-display area IA, and a common electrode CE disposed over the light emitting device may be referred to as a light emitting device layer, but embodiments of the present disclosure are not limited thereto.

The light emitting device ED according to an embodiment may include an organic light emitting layer. The light emitting device ED may be interposed between a hole functional layer and an electron functional layer. The light emitting device ED may emit light having luminance corresponding to a data current by emitting light based on the data current supplied from the pixel circuit PC.

The pixel circuit PC may provide the light emitting device ED with the data current which corresponds to the difference voltage between the data voltage supplied through the adjacent data line DL and the reference voltage supplied through the adjacent reference voltage line RL, in response to the scan signal supplied through the adjacent gate line GL.

The pixel circuit PC according to an embodiment may include a first switching thin film transistor Tsw1, a second switching thin film transistor Tsw2, a driving thin film transistor Tdr, and a storage capacitor Cst. In the following description, a thin film transistor may be referred to as a TFT.

At least one of the first switching TFT Tsw1, the second switching TFT Tsw2, and the driving TFT Tdr may be an amorphous-silicon (a-Si) TFT, a polysilicon (poly-Si) TFT, an oxide TFT, or an organic TFT. For example, in the pixel circuit PC, some of the first switching TFT Tsw1, the second switching TFT Tsw2, and the driving TFT Tdr may be a TFT including a semiconductor layer (or an active layer) including low temperature poly-Si (LTPS) having a good response characteristic, and the other TFT of the first switching TFT Tsw1, the second switching TFT Tsw2, and the driving TFT Tdr may be a TFT including a semiconductor layer (or an active layer) including oxide having a good off-current characteristic.

The first switching TFT Tsw1 may include a gate electrode coupled to a first gate line GLa of the gate line GL, a first electrode (drain/source) coupled to the adjacent data line DL, and a second electrode (drain/source) coupled to a gate node n1 of the driving TFT Tdr. The first switching TFT Tsw1 may transfer the data voltage, supplied through the adjacent data line DL, to the gate node n1 of the driving TFT Tdr based on a first scan signal supplied to the first gate line GLa.

The second switching TFT Tsw2 may include a gate electrode coupled to a second gate line GLb of the gate line GL, a first electrode (drain/source) coupled to a source node n2 of the driving TFT Tdr, and a second (drain/source) electrode coupled to the adjacent reference voltage line RL. The second switching TFT Tsw2 may transfer the reference voltage, supplied through the adjacent reference voltage line RL, to the source node n2 of the driving TFT Tdr based on a second scan signal supplied to the second gate line GLb.

The storage capacitor Cst may be formed between the gate node n1 and the source node n2 of the driving TFT Tdr. The storage capacitor Cst according to an embodiment may include a first capacitor electrode coupled to the gate node n1 of the driving TFT Tdr, a second capacitor electrode coupled to the source node n2 of the driving TFT Tdr, and a dielectric layer formed in an overlap region between the first capacitor electrode and the second capacitor electrode. The storage capacitor Cst may be charged with a difference voltage between the gate node n1 and the source node n2 of the driving TFT Tdr, and then, may turn on or off the driving TFT Tdr based on a charged voltage thereof.

The driving TFT Tdr may include a gate electrode (or a gate node n1) coupled to the second electrode (drain/source) of the first switching TFT Tsw1 and the first capacitor electrode of the storage capacitor Cst in common, a first electrode (drain/source) (or a source node n2) coupled to the first electrode (drain/source) of the second switching TFT Tsw2, the second capacitor electrode of the storage capacitor Cst, and a pixel electrode PE of the light emitting device ED in common, and a second electrode (drain/source) (or a drain node) coupled to a pixel driving power line PL. The driving TFT Tdr may be turned on based on a voltage of the storage capacitor Cst and may control the amount of current flowing to the light emitting device ED through the pixel driving power line PL to which a pixel driving voltage EVdd is supplied.

The device isolation portion 15 may be implemented at an edge portion of the substrate 10. For example, the device isolation portion 15 may be disposed at the edge portion of the substrate 10 to surround an outermost pixel P disposed in the display area AA. For example, the device isolation portion 15 may be disposed along the non-display area IA of the substrate 10 to have a closed loop line shape (or a closed loop shape) which surrounds the display area AA. The device isolation portion 15 may isolate (or separate) the light emitting device ED in an outer portion of the display area AA or the non-display area IA to block a lateral water transmission path, and thus, may prevent, reduce or minimize a reduction in reliability of the light emitting device ED caused by the lateral penetration of water or moisture. The device isolation portion 15 may additionally isolate (or separate) the common electrode CE, and in this case, an end of the common electrode CE isolated by the device isolation portion 15 may be implemented to cover an end of the light emitting device ED isolated by the device isolation portion 15. For example, the device isolation portion 15 may be referred to as a water penetration blocking portion, a water penetration prevention portion, a trench pattern portion, a cliff pattern portion, an eaves structure, or the like. For example, the device isolation portion 15 may be defined as an isolation region, an isolation line, a disconnection region, or a disconnection line, of the light emitting device layer 13 (see FIG. 3).

The device isolation portion 15 according to an embodiment of the present disclosure may include at least two or more device device isolation patterns 15a to 15d. For example, the device isolation portion 15 may include first to fourth device device isolation patterns 15a to 15d.

Each of the at least two or more device isolation patterns 15a to 15d may have a closed loop line shape which surrounds the display area AA. For example, the first device isolation pattern 15a may be disposed adjacent to the display area AA, the second device isolation pattern 15b may be disposed to surround the first device isolation pattern 15a, the third device isolation pattern 15c may be disposed to surround the second device isolation pattern 15b, and the fourth device isolation pattern 15d may be disposed to surround the third device isolation pattern 15c.

Each of the at least two or more device isolation patterns 15a to 15d may include an eaves structure for isolating (or separating) the light emitting device ED. For example, each of the at least two or more device isolation patterns 15a to 15d may include an eaves structure which is implemented by an insulation layer and a metal pattern layer (or a metal layer) on the insulation layer. For example, the eaves structure may be referred to as the term such as an undercut structure or a cliff structure.

According to an embodiment of the present disclosure, the light emitting device ED formed on the at least two or more device isolation patterns 15a to 15d may be automatically isolated (or separated) during a deposition process by the eaves structure of the device isolation patterns 15a to 15d, without a separate isolation (or separation) process. Also, the common electrode CE disposed on the light emitting device ED may be automatically isolated (or separated) during a deposition process by the eaves structure of the device isolation patterns 15a to 15d.

The dam pattern portion 17 may be implemented at the edge portion of the substrate 10. For example, the dam pattern portion 17 may be disposed at the edge portion of the substrate 10 to surround the outermost pixel P disposed in the display area AA. For example, the dam pattern portion 17 may be disposed along the non-display area IA of the substrate 10 to have a closed loop line shape which surrounds the display area AA. The dam pattern portion 17 may prevent the spread or overflow of an encapsulation layer which is disposed on the substrate 10 to cover the display area AA. For example, the encapsulation layer may disposed on the light emitting device layer and my include an organic material disposed in an inner region surrounded by the dam pattern portion 17. Accordingly, the dam pattern portion 17 may prevent the organic material of the encapsulation layer from spreading or overflowing toward the edge portion of the substrate 10.

The dam pattern portion 17 may be disposed within the device isolation portion 15. For example, the dam pattern portion 17 may be implemented on the substrate 10 to surround at least one or more among the at least two or more device isolation patterns 15a to 15d and to be surrounded by at least one or more among the at least two or more device isolation patterns 15a to 15d. For example, the dam pattern portion 17 may be disposed between two adjacent device isolation patterns among the at least two or more device isolation patterns 15a to 15d. For example, with respect to the dam pattern portion 17, the at least two or more device isolation patterns 15a to 15d may be divided into a first device isolation portion (or an inner device isolation portion) and a second device isolation portion (or an outer device isolation portion). The first device isolation portion may be disposed between the display area AA and the dam pattern portion 17. The second device isolation portion may be disposed between the dam pattern portion 17 and an end (or an outer surface) of the substrate 10.

The dam pattern portion 17 according to an embodiment of the present disclosure may be implemented in a closed loop line shape to surround the first device isolation pattern 15a and may be implemented to be surrounded by the second to fourth device isolation patterns 15b to 15d. In this case, the first device isolation pattern 15a may be the first device isolation portion, and the second to fourth device isolation patterns 15b to 15d may be the second device isolation portion.

The dam pattern portion 17 may include a structure (or a structure element) for preventing a metal pattern layer for the eaves structure from being lost (or removed) in forming (or manufacturing) the at least two or more device isolation patterns 15a to 15d of the device isolation portion 15. The dam pattern portion 17 according to an embodiment of the present disclosure may include a discontinuous dam pattern and a continuous dam pattern.

The discontinuous dam pattern may be implemented to prevent the metal pattern layer for the eaves structure from being lost (or removed). For example, the discontinuous dam pattern may be referred to as the term such as a discontinuity dam pattern or a dotted-line dam pattern.

The discontinuous dam pattern according to an embodiment of the present disclosure may include a plurality of line dam patterns or segments of a dam layer that are spaced apart from one another to surround the display area AA. For example, the plurality of line dam patterns may be spaced apart from one another to have a predetermined or selected length and a predetermined or selected gap space between them. According to another embodiment of the present disclosure, the discontinuous dam pattern may include a plurality of line dam patterns surrounding the display area AA and a dam disconnection portion disposed between the plurality of line dam patterns.

According to an embodiment of the present disclosure, the device isolation portion 15 may be formed (or manufactured) after a process of manufacturing the discontinuous dam pattern. For example, in forming (or manufacturing) the at least two or more device isolation patterns 15a to 15d of the device isolation portion 15, the discontinuous dam pattern may provide a path through which a patterning material (or an etchant) for patterning (or etching) an insulation layer may move between an inner portion and an outer portion of the dam pattern portion 17, and thus, may prevent, reduce or minimize over-etching of the insulation layer under the metal pattern layer caused by the patterning material, thereby preventing or minimizing the loss (or removal) of the metal pattern layer in forming the eaves structure of the at least two or more device isolation patterns 15a to 15d. Accordingly, the at least two or more device isolation patterns 15a to 15d of the device isolation portion 15 may include a normal eaves structure without the loss of the metal pattern layer caused by over-etching of the insulation layer, and thus, may normally perform a function of isolating the light emitting device ED.

According to a comparative example, when the dam pattern portion 17 does not include the discontinuous dam pattern, the patterning material (or an etchant) may be confined in each of an inner portion and an outer portion of the dam pattern portion 17, and due to this, the metal pattern layer of the eaves structure may be lost (or removed) by over-etching of the insulation layer, whereby the device isolation patterns 15a to 15d may not be formed. In a case where the device isolation patterns 15a to 15d are not formed, because the light emitting device ED is not isolated, the reliability of the light emitting device ED may be reduced by the lateral penetration of water or moisture. For example, the patterning material (or an etchant) may be confined in the inner portion of the dam pattern portion 17, and due to this, a metal pattern layer of the first device isolation pattern 15a may be lost (or removed) by over-etching of the insulation layer, whereby the first device isolation pattern 15a may not be formed.

The continuous dam pattern may be disposed on the discontinuous dam pattern. For example, the continuous dam pattern may be filled into a disconnection portion (or a gap space) between the line dam patterns of the discontinuous dam pattern and may be disposed on the line dam patterns. The continuous dam pattern may prevent the spread or overflow of the encapsulation layer.

The continuous dam pattern according to an embodiment of the present disclosure may have a cross-sectional structure which differs from the discontinuous dam pattern. For example, the continuous dam pattern may include a plurality of protrusion patterns filled into a disconnection portion (or a gap space) between the line dam patterns of the discontinuous dam pattern, and a closed loop line pattern disposed on the line dam patterns and the plurality of protrusion patterns. For example, the plurality of protrusion patterns may each protrude from the closed loop line pattern toward the disconnection portion.

The light emitting display panel 1 according to an embodiment of the present disclosure may further include a plurality of pad parts PP.

Each of the plurality of pad parts PP may be disposed at one edge portion of the substrate 10 in the first direction X. For example, the one edge portion of the substrate 10 may be referred to as a first edge portion, an upper edge portion, a first non-display area, an upper non-display area, a first periphery area, a first periphery portion, or the like.

Each of the plurality of pad parts PP according to an embodiment of the present disclosure may include a data pad electrically coupled to the data line DL through a link line, a reference voltage pad electrically coupled to the reference voltage line through a link line, and a pixel common voltage pad electrically coupled to a pixel common voltage line through a link line.

Each of a first pad part and a last pad part among the plurality of pad parts PP may include a plurality of gate pads.

The light emitting display panel 1 according to an embodiment may further include a gate driving circuit 50.

The gate driving circuit 50 may supply gate signals to the gate lines based on a gate control signal (or a scan control signal) provided through the link lines and the plurality of gate pads of the pad part PP from the driving circuit unit 3. The gate driving circuit 50 according to an embodiment may be directly implemented in the non-display area IA at the substrate 10 together with a TFT manufacturing process implementing the pixel circuit PC of the subpixel SP. For example, the gate driving circuit 50 may be disposed in at least one of both non-display areas IA of the substrate 10 facing each other. According to another embodiment, the gate driving circuit 50 may be implemented as an IC, and in this case, the gate driving circuit 50 may be mounted at the substrate 10 and may be coupled to the gate lines, or may be mounted at the flexible circuit film and may be coupled to the gate lines through a gate pad of the substrate 10.

The driving circuit unit 3 may be coupled to the pad part PP disposed at one edge portion of the substrate 10 and may allow each subpixel SP to display an image corresponding to video data supplied from a display driving system.

The driving circuit unit 3 according to an embodiment may include a plurality of flexible circuit films 31, a plurality of data driving integrated circuits (ICs) 33, a printed circuit board (PCB) 35, a timing controller 37, and a power circuit unit 39.

Each of the plurality of flexible circuit films 31 may be attached at the PCB 35 and the pad part PP provided at the substrate 10. For example, one edge portion (or an output bonding portion) of each of the plurality of flexible circuit films 31 may be attached at the pad part PP provided at the substrate 10 by a film attachment process using an anisotropic conductive film. The other edge portion (or an input bonding portion) of each of the plurality of flexible circuit films 31 may be attached at the PCB 35 by a film attachment process using an anisotropic conductive film.

Each of the plurality of data driving ICs 33 may be individually mounted at a corresponding flexible circuit film 31 of the plurality of flexible circuit films 31. Each of the plurality of data driving ICs 33 may receive pixel data and a data control signal provided from the timing controller 37, convert the pixel data into a pixel-based analog data voltage according to a data control signal, and supply the analog data voltage to a corresponding data line DL. For example, each of the plurality of data driving ICs 33 may generate a plurality of grayscale voltages by a plurality of reference gamma voltages provided from the PCB 35 and may select, as a pixel-based data voltage, a grayscale voltage corresponding to pixel data from among the plurality of grayscale voltages to output the selected data voltage.

Additionally, each of the plurality of data driving ICs 33 may generate a pixel common voltage (or a cathode voltage) and a pixel driving voltage (or an anode voltage) needed for driving (or light emitting) of the subpixels SP by the plurality of reference gamma voltages. As an example, each of the plurality of data driving ICs 33 may select, as a pixel driving voltage and a pixel common voltage, a predetermined or selected reference gamma voltage or a predetermined or selected grayscale voltage from among the plurality of reference gamma voltages or the plurality of grayscale voltages to output the pixel driving voltage and the pixel common voltage.

Moreover, each of the plurality of data driving ICs 33 may additionally generate and output a reference voltage based on a driving (or operating) method of each pixel P. For example, each of the plurality of data driving ICs 33 may select, as a reference voltage, a predetermined or selected reference gamma voltage or a predetermined or selected grayscale voltage from among the plurality of reference gamma voltages or the plurality of grayscale voltages to output the reference voltage. For example, the pixel driving voltage, the pixel common voltage, and the reference voltage may have different voltage levels.

Each of the plurality of data driving ICs 33 may sequentially sense a characteristic value of a driving TFT included in each of the subpixel SP through the plurality of reference voltage lines RL disposed at the substrate 10, generate sensing raw data corresponding to a sensing value, and provide the sensing raw data to the timing controller 37.

The PCB 35 may be coupled to the other edge portion of each of the plurality of flexible circuit films 31. The PCB 35 may transfer a signal and a voltage between elements of the driving circuit unit 3.

The timing controller 37 may be mounted at the PCB 35 and may receive image data and a timing synchronization signal provided from the display driving system through a user connector disposed on the PCB 35. Alternatively, the timing controller 37 may not be mounted at the PCB 35 and may be implemented in the display driving system or may be mounted at a separate control board coupled between the PCB 35 and the display driving system.

The timing controller 37 may align the video data based on the timing synchronization signal so as to match a pixel arrangement structure disposed in the display area AA and may provide the generated pixel data to each of the plurality of data driving ICs 33.

According to an embodiment, when the pixel P includes a white subpixel SP, the timing controller 37 may extract white pixel data based on the digital video data (i.e., red input data, green input data, and blue input data which are to be respectively supplied to corresponding pixels P), reflect offset data based on the extracted white pixel data in each of the red input data, the green input data, and the blue input data to calculate red pixel data, green pixel data, and blue pixel data, and align the calculated red pixel data, green pixel data, and blue pixel data and the white pixel data according to the pixel arrangement structure to supply aligned pixel data to each of the data driving ICs 33. For example, the timing controller 37 may convert red, green, and blue input data into four-color (for example, red, green, blue, and white) data based on a data conversion method disclosed in Korean Patent Publication No. 10-2013-0060476 or 10-2013-0030598, where all of these references are incorporated by reference into the present application.

The timing controller 37 may generate each of the data control signal and the gate control signal based on the timing synchronization signal, control a driving timing of each of the data driving ICs 33 based on the data control signal, and control a driving timing of the gate driving circuit 50 based on the gate control signal. For example, the timing synchronization signal may include a vertical synchronization signal, a horizontal synchronization signal, a data enable signal, and a main clock (or a dot clock).

The data control signal according to an embodiment may include a source start pulse, a source shift clock, and a source output signal. The gate control signal according to an embodiment may include a start signal (or a gate start pulse) and a plurality of shift clocks, or the like.

The timing controller 37 may drive each of the data driving ICs 33 and the gate driving circuit 50 based on an external sensing mode during a predetermined or selected external sensing period, generate compensation data for compensating for a characteristic variation of the driving TFT of each subpixel SP based on the sensing raw data provided from the data driving ICs 33, and modulate pixel data based on the generated compensation data. For example, the timing controller 37 may drive each of the data driving ICs 33 and the gate driving circuit 50 based on the external sensing mode for each external sensing period corresponding to a blank period (or a vertical blank period) of the vertical synchronization signal. For example, the external sensing mode may be performed in a process of powering on the display apparatus, a process of powering off the display apparatus, a process of powering off the display apparatus after being driven for a long time, or a blank period of a frame which is set in real time or periodically.

The timing controller 37 according to an embodiment may store the sensing raw data of each subpixel, provided from the data driving ICs 33, in a storage circuit based on the external sensing mode. Also, in a display mode, the timing controller 37 may correct pixel data which is to be supplied to each subpixel, based on the sensing raw data stored in the storage circuit and may provide corrected pixel data to the data driving ICs 33. Here, sensing raw data of each subpixel may include sequential variation information about each of a driving TFT and a light emitting device, which are disposed in a corresponding subpixel. Therefore, in the external sensing mode, the timing controller 37 may sense a characteristic value (for example, a threshold voltage or mobility) of a driving TFT disposed in each subpixel SP and based thereon, may correct pixel data which is to be supplied to each subpixel SP, thereby minimizing or preventing the degradation in image quality caused by a characteristic value deviation of driving TFTs of a plurality of subpixels SP. The external sensing mode of a light emitting display apparatus may be technology known to those skilled in the art, and thus, their detailed descriptions are omitted or may be brief. For example, the light emitting display apparatus according to the present disclosure may sense a characteristic value of the driving TFT disposed in each subpixel SP based on a sensing mode disclosed in Korean Patent Publication No. 10-2016-0093179, 10-2017-0054654, or 10-2018-0002099, where all of these references are incorporated by reference into the present application.

The power circuit unit 39 may be mounted at the PCB 35 and may generate various source voltages needed for displaying an image on the pixels P by an input power supplied from the outside to provide the generated source voltage to a corresponding circuit. For example, the power circuit unit 39 may generate and output a logic source voltage needed for driving of each of the timing controller 37 and the data driving ICs 33, the plurality of reference gamma voltages provided to the data driving ICs 33, and at least one gate driving voltages and at least one gate common voltages needed for driving of the gate driving circuit 50. The gate driving voltages and the gate common voltages may have different voltage levels.

Figure 3:
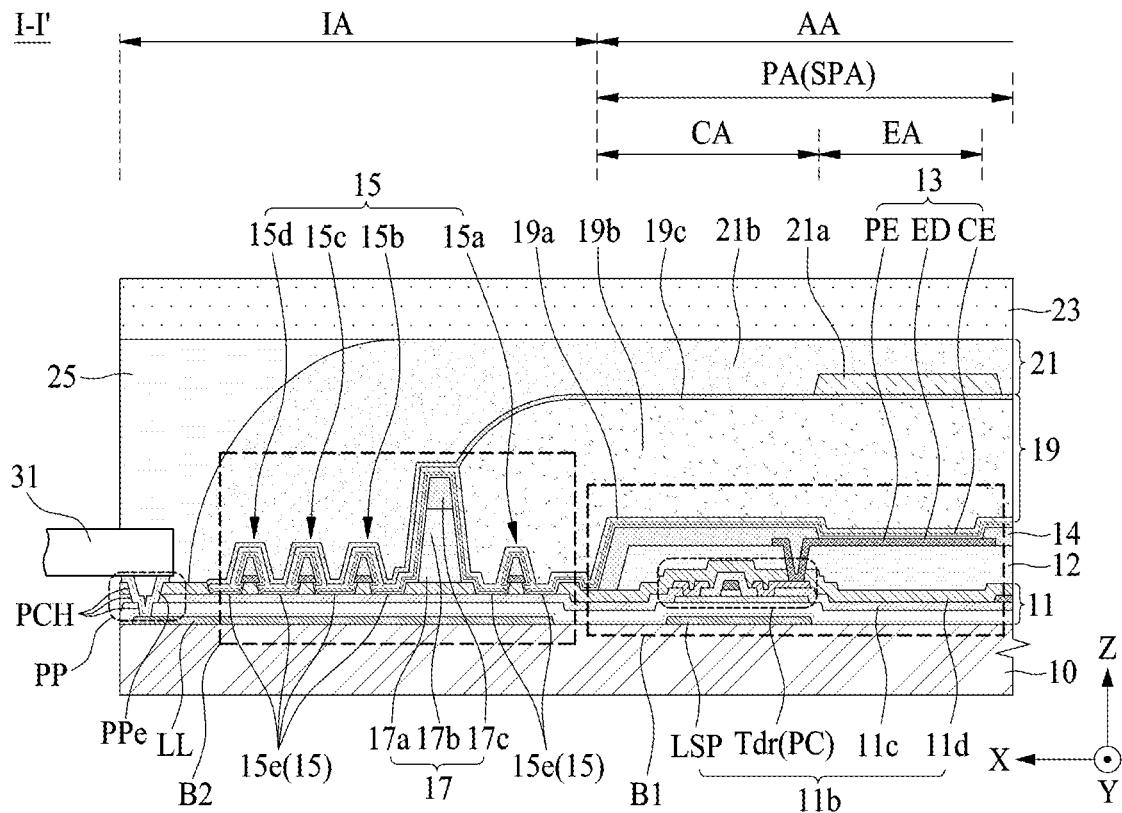
FIG. 3 is a cross-sectional view taken along line I-I' illustrated in FIG. 1.
Figure 4:
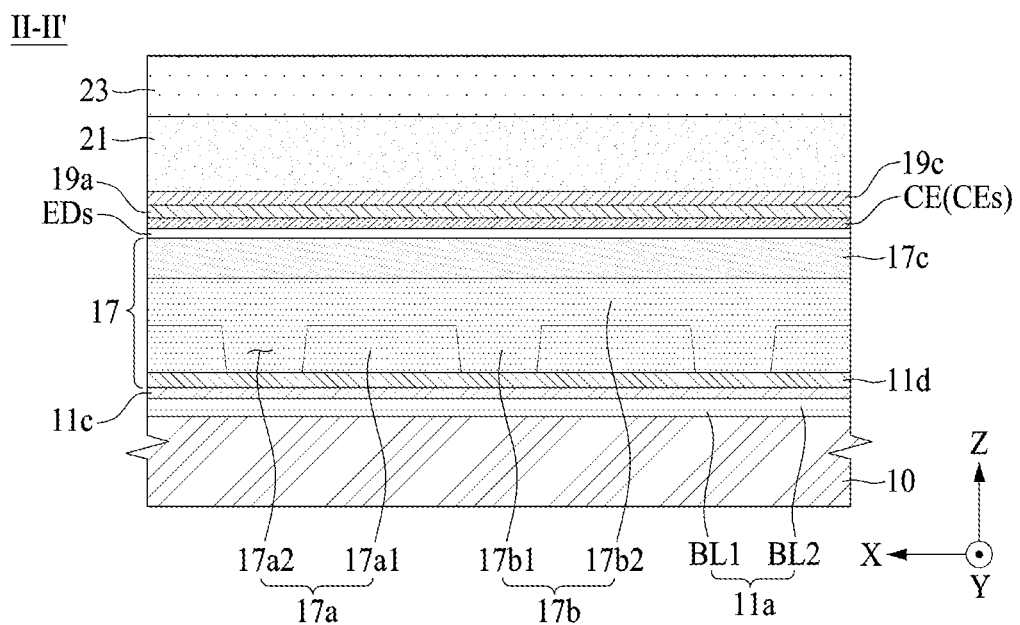
FIG. 4 is a cross-sectional view taken along line II-IP illustrated in FIG. 1.
Figure 5:
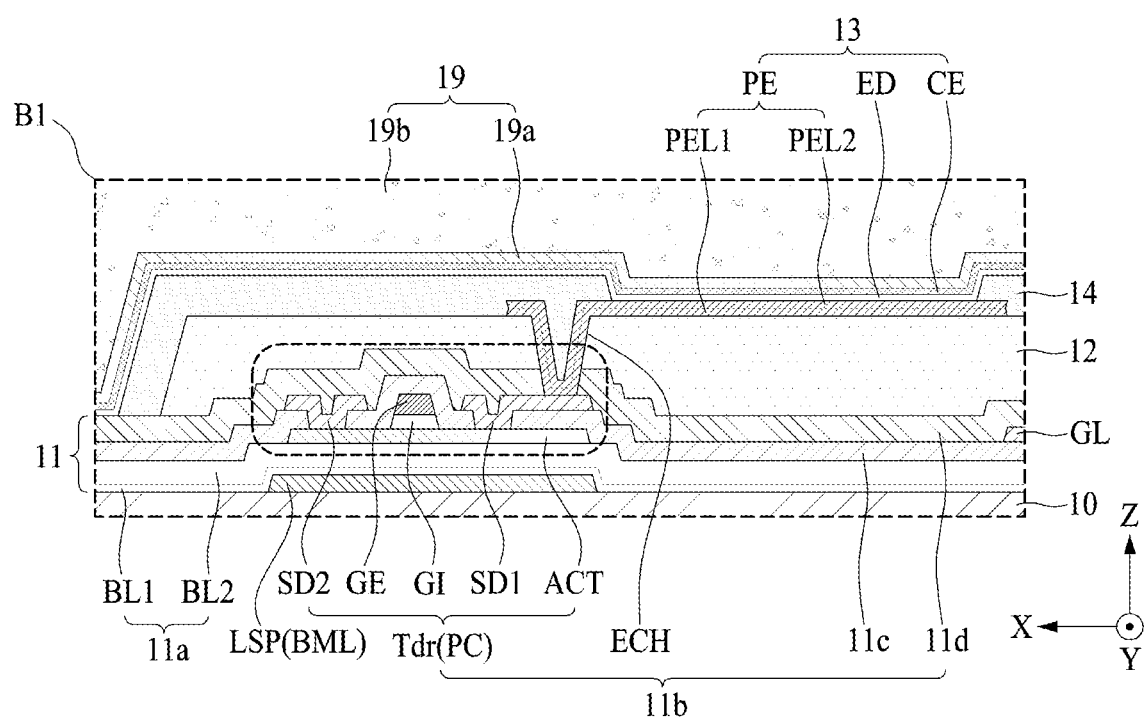
FIG. 5 is an enlarged view of a region 'B1' illustrated in FIG. 3.
Figure 6:
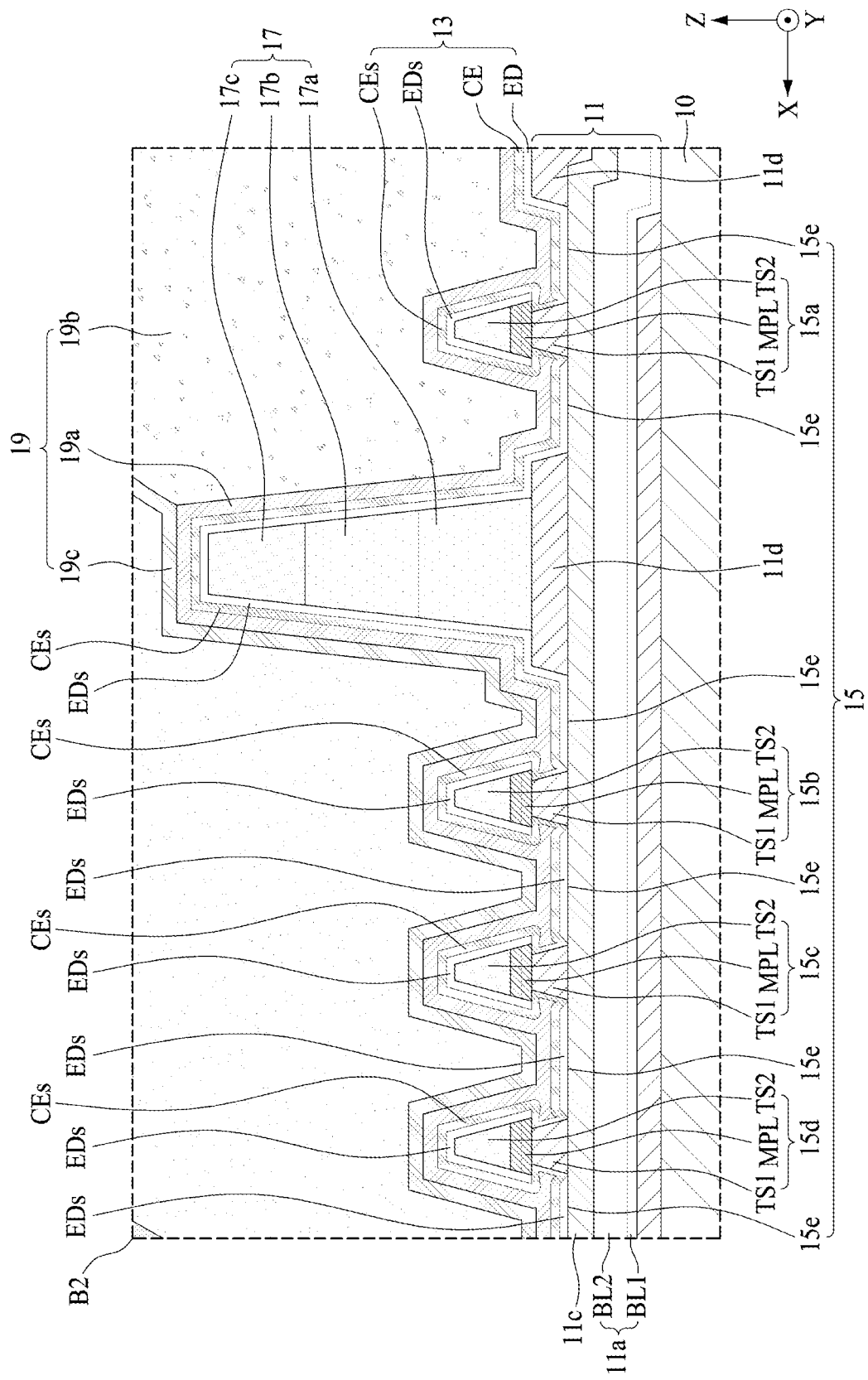
FIG. 6 is an enlarged view of a region 'B2' illustrated in FIG. 3.

FIG. 3 is a cross-sectional view taken along line I-I' illustrated in FIG. 1, FIG. 4 is a cross-sectional view taken along line II-IP illustrated in FIG. 1, FIG. 5 is an enlarged view of a region 'B1' illustrated in FIG. 3, and FIG. 6 is an enlarged view of a region 'B2' illustrated in FIG. 3.

Referring to FIGS. 1 to 6, a light emitting display apparatus according to an embodiment of the present disclosure may include a circuit layer 11, a planarization layer 12, a light emitting device layer 13, a bank 14, a device isolation portion 15, a dam pattern portion 17, and an encapsulation layer 19, over the substrate 10.

The circuit layer 11 may be disposed at the substrate 10. The circuit layer 11 may be referred to as a pixel array layer, a pixel array portion, a TFT array layer, or a TFT array portion.

Referring to FIGS. 1 to 3, and 5, the circuit layer 11 according to an embodiment may include a buffer layer 11a, a circuit array layer 11b, and a plurality of pad parts PP.

The buffer layer 11a may prevent materials, such as hydrogen included in the substrate 10, from being diffused to the circuit array layer 11b in a high temperature process of a process of manufacturing a TFT. Also, the buffer layer 11a may prevent external water or moisture from penetrating into the light emitting device layer 13. The buffer layer 11a according to an embodiment may include silicon oxide (SiOx), silicon nitride (SiNx), silicon oxynitride (SiON), or a multilayer thereof, but embodiments of the present disclosure are not limited thereto. For example, the buffer layer 11a may include a first buffer layer BL1 which includes SiNx and is disposed on the substrate 10 and a second buffer layer BL2 which includes SiOx and is disposed on the first buffer layer BL1.

The circuit array layer 11b may include a pixel circuit PC which includes a driving TFT Tdr disposed in each of a plurality of pixel areas PA over the buffer layer 11a.

The driving TFT Tdr disposed in each pixel area PA may include an active layer ACT, a gate insulation layer GI, a gate electrode GE, an interlayer insulation layer 11c, a first electrode (source/drain) SD1, a second electrode (source/drain) SD2, and a passivation layer 11d.

The active layer ACT may be disposed on the buffer layer 11a in each pixel area PA. The active layer ACT may include a channel area, overlapping the gate electrode GE, and a first electrode (source/drain) area and a second electrode (source/drain) area parallel to each other with the channel area therebetween. The active layer ACT may have conductivity in a conductivity process, and thus, may be used as a bridge line of a jumping structure which directly connects lines in the display area AA or electrically connects lines disposed on different layers.

The gate insulation layer GI may be disposed in the channel area of the active layer ACT. The gate insulation layer GI may insulate the active layer ACT from the gate electrode GE.

The gate electrode GE may be disposed over the gate insulation layer GI. The gate electrode GE may overlap the channel area of the active layer ACT with the gate insulation layer GI therebetween. The gate electrode GE according to an embodiment may have a single-layer structure or a multi-layer structure including at least one of molybdenum (Mo), titanium (Ti), a Mo—Ti alloy (MoTi), and copper (Cu).

The interlayer insulation layer 11c may be disposed at the substrate 10 to cover the gate electrode GE and the active layer ACT. The interlayer insulation layer 11c may electrically insulate (or isolate) the gate electrode GE and the source/drain electrodes SD1 and SD2.

The interlayer insulation layer 11c according to an embodiment may be disposed at only a remaining portion, other than an edge portion, of the substrate 10, but embodiments of the present disclosure are not limited thereto.

The first electrode (source/drain) SD1 may be disposed over the interlayer insulation layer 11c overlapping the first electrode (source/drain) area of the active layer ACT and may be electrically coupled to the first electrode (source/drain) area of the active layer ACT through a first electrode (source/drain) contact hole disposed in the interlayer insulation layer 11c. For example, the first electrode (source/drain) SD1 may be a source electrode of the driving TFT Tdr, and the first electrode (source/drain) area of the active layer ACT may be a source area.

The second electrode (source/drain) SD2 may be disposed on the interlayer insulation layer 11c overlapping the second electrode (source/drain) area of the active layer ACT and may be electrically coupled to the second electrode (source/drain) area of the active layer ACT through a second electrode (source/drain) contact hole disposed in the interlayer insulation layer 11c. For example, the second electrode (source/drain) SD2 may be a drain electrode of the driving TFT Tdr, and the second electrode (source/drain) area of the active layer ACT may be a drain area.

The passivation layer 11d may be disposed over the substrate 10 to cover the pixel circuit PC including the driving TFT Tdr. The passivation layer 11d may support the dam pattern portion 17.

According to an embodiment, when the interlayer insulation layer 11c is not disposed at the edge portion of the substrate 10, the passivation layer 11d disposed at the edge portion of the substrate 10 may directly contact the buffer layer 11a. The passivation layer 11d according to an embodiment may include silicon oxide (SiOx), silicon nitride (SiNx), silicon oxynitride (SiON), or a multilayer thereof, but embodiments of the present disclosure are not limited thereto. For example, the passivation layer 11d may be referred to as a protection layer, a circuit protection layer, an insulation layer, a circuit insulation layer, or the like.

Each of first and second switching TFT Tsw1 and Tsw2 configuring the pixel circuit PC may be formed together with the driving TFT Tdr, and thus, their detailed descriptions are omitted or may be brief.

The circuit layer 11 according to an embodiment may further include a lower metal layer BML which is disposed between the substrate 10 and the buffer layer 11a.

The lower metal layer BML may further include a light blocking pattern LSP which is disposed under the active layer ACT of each of the TFTs Tdr, Tsw1, and Tsw2 configuring the pixel circuit PC.

The light blocking pattern LSP may be disposed in an island shape between the substrate 10 and the active layer ACT. The light blocking pattern LSP may block light which is incident on the active layer ACT through the substrate 10, thereby preventing or minimizing a threshold voltage variation of each TFT caused by external light. Alternatively, the light blocking pattern LSP may be electrically coupled to the first electrode (source/drain) SD1 of a corresponding TFT and thus may act as a lower gate electrode of the corresponding TFT, and in this case, a characteristic variation of each TFT caused by light and a threshold voltage variation of each TFT caused by a bias voltage may be reduced, minimized or prevented.

The lower metal layer BML may be used as a line disposed in parallel with each other among the gate line GL, the data line DL, the pixel driving power line PL, the pixel common voltage line CVL, and the reference voltage line RL. Also, the lower metal layer BML may be used as a plurality of link lines LL electrically coupled to a plurality of pad electrodes PPe disposed in the pad part PP. The lower metal layer BML according to an embodiment may be deposited over the substrate 10, and then, may be patterned as the data line DL, the pixel driving power line PL, the pixel common voltage line CVL, the reference voltage line RL, a light blocking pattern LSP, and the link line LL by a patterning process. The lower metal layer BML according to another embodiment may be deposited over the substrate 10, and then, may be patterned as the gate line GL, a light blocking pattern LSP, and the link line LL by a patterning process.

Each of the plurality of pad parts PP may be disposed at one edge portion of the substrate 10 and may be electrically coupled to the link line LL. Each of the plurality of pad parts PP may include a plurality of pad electrodes PPe.

Each of the plurality of pad electrodes PPe may be electrically coupled to the link line LL through the pad contact hole PCH passing through the passivation layer 11d, the interlayer insulation layer 11c, and the buffer layer 11a, but embodiments of the present disclosure are not limited thereto. As an embodiment, when the link line LL is disposed over the buffer layer 11a, the pad electrodes PPe may be electrically coupled to the link line LL through the pad contact hole PCH passing through the passivation layer 11d and the interlayer insulation layer 11c. As another embodiment, when the link line LL is disposed over the interlayer insulation layer 11c, the pad electrodes PPe may be electrically coupled to the link line LL through the pad contact hole PCH passing through the passivation layer 11d.

The planarization layer 12 may be disposed over the substrate 10 and may provide a flat surface over the circuit layer 11. The planarization layer 12 may cover the circuit layer 11 including the driving TFT Tdr disposed in each of the plurality of pixel areas PA. The planarization layer 12 according to an embodiment may include acrylic resin, epoxy resin, phenolic resin, polyamide-based resin, polyimide-based resin, or the like, but embodiments of the present disclosure are not limited thereto.

The planarization layer 12 according to an embodiment may be formed to cover the remaining circuit layer 11 except for the pad parts PP and the passivation layer 11d of the circuit layer 11 disposed at the edge portion of the substrate 10. Therefore, the passivation layer 11d of the circuit layer 11 disposed at the edge portion of the substrate 10 may be exposed without being covered by the planarization layer 12. For example, the planarization layer 12 may be disposed between the passivation layer 11d and the light emitting device layer 13 or disposed under the light emitting device layer 13.

The light emitting device layer 13 may be disposed over the planarization layer 12. The light emitting device layer 13 according to an embodiment may include a pixel electrode PE, a light emitting device ED, and a common electrode CE.

The pixel electrode PE may be referred to as an anode electrode, a reflective electrode, a lower electrode, or a first electrode of the light emitting device ED.

The pixel electrode PE may be disposed in a first region of the substrate 10. The pixel electrode PE may be disposed over the planarization layer 12 overlapping an emission area EA of each of the plurality of pixel areas PA defined in the first region of the substrate 10. The pixel electrode PE may be patterned and disposed in an island shape in each pixel area PA and may be electrically coupled to the first electrode (source/drain) SD1 of the driving TFT Tdr of a corresponding pixel circuit PC. For example, one side of the pixel electrode PE may extend onto the first electrode (source/drain) SD1 of the driving TFT Tdr and may be electrically coupled to the first electrode (source/drain) SD1 of the driving TFT Tdr through an electrode contact hole ECH provided in the planarization layer 12.

The pixel electrode PE may include a metal material which is low in work function and is good in reflective efficiency.

The pixel electrode PE according to an embodiment of the present disclosure may have a two-layer structure including a first pixel electrode layer (or a first metal layer) PEL1 and a second pixel electrode layer (or a second metal layer) PEL2. The first pixel electrode layer PEL1 and the second pixel electrode layer PEL2 may be sequentially deposited over the planarization layer 12 and then simultaneously patterned, but embodiments of the present disclosure are not limited thereto.

The first pixel electrode layer PEL1 may disposed over the planarization layer 12. The second pixel electrode layer PEL2 may disposed (or stacked) over the first pixel electrode layer PEL1. The pixel electrode PE according to an embodiment may include a stacked structure of indium tin oxide (ITO) (or indium zinc oxide (IZO)) and a Mo—Ti alloy (MoTi). For example, the pixel electrode PE may be formed in a two-layer structure of ITO/MoTi or IZO/MoTi.

The first pixel electrode layer PEL1 according to an embodiment may act as the adhesive layer corresponding to the planarization layer 12 and may act as the secondary electrode of the light emitting device ED. The first pixel electrode layer PEL1 may include indium tin oxide (ITO) or indium zinc oxide (IZO), but embodiments of the present disclosure are not limited thereto.

The second pixel electrode layer PEL2 according to an embodiment may disposed (or stacked) over the first pixel electrode layer PEL1. For example, the second pixel electrode layer PEL2 may act as a reflector and may perform a function of decreasing a resistance of the pixel electrode PE. The second pixel electrode layer PEL2 may include one or more material among aluminum (Al), silver (Ag), molybdenum (Mo), titanium (Ti), and a Mo—Ti alloy (MoTi), but embodiments of the present disclosure are not limited thereto.

The pixel electrode PE according to another embodiment of the present disclosure may have a three-layer structure including a first pixel electrode layer PEL1, a second pixel electrode layer PEL2 over the first pixel electrode layer PEL1, and a third pixel electrode layer (or a third metal layer) over the second pixel electrode layer PEL2. The first pixel electrode layer PEL1, the second pixel electrode layer PEL2, and the third pixel electrode layer may be sequentially deposited over the planarization layer 12 and then simultaneously patterned, but embodiments of the present disclosure are not limited thereto.

The third pixel electrode layer may act as an electrode of the light emitting device ED and may include ITO or IZO. For example, the pixel electrode PE may be formed in a three-layer structure of IZO/MoTi/ITO or ITO/MoTi/ITO.

The pixel electrode PE according to another embodiment may have a four-layer structure including a first pixel electrode layer PEL1, a second pixel electrode layer PEL2 over the first pixel electrode layer PEL1, a third pixel electrode layer (or a third metal layer) over the second pixel electrode layer PEL2, and a fourth pixel electrode layer (or a fourth metal layer) over the third pixel electrode layer. The first to fourth pixel electrode layers may be sequentially deposited over the planarization layer 12 and then simultaneously patterned, but embodiments of the present disclosure are not limited thereto.

In the pixel electrode PE of the four-layer structure, the first pixel electrode layer may act as the adhesive layer corresponding to the planarization layer 12 and may act as the secondary electrode of the light emitting device ED, and moreover, may include one or more material of ITO, Mo, and Mo—Ti. The second pixel electrode layer may act a function of decreasing a resistance of the pixel electrode PE and may include Cu. The third pixel electrode layer may act as a reflector and may include one or more material of Al, Ag, Mo, Ti, and MoTi. The fourth pixel electrode layer may act as an electrode of the light emitting device ED and may include ITO or IZO. For example, the pixel electrode PE according to another embodiment may be formed in a four-layer structure of ITO/Cu/MoTi/ITO.

The pixel electrode PE may be used as a metal layer which implements the plurality of pad electrodes disposed in each of the plurality of pad parts PP. For example, the plurality of pad electrodes may be formed of the same material together with the pixel electrode PE.

The light emitting device ED may be disposed over the first region of the substrate 10 and disposed in at least portion of the second region of the substrate 10. The light emitting device ED may be formed over the pixel electrode PE and may directly contact the pixel electrode PE. The pixel electrode PE may be disposed under (or below) the light emitting device ED. For example, the pixel electrode PE may be disposed between the planarization layer 12 and the light emitting device ED.

The light emitting device ED according to an embodiment may be a common layer which is formed in common in each of a plurality of subpixels SP so as not to be distinguished by subpixel SP units. The light emitting device ED may react on a current flowing between the pixel electrode PE and the common electrode CE to emit white light (or blue light). The light emitting device ED according to an embodiment may include an organic light emitting layer, or may include a stacked or a combination structure of an organic light emitting layer and a quantum dot light emitting layer.

An organic light emitting device according to an embodiment may include two or more organic light emitting portions for emitting white light. For example, the organic light emitting device may include a first organic light emitting portion and a second organic light emitting portion for emitting white light based on a combination of first light and second light. For example, the first organic light emitting portion may include at least one or more among a blue light emitting layer, a green light emitting layer, a red light emitting layer, a yellow light emitting layer, and a yellow-green light emitting layer. The second organic light emitting portion may include at least one or more among a blue light emitting layer, a green light emitting layer, a red light emitting layer, a yellow light emitting layer, and a yellow-green light emitting layer for emitting second light which is combined with first light from the first organic light emitting portion to generate white light.

The organic light emitting layer according to an embodiment of the present disclosure may further include at least one or more function layers for enhancing emission efficiency and/or lifetime. For example, the function layer may be disposed above and/or below the light emitting layer, respectively.

The common electrode CE may be referred to as a cathode electrode, a transparent electrode, an upper electrode, or a second electrode. The common electrode CE may be formed over the light emitting device ED and may directly contact the light emitting device ED or may electrically and directly contact the light emitting device ED. The common electrode CE may include a transparent conductive material which transmits light emitted from the light emitting device ED.

The common electrode CE according to an embodiment of the present disclosure may be formed in a single-layer structure or a multi-layer structure, which includes at least one material of graphene and a transparent conductive material which is relatively high in work function. For example, the common electrode CE may include metal oxide such as ITO or IZO, or may include a combination of oxide and metal such as ZnO:Al or SnO2:Sb.

Additionally, the light emitting device layer 13 may further include a capping layer disposed over the common electrode CE. The capping layer may improve the emission efficiency of light by adjusting a refractive index of light emitted from the light emitting device layer 13.

The bank 14 may be disposed over the planarization layer 12 to define the pixel areas PA over the substrate 10. The bank 14 may be disposed over the planarization layer 12 to cover an edge portion of the pixel electrode PE. The bank 14 may define the emission area EA (or an opening portion) of each of the plurality of subpixels SP and may electrically isolate the pixel electrodes PE disposed in adjacent subpixels SP. The bank 14 may be formed to cover the electrode contact hole ECH disposed in each of the plurality of pixel areas PA. The bank 14 may be covered by the light emitting layer of the light emitting device layer 13. For example, the light emitting layer may be disposed over the bank 14 as well as over the pixel electrode PE of each of the plurality of subpixels SP. The meaning of "define" should be understood to include bordering. For example, the bank 14 may border the pixels areas PA, the emission area EA, or both.

The bank 14 according to an embodiment may be formed of a transparent material, for example, acrylic-based resin, epoxy-based resin, phenolic-based resin, polyamide-based resin, polyimide-based resin, or the like. For example, the bank 14 according to an embodiment may be a transparent bank.

The bank 14 according to another embodiment may be an opaque material including a light absorbing material or a black pigment such as carbon black, for example, polyamide-based resin, acrylic-based resin, benzocyclobutene (BCB), or the like. For example, the bank 14 according to another embodiment may be a black bank.

Referring again to FIGS. 3 and 6, the device isolation portion 15 may be disposed in a second region, surrounding a first region, of a substrate 10. For example, the second region of the substrate 10 may be an edge portion of the substrate 10 or an edge portion of an outermost pixel. The first region of the substrate 10 may be the other portion except the second region.

The device isolation portion 15 may be implemented to isolate the light emitting device ED disposed in the second region. The device isolation portion 15 may be implemented to prevent the penetration of water or moisture in a lateral direction of the substrate 10 to prevent the light emitting device ED from being degraded by the lateral penetration of water or moisture. The device isolation portion 15 may isolate (or separate) the light emitting device ED of the light emitting device layer 13 at least once, at a position near the dam pattern portion 17, and thus, may prevent the lateral penetration of water or moisture. For example, the device isolation portion 15 may be defined as an isolation region, an isolation line, a disconnection region, or a disconnection line, of the light emitting device ED.

The device isolation portion 15 may be implemented near the dam pattern portion 15 to include an isolation structure (or a separation structure or a cutting structure) for isolating (or separating) the light emitting device ED disposed near the dam pattern portion 17 or for isolating (or separating) all of the light emitting device ED and the common electrode CE. The isolation structure according to an embodiment of the present disclosure may include at least one of an eaves structure (or a cliff structure), a tip structure (or a protrusion tip structure), and an undercut structure. Accordingly, the light emitting device ED and the common electrode CE disposed near the dam pattern portion 17 may be isolated (or separated) during a deposition process by the eaves structure of the device isolation portion 15, without a separate process.

The device isolation portion 15 may be implemented on an interlayer insulation layer 11c on the substrate 10 to surround the display area AA. For example, the device isolation portion 15 may be implemented in a closed loop line shape on the interlayer insulation layer 11c to surround the display area AA one-dimensionally.

The device isolation portion 15 according to an embodiment of the present disclosure may include at least two or more device isolation patterns 15a to 15d. For example, the device isolation portion 15 may include first to fourth device isolation patterns 15a to 15d.

The first device isolation pattern 15a may be implemented in a closed loop line shape on the interlayer insulation layer 11c closest to the display area AA. The second device isolation pattern 15b may be implemented in a closed loop line shape on the interlayer insulation layer 11c to surround the first device isolation pattern 15a. The third device isolation pattern 15c may be implemented in a closed loop line shape on the interlayer insulation layer 11c to surround the second device isolation pattern 15b. The fourth device isolation pattern 15d may be implemented in a closed loop line shape on the interlayer insulation layer 11c to surround the third device isolation pattern 15c. Each of the first to fourth device isolation patterns 15a to 15d may include an eaves structure for isolating (or separating) the light emitting device ED.

Each of the first to fourth device isolation patterns 15a to 15d according to an embodiment of the present disclosure may include a first trench structure TS1, a metal pattern layer MPL, and a second trench structure TS2.

The first trench structure TS1 may be implemented as a passivation layer 11d. The first trench structure TS1 may be formed by a patterning process performed on the passivation layer 11d disposed in the non-display area IA. For example, the first trench structure TS1 may be formed by the patterning process performed on the passivation layer 11d by an etching process. For example, the first trench structure TS1 may be referred to as a first isolation structure or a first tapered structure.

A lateral surface of the first trench structure TS1 according to an embodiment of the present disclosure may be implemented in an inclined structure or a tapered structure. A bottom surface of the first trench structure TS1 may directly contact a top surface (or a surface) of the interlayer insulation layer 11c, and a top surface of the first trench structure TS1 may be disposed on the bottom surface of the first trench structure TS1 and may have a width which is narrower than the bottom surface. A lateral surface of the first trench structure TS1 may be formed to be inclined between the top surface and the bottom surface. In the first trench structure TS1, an included angle between the bottom surface and the lateral surface may be an acute angle, and an included angle between the top surface and the lateral surface may be an obtuse angle. For example, a cross-sectional surface of the first trench structure TS1 cut along a width direction may have a cross-sectional structure having a trapezoid shape where a top surface thereof is narrower than a bottom surface thereof.

The metal pattern layer MPL may be disposed on the first trench structure TS1. The metal pattern layer MPL may have the same at least two-layer structure as the pixel electrode PE. For example, the metal pattern layer MPL may include a first metal layer, which is formed together with a first pixel electrode layer PEL1 of the pixel electrode PE and directly contacts the top surface of the first trench structure TS1, and a second metal layer which is formed together with a second pixel electrode layer PEL2 of the pixel electrode PE and is formed (or stacked) on the first metal layer.

The metal pattern layer MPL may have a width which is wider than the top surface of the first trench structure TS1. The metal pattern layer MPL may have a width which is wider than or equal to the bottom surface of the first trench structure TS1. For example, a lateral surface of the metal pattern layer MPL may be implemented in an inclined structure or a tapered structure. For example, the metal pattern layer MPL cut along a width direction thereof may have the same trapezoid shape as the first trench structure TS1 cut along a width direction thereof. With respect to a width direction (or a cross-sectional direction), each of one edge portion and the other edge portion of the metal pattern layer MPL may protrude to the outside of the lateral surface of the first trench structure TS1.

The lateral surface of the first trench structure TS1 may have an undercut structure with respect to the metal pattern layer MPL. For example, a boundary portion between the first trench structure TS1 and the metal pattern layer MPL or an upper lateral surface of the first trench structure TS1 may be undercut with respect to the metal pattern layer MPL. The metal pattern layer MPL may protrude to the outside of the lateral surface of the first trench structure TS1 based on the undercut structure and may cover the lateral surface of the first trench structure TS1. Accordingly, the metal pattern layer MPL may have an eaves structure with respect to the first trench structure TS1.

The second trench structure TS2 may be disposed on the metal pattern layer MPL. For example, the second trench structure TS2 may be referred to as the term such as a second isolation structure or a second tapered structure.

The second trench structure TS2 may include an organic material. The second trench structure TS2 according to an embodiment of the present disclosure may include the same material as the bank 14, but embodiments of the present disclosure are not limited thereto. For example, the second trench structure TS2 may include a bank material which is not patterned (or removed) in a patterning process performed on the bank material and remains on the metal pattern layer MPL. The second trench structure TS2 may be implemented to have the same height (or thickness) as the bank 14.

A bottom surface of the second trench structure TS2 may have the same width as the top surface of the metal pattern layer MPL. In the second trench structure TS2, a top surface may have a width which is narrower than or equal to the bottom surface. For example, a lateral surface of the second trench structure TS2 may be implemented in an inclined structure or a tapered structure. For example, an included angle between the bottom surface and the lateral surface of the second trench structure TS2 may be the same as an included angle between the bottom surface and the lateral surface of the metal pattern layer MPL, but embodiments of the present disclosure are not limited thereto.

The device isolation portion 15 according to an embodiment of the present disclosure may further include a plurality of groove patterns 15e.

Each of the plurality of groove patterns 15e may be disposed at both sides of each of the first to fourth device isolation patterns 15a to 15d. For example, each of the plurality of groove patterns 15e may be disposed between the first to fourth device isolation patterns 15a to 15d.

Each of the plurality of groove patterns 15e may be a portion which is obtained by removing the passivation layer 11d through a patterning process performed on the passivation layer 11d for forming an undercut structure between the metal pattern layer MPL and the first trench structure TS1 of each of the first to fourth device isolation patterns 15a to 15d. The first trench structure TS1 may be implemented as the passivation layer 11d. Each of the plurality of groove patterns 15e may expose the interlayer insulation layer 11c disposed near each of the first to fourth device isolation patterns 15a to 15d.

The device isolation portion 15 including the first to fourth device isolation patterns 15a to 15d may isolate (or separate) the light emitting device ED, or may isolate (or separate) the light emitting device ED and the common electrode CE. For example, the light emitting device ED of the light emitting device layer 13 formed (or deposited) on the device isolation portion 15 may be automatically isolated (or separated) during a deposition process by the undercut structure (or the eaves structure) of each of the first to fourth device isolation patterns 15a to 15d, without a separate disconnection process. Accordingly, the light emitting device ED may include an isolation region isolated by the device isolation portion 15.

According to an embodiment of the present disclosure, a deposition material of the light emitting device ED including an organic light emitting device may have linearity, and thus, may not be deposited on the lateral surface of the first trench structure TS1 covered by the metal pattern layer MPL based on the undercut structure (or the eaves structure) of each of the first to fourth device isolation patterns 15a to 15d. Accordingly, the light emitting device ED formed (or deposited) on the first to fourth device isolation patterns 15a to 15d may be isolated (or separated) between the first trench structure TS1 and the metal pattern layer MPL. Therefore, the light emitting device ED disposed near the dam pattern portion 17 may be automatically isolated (or separated) by the first to fourth device isolation patterns 15a to 15d of the device isolation portion 15, and thus, a separate patterning process for isolating (or separating) the light emitting device ED may be omitted.

The deposition material of the light emitting device ED disposed in the non-display area IA may be isolated (or separated) by the first to fourth device isolation patterns 15a to 15d of the device isolation portion 15, and a deposition material EDs of the isolated (or separated) light emitting device ED may be disposed in an island shape in each of the plurality of groove patterns 15e and may be disposed in an island shape to cover the lateral surface of the metal pattern layer MPL and the top surface and the lateral surface of the first trench structure TS1 in each of the first to fourth device isolation patterns 15a to 15d. Accordingly, the light emitting device EDs disposed in the non-display area IA may be isolated from the light emitting device ED disposed in the display area AA, and thus, a lateral water transmission path of the substrate 10 may be blocked by the first to fourth device isolation patterns 15a to 15d of the device isolation portion 15.

Alternatively, during a deposition process based on deposition method, the common electrode CE disposed on the light emitting device ED may be automatically isolated (or separated) by the first to fourth device isolation patterns 15a to 15d of the device isolation portion 15, or may be formed to surround the light emitting device ED isolated by the first to fourth device isolation patterns 15a to 15d of the device isolation portion 15.

According to an embodiment of the present disclosure, when the common electrode CE is deposited by a sputtering process, the common electrode CE may be formed to surround the light emitting device ED isolated by the first to fourth device isolation patterns 15a to 15d of the device isolation portion 15. For example, the common electrode CE disposed on the device isolation portion 15 may be deposited on the lateral surface of the first trench structure TS1 covered by the undercut structure (or the eaves structure) of each of the first to fourth device isolation patterns 15a to 15d, and thus, may surround the lateral surface of the first trench structure TS1 of each of the first to fourth device isolation patterns 15a to 15d which surround the isolated light emitting device EDs disposed in the non-display area IA and are exposed by the isolated light emitting device EDs. Accordingly, the common electrode CE may be implemented to cover all of the device isolation portion 15.

According to another embodiment of the present disclosure, when the common electrode CE is deposited by a chemical vapor deposition (CVD) process instead of the sputtering process, the common electrode CE may be automatically isolated (or separated) by the first to fourth device isolation patterns 15a to 15d of the device isolation portion 15. For example, the common electrode CE disposed on the device isolation portion 15 may be isolated at the lateral surface of the first trench structure TS1 covered by the undercut structure (or the eaves structure) of each of the first to fourth device isolation patterns 15a to 15d. For example, the common electrode CE disposed on the first to fourth device isolation patterns 15a to 15d may be electrically disconnected from the common electrode CE disposed on the plurality of groove patterns 15e.

Referring again to FIGS. 1, 3, 4, and 6, the dam pattern portion 17 may be disposed on the circuit layer 11 in the edge portion of the substrate 10. For example, the dam pattern portion 17 may be disposed on the passivation layer 11d of the circuit layer 11 to have a closed loop line shape which surrounds the display area AA. The dam pattern portion 17 may block the spread or overflow of the encapsulation layer 19 which is disposed on the substrate 10 to cover the display area AA.

The dam pattern portion 17 may be disposed between two adjacent device isolation patterns among the at least two or more device isolation patterns 15a to 15d. For example, the dam pattern portion 17 may be implemented to in a closed loop line shape to surround the first device isolation pattern 15a and may be implemented to be surrounded by the second to fourth device isolation patterns 15b to 15d. For example, the dam pattern portion 17 may be disposed between the first device isolation pattern 15a and the second device isolation pattern 15b of the device isolation portion 15.

The dam pattern portion 17 may include a structure (or a structure material) for preventing a metal pattern layer for the eaves structure from being lost (or removed) in forming (or manufacturing) the device isolation portion 15.

The dam pattern portion 17 according to an embodiment of the present disclosure may include a first dam pattern 17a and a second dam pattern 17b.

The first dam pattern 17a may be disposed on the passivation layer 11d disposed between the first device isolation pattern 15a and the second device isolation pattern 15b of the device isolation portion 15. For example, the first dam pattern 17a may be formed before a process of forming (or manufacturing) the device isolation portion 15. For example, the first dam pattern 17a may be formed between a process of forming the planarization layer 12 and a process of forming the pixel electrode PE.

The first dam pattern 17a may include an organic material. The first dam pattern 17a according to an embodiment of the present disclosure may be formed of the same material together with the planarization layer 12, but embodiments of the present disclosure are not limited thereto. For example, the first dam pattern 17a may be formed of the same material with the bank 14. For example, the first dam pattern 17a may have the same height (or thickness) as the planarization layer 12.

In forming (or manufacturing) the device isolation portion 15, the first dam pattern 17a may include a structure (or a structure element) for preventing the metal pattern layer for the eaves structure from being lost (or removed). For example, the first dam pattern 17a may be referred to as the term such as a lower dam pattern, a discontinuous dam pattern, a discontinuity dam pattern, a dotted-line dam pattern, or the like.

The first dam pattern 17a may include a plurality of line dam patterns 17a1 and a plurality of pattern disconnection portions 17a2.

The plurality of line dam patterns 17a1 may be spaced apart from one another to have a shape which surrounds a plurality of outermost pixels disposed in the display area AA. The plurality of line dam patterns 17a1 may be disposed spaced apart from one another along the edge portion of the substrate 10. For example, the plurality of line dam patterns 17a1 may be disposed on the passivation layer 11d to have a predetermined or selected length and a predetermined or selected gap space (or interval). Describing the same structure in a different manner, a plurality of segments 17a1 of a dam are provided in a line, each of the segments 17a1 being spaced apart from another segment 17a1. A space 17a2 is provided between the segments, the combination of 17a1 and 17a2 comprising the discontinuous dam pattern 17a.

The plurality of pattern disconnection portions 17a2 (or groove portions) may be disposed between the plurality of line dam patterns 17a1. The plurality of pattern disconnection portions 17a2 may have a length which is smaller than or equal to the line dam pattern 17a1. For example, a length of the pattern disconnection portion 17a2 or a length of a gap space between two adjacent line dam patterns 17a1 may be smaller than or equal to a length of the line dam pattern 17a1.

In forming (or manufacturing) the device isolation portion 15 after a process of manufacturing the first dam pattern 17a, the plurality of pattern disconnection portions 17a2 may provide a path through which a patterning material (or an etchant) for patterning (or etching) the passivation layer 11d may move between an inner portion and an outer portion of the first dam pattern 17a, and thus, may prevent, reduce or minimize over-etching of the passivation layer 11d under the metal pattern layer MPL caused by the patterning material (or an etchant). Accordingly, in forming (or manufacturing) the device isolation portion 15, the pattern disconnection portions 17a2 of the first dam pattern 17a may prevent, reduce or minimize the loss (or removal) of the metal pattern layer MPL for the eaves structure.

The second dam pattern 17b may be disposed on the first dam pattern 17a to have a closed loop line shape. The second dam pattern 17b may have a cross-sectional structure which differs from the first dam pattern 17a. The second dam pattern 17b may be filled between the line dam patterns 17a1 of the first dam pattern 17a and may be disposed on the line dam patterns 17a1. For example, the second dam pattern 17b may be filled into each of the plurality of pattern disconnection portions 17a2 disposed between the line dam patterns 17a1. The second dam pattern 17b may prevent the spread or overflow of the encapsulation layer 19. For example, the second dam pattern 17b may be referred to as the term such as an upper dam pattern (or a middle dam pattern), a continuous dam pattern, a continuity dam pattern, or the like. For example, the second dam pattern 17b may be manufactured after a process of forming (or manufacturing) the device isolation portion 15. For example, the device isolation portion 15 may be formed between a process of manufacturing the first dam pattern 17a and a process of manufacturing the second dam pattern 17b. The meaning of "filled" should be understood to include completely filled, exclusively filled or partially filled. For example, the second dam pattern 17b may completely fill or exclusively fill the pattern disconnection portions 17a2, meaning that there is nothing else used to fill the pattern disconnection portions 17a2 except the material stated. In such an example, the second dam pattern 17b is in direct physical contact with the line dam patterns 17a1. In another configuration, the second dam pattern 17b may partially fill the pattern disconnection portions 17a2, for example, when another material layer is interposed between the second dam pattern 17b and the line dam patterns 17a1 in the pattern disconnection portions 17a2. In terms of the pattern disconnection portions 17a2, the pattern disconnection portions 17a2 being "filled with" may include many configurations. For example, the pattern disconnection portions 17a2 may have the second dam pattern 17b therein, and may also have materials, layers, or other layers than the second dam pattern 17b therein that result in the hole (e.g., the pattern disconnection portions 17a2) being full. It can also include the stated material being the last material provided to complete the filling of the hole. On the other hand, the terms "completely filled with" or "exclusively filled with" carry meaning that there is nothing else used to the fill the hole except the material stated.

The second dam pattern 17b may include the same material as the first dam pattern 17a or the same material as the planarization layer 12, but embodiments of the present disclosure are not limited thereto. For example, the second dam pattern 17b may have a height (or a thickness) which is higher than or equal to the planarization layer 12, or may have a height (or a thickness) which is higher than or equal to the first dam pattern 17a. For example, a total height between the first dam pattern 17a and the second dam pattern 17b may be two or more times a height (or a thickness) of the planarization layer 12, but embodiments of the present disclosure are not limited thereto and may be changed based on a thickness of the encapsulation layer 19.

The dam pattern portion 17 including the first dam pattern 17a and the second dam pattern 17b may be surrounded by the light emitting device EDs isolated by the device isolation portion 15. Also, the light emitting device EDs surrounding the dam pattern portion 17 may be surrounded by the common electrode CEs isolated by the device isolation portion 15.

The second dam pattern 17b according to an embodiment of the present disclosure may include a plurality of protrusion patterns 17b1 and a closed loop line pattern 17b2.

The plurality of protrusion patterns 17b1 may be filled between the line dam patterns 17a1 of the first dam pattern 17a. For example, the plurality of protrusion patterns 17b1 may be filled into each of the plurality of pattern disconnection portions 17a2 of the first dam pattern 17a. The first dam pattern 17a may have a closed loop line shape by the protrusion patterns 17b1 of the second dam pattern 17b.

The closed loop line pattern 17b2 may be disposed on the plurality of protrusion patterns 17b1 and the line dam patterns 17a1 of the first dam pattern 17a to have a closed loop line shape. For example, each of the plurality of protrusion patterns 17b1 may protrude from the closed loop line pattern 17b2 toward the plurality of pattern disconnection portions 17a2 of the first dam pattern 17a.

The dam pattern portion 17 according to an embodiment of the present disclosure may further include a third dam pattern 17c.

The third dam pattern 17c may be disposed on the second dam pattern 17b to have a closed loop line shape. The third dam pattern 17c may have a cross-sectional structure similar to the second dam pattern 17b. The third dam pattern 17c may prevent the spread or overflow of the encapsulation layer 19 together with the second dam pattern 17b. For example, the third dam pattern 17c may be referred to as the term such as an uppermost dam pattern (or an upper dam pattern), an auxiliary dam pattern, an additional dam pattern, or the like.

The third dam pattern 17c may include the same material as the bank 14, but embodiments of the present disclosure are not limited thereto. For example, the third dam pattern 17c may be formed together with the bank 14. For example, the third dam pattern 17c may have a height (or a thickness) which is higher than or equal to the bank 14. For example, the third dam pattern 17c may have a height (or a thickness) which is equal to or different from the first dam pattern 17a or/and the second dam pattern 17b.

The dam pattern portion 17 including the first to third dam patterns 17a to 17c may be surrounded by the light emitting device EDs isolated by the device isolation portion 15. Moreover, the light emitting device EDs surrounding the dam pattern portion 17 may be surrounded by the common electrode CEs isolated by the device isolation portion 15.

The encapsulation layer 19 may be disposed on a remaining portion, other than an outermost edge portion including the pad parts PP, of the substrate 10 and may be implemented to cover the light emitting device layer 13. For example, the encapsulation layer 19 may be implemented to surround all of the front surface and lateral surfaces of the light emitting device layer 13. Also, in a case where the light emitting device ED and the common electrode CE are isolated by the device isolation portion 15, the encapsulation layer 19 may surround an isolation surface (or a separation surface) of the light emitting device ED and the common electrode CE isolated by the device isolation portion 15. For example, the encapsulation layer 19 may be filled (or buried) into an isolation space of the light emitting device ED and the common electrode CE formed by an isolation structure (or an undercut structure) of the device isolation portion 15 to seal or fully surround the device isolation portion 15, and thus, may fully surround or cover each of the isolated light emitting device ED and common electrode CE, thereby fundamentally (or completely) preventing the lateral penetration of water or moisture.

The encapsulation layer 19 according to an embodiment of the present disclosure may include first to third encapsulation layers 19a to 19c.

The first encapsulation layer 19a may be implemented to prevent oxygen or water from penetrating into the light emitting device layer 13. The first encapsulation layer 19a may be disposed on the common electrode CE and may surround the light emitting device layer 13. Therefore, all of a front surface and lateral surfaces of the light emitting device layer 13 may be surrounded by the first encapsulation layer 19a. The first encapsulation layer 19a may directly contact a top surface of the passivation layer 11d at an outer periphery of the dam pattern portion 17 and may cover a boundary portion (or an interface) between the common electrode CE and the passivation layer 11d, thereby preventing or minimizing the lateral penetration of water or moisture. For example, the first encapsulation layer 19a may directly contact the top surface of the passivation layer 11d, between the pad part PP and the device isolation portion 15. The first encapsulation layer 19a according to an embodiment of the present disclosure may include an inorganic material.

In a case where the light emitting device ED and the common electrode CE are isolated by the device isolation portion 15, the first encapsulation layer 19a may surround an isolation surface (or a separation surface) of the light emitting device ED and the common electrode CE isolated by the device isolation portion 15. For example, the first encapsulation layer 19a may be filled (or buried) into an isolation space of the light emitting device ED and the common electrode CE formed by an isolation structure (or an undercut structure) of the device isolation portion 15 to seal or fully surround the device isolation portion 15, and thus, may fully surround or cover each of the isolated light emitting device ED and common electrode CE, thereby fundamentally (or completely) preventing the lateral penetration of water or moisture.

The second encapsulation layer 19b may be implemented on the first encapsulation layer 19a to have a thickness which is relatively thicker than the first encapsulation layer 19a. The second encapsulation layer 19b may have a thickness for fully cover particles (or an undesired material or an undesired structure element) which is or may be on the first encapsulation layer 19a. The second encapsulation layer 19b may spread to the edge portion of the substrate 10 due to a relatively thick thickness, but the spread of the second encapsulation layer 19b may be blocked by the dam pattern portion 17. For example, an end of the second encapsulation layer 19b may directly contact the first encapsulation layer 19a on the dam pattern portion 17. The second encapsulation layer 19b may be disposed on only the first encapsulation layer 19a in an inner region (or an internal region) surrounded by the dam pattern portion 17. For example, the second encapsulation layer 19b may be disposed to cover all of the display area AA and the non-display area IA between the display area AA and the dam pattern portion 17. The second encapsulation layer 19b may be referred to as a particle cover layer. The second encapsulation layer 19b according to an embodiment of the present disclosure may include an organic material or a liquid organic material. For example, the second encapsulation layer 19b may include an organic material such as silicon oxycarbon (SiOCz), acrylic-based resin, epoxy-based resin, or the like.

The third encapsulation layer 19c may be implemented to primarily prevent oxygen or water from penetrating into the light emitting device layer 13. The third encapsulation layer 19c may be implemented to surround all of the second encapsulation layer 19b disposed inside the dam pattern portion 17 and the first encapsulation layer 19a disposed outside from the dam pattern portion 17. For example, the third encapsulation layer 19c may directly contact the top surface of the passivation layer 11d at an outer periphery, uncovered by the first encapsulation layer 19a, of the dam pattern portion 17 and may cover a boundary portion (or an interface) between the first encapsulation layer 19a and the passivation layer 11d, thereby additionally preventing or minimizing the lateral penetration of water or moisture. For example, the third encapsulation layer 19c may directly contact the top surface of the passivation layer 11d, between the pad part PP and the device isolation portion 15. The third encapsulation layer 19c according to an embodiment of the present disclosure may include an inorganic material which is the same as or different from the first encapsulation layer 19a.

Referring again to FIGS. 1 and 3, the light emitting display apparatus according to an embodiment of the present disclosure may further include a wavelength conversion layer 21 disposed over the substrate 10.

The wavelength conversion layer 21 may convert a wavelength of light which is incident thereon from an emission area of each pixel area PA. For example, the wavelength conversion layer 21 may convert white light (or blue light), which is incident thereon from the emission area, into color light corresponding to the subpixel SP or may transmit only color light corresponding to the subpixel SP. For example, the wavelength conversion layer 21 may include at least one among a wavelength conversion member and a color filter layer.

The wavelength conversion layer 21 according to an embodiment may include a plurality of wavelength conversion members 21a and a protection layer 21b.

The plurality of wavelength conversion members 21a may be disposed over the encapsulation layer 19 disposed in the emission area EA of each of the plurality of pixel areas PA. For example, each of the plurality of wavelength conversion members 21a may be implemented to have the same size as or wider than the emission area EA of each subpixel area SPA.

The plurality of wavelength conversion members 21a according to an embodiment may be divided (or classified) into a red light filter which converts white light into red light, a green light filter which converts white light into green light, and a blue light filter which converts white light into blue light. For example, the red light filter (or a first light filter) may be disposed over the encapsulation layer 19 in the emission area EA of the red subpixel SP, the green light filter (or a second light filter) may be disposed over the encapsulation layer 19 in the emission area EA of the green subpixel SP, and the blue light filter (or a third light filter) may be disposed over the encapsulation layer 19 in the emission area EA of the blue subpixel SP.

The plurality of wavelength conversion members 21a according to another embodiment may be disposed over the encapsulation layer 19 of each subpixel area SPA. For example, each of the plurality of wavelength conversion members 21a may be disposed over the encapsulation layer 19 to overlap the entire corresponding subpixel area SPA.

The plurality of wavelength conversion members 21a according to another embodiment may be implemented to overlap each other at the encapsulation layer 19 overlapped with the circuit area CA (or the non-emission area) except for the emission area EA of each subpixel areas SPA. For example, two or more wavelength conversion members 21a having different colors are disposed at the encapsulation layer 19 overlapping the circuit area CA (or non-emission area) except for the emission area EA of each subpixel areas SPA. The two or more wavelength conversion members 21a disposed at the encapsulation layer 19 overlapping the circuit area CA (or non-emission area) may act as a function of a light blocking pattern which prevents color mixture between adjacent subpixels SP or between adjacent pixels P.

The protection layer 21b may be implemented to cover the wavelength conversion members 21a and to provide a flat surface over the wavelength conversion members 21a. The protection layer 21b may be disposed to cover the wavelength conversion members 21a and the encapsulation layer 19 where the wavelength conversion members 21a are not disposed. The protection layer 21b according to an embodiment may include an organic material. Alternatively, the protection layer 21b may further include a getter material for adsorbing water and/or oxygen.

Alternatively, the wavelength conversion layer 21 according to another embodiment may include two or more layers wavelength conversion members 21a disposed over the encapsulation layer 19 overlapping the circuit area CA (or non-emission area) except for the emission area EA in each subpixel areas SPA. The two or more layers wavelength conversion members 21a may act as a function of the light blocking pattern.

Alternatively, the wavelength conversion layer 21 may be changed to a wavelength conversion sheet having a sheet form and may be disposed on the encapsulation layer 19. In this case, the wavelength conversion sheet (or a quantum dot sheet) may include the wavelength conversion members 21a disposed between a pair of films. For example, when the wavelength conversion layer 21 includes a quantum dot which re-emits colored light set in a subpixel, the light emitting device layer 13 of a subpixel may be implemented to emit white light or blue light.

The light emitting display apparatus according to an embodiment of the present disclosure may further include a functional film 23 disposed over the substrate 10.

The functional film 23 may be disposed over the wavelength conversion layer 21. For example, the functional film 23 may be coupled to the wavelength conversion layer 21 by a transparent adhesive member.

The functional film 23 according to an embodiment may include an anti-reflection layer (or an anti-reflection film) for preventing reflection of external light to enhance outdoor visibility and a contrast ratio with respect to an image displayed by the display panel. For example, the anti-reflection layer may include a circular polarization layer (or a circular polarization film) which prevents external light, reflected by TFTs and/or the pixel driving lines disposed at the substrate 10, from traveling to the outside.

The functional film 23 according to an embodiment may further include a barrier layer (or a barrier film) for primarily preventing the penetration of water or moisture or oxygen, and the barrier layer may include a material (for example, a polymer material) which is low in water transmission rate.

The functional film 23 according to an embodiment may further include a light path control layer (or a light path control film) for controlling a path of light output from each pixel P to the outside. The light path control layer may include a stacked structure where a high refraction layer and a low refraction layer are alternately stacked and may change a path of light incident from each pixel P to reduce or minimize a color shift based on a viewing angle.

The light emitting display apparatus according to an embodiment of the present disclosure may further include a side sealing member 25 disposed at the substrate 10.

The side sealing member 25 may be formed between the substrate 10 and the functional film 23 and may cover all of side surfaces of the circuit layer 11 and the wavelength conversion layer 21. For example, the side sealing member 25 may cover all of side surfaces of each of the circuit layer 11 and the wavelength conversion layer 21 exposed at the outside of the light emitting display apparatus, between the functional film 23 and the substrate 10. Also, the side sealing member 25 may cover a portion of the flexible circuit film 31 attached to each of the plurality of pad parts PP, at one edge portion of the substrate 10. The side sealing member 25 may prevent lateral light leakage by light, traveling to an outer surface in the wavelength conversion layer 21, among light emitted from the light emitting device ED of each subpixel SP. Particularly, the side sealing member 25 overlapping the pad part PP of the substrate 10 may prevent, reduce or minimize the reflection of light by the pad electrodes PPe disposed in the pad part PP.

Alternatively, the side sealing member 25 may further include a getter material for adsorbing water and/or oxygen.

As described above, in the light emitting display apparatus according to an embodiment of the present disclosure, the loss (or removal) of the metal pattern layer MPL for the eaves structure caused by the flow (or movement) of a patterning material by the pattern disconnection portion 17a2 implemented in the first dam pattern 17a of the dam pattern portion 17 may be prevented, reduced or minimized in forming (or manufacturing) the device isolation portion 15, and thus, the device isolation portion 15 for isolating the light emitting device ED may be normally formed. For example, in the light emitting display apparatus according to an embodiment of the present disclosure, as the flow (or movement) of the patterning material is smoothly performed in forming (or manufacturing) the device isolation portion 15 based on a structure change of the dam pattern portion 17, the over-etching of the first trench structure TS1 of the device isolation portion 15 may be prevented, and thus, the loss (or removal) of the metal pattern layer MPL for the eaves structure may be prevented, reduced or minimized, whereby the device isolation portion 15 may be normally formed. Accordingly, in the light emitting display apparatus according to an embodiment of the present disclosure, a reduction in reliability of the light emitting device ED caused by the lateral penetration of water or moisture occurring due to the loss or non-formation of the device isolation portion 15 may be prevented, reduced or minimized.

Figure 7:
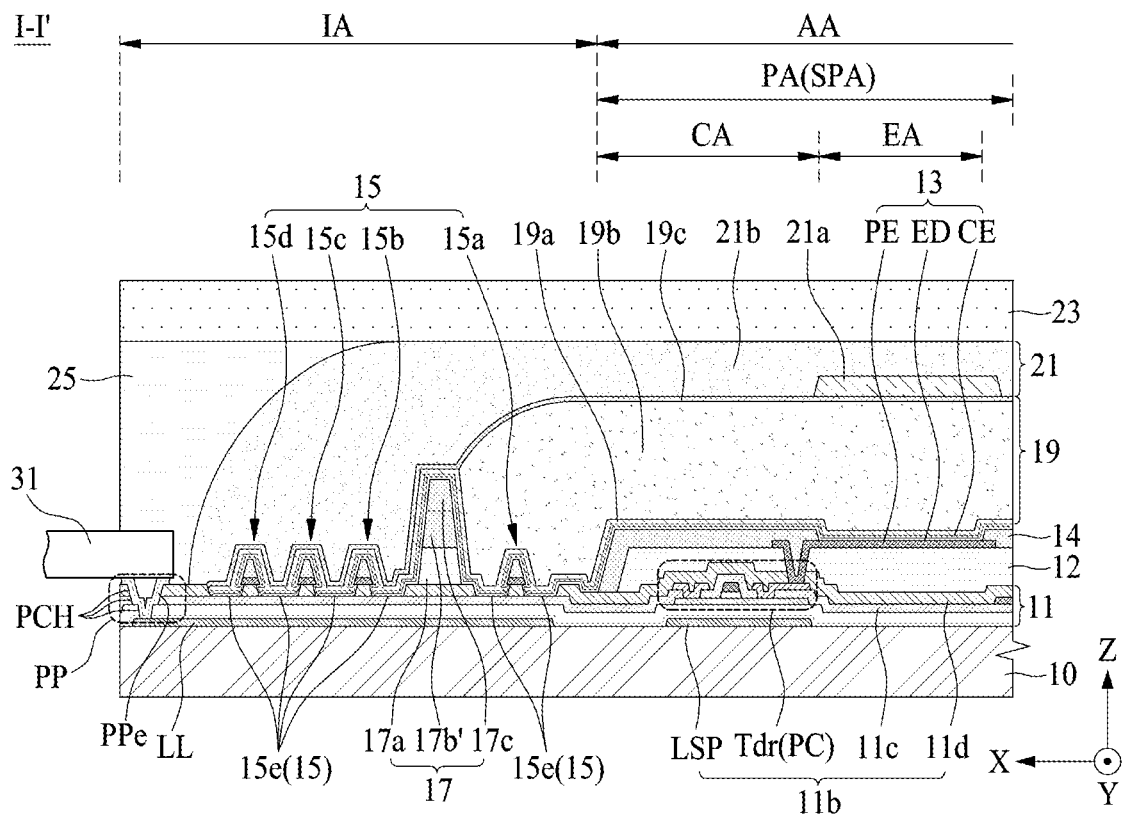
FIG. 7 is another cross-sectional view taken along line I-I' illustrated in FIG. 1.
Figure 8:
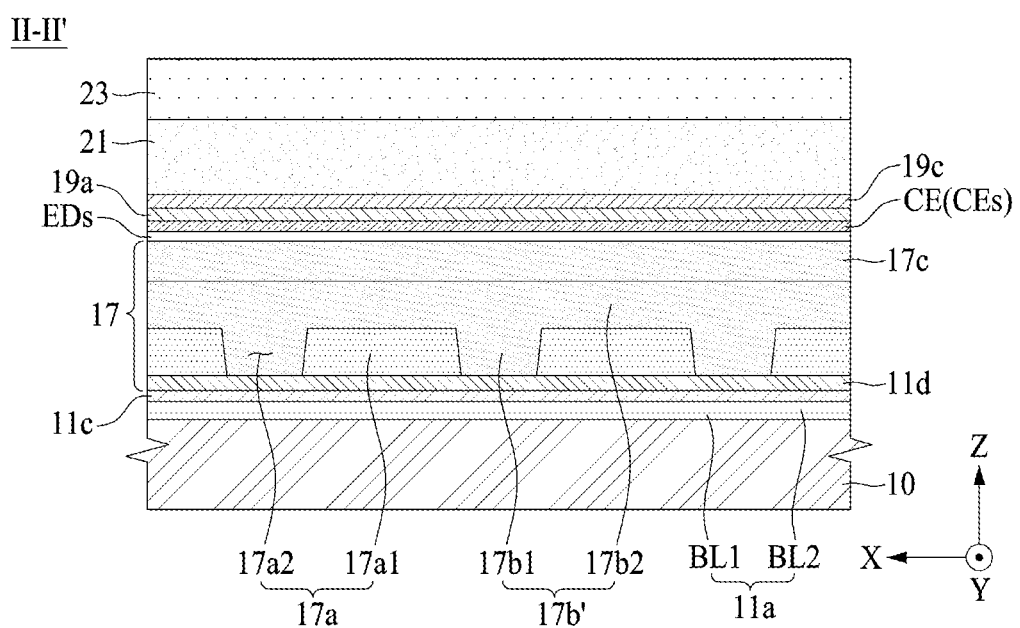
FIG. 8 is another cross-sectional view taken along line II-IP illustrated in FIG. 1.

FIG. 7 is another cross-sectional view taken along line I-I' illustrated in FIG. 1, and FIG. 8 is another cross-sectional view taken along line II-IF illustrated in FIG. 1. FIGS. 7 and 8 illustrate an embodiment implemented by modifying a structure of the dam pattern portion illustrated in FIGS. 1 to 6. In describing FIGS. 7 and 8, therefore, elements which are the same or correspond to the elements of FIGS. 1 to 6 are referred to by like reference numerals, and thus, their repetitive descriptions are omitted or will be briefly given below.

Referring to FIGS. 7 and 8, a dam pattern portion 17 according to another embodiment of the present disclosure may include a first dam pattern 17a and a second dam pattern 17b'.

The first dam pattern 17a may include the same material as the planarization layer 12. The first dam pattern 17a may include a plurality of line dam patterns 17a1 and a plurality of pattern disconnection portions 17a2. The first dam pattern 17a may include a structure (or pattern disconnection portions 17a2) for preventing the loss (or removal) of a metal pattern layer for the eaves structure in forming (or manufacturing) the device isolation portion 15 and may be substantially the same as the first dam pattern 17a described above with reference to FIGS. 3, 4, and 6, and thus, like reference numerals refer to like elements and their repetitive descriptions are omitted.

The second dam pattern 17b' may be disposed on the first dam pattern 17a to have a closed loop line shape. The second dam pattern 17b' may include the same material as the bank 14. The second dam pattern 17b' may include a plurality of protrusion patterns 17b1 and a closed loop line pattern 17b2. Except for that the second dam pattern 17b' is formed of the same material as the bank 14 together with the bank 14, the second dam pattern 17b' may be substantially the same as the second dam pattern 17b described above with reference to FIGS. 3, 4, and 6, and thus, like reference numerals refer to like elements and their repetitive descriptions are omitted. Accordingly, the second dam pattern 17b' may include a material which differs from the first dam pattern 17a, and thus, a boundary portion between the first dam pattern 17a and the second dam pattern 17b' may be clearly differentiated.

The dam pattern portion 17 according to another embodiment of the present disclosure may further include a third dam pattern 17c.

The third dam pattern 17c may be disposed on the second dam pattern 17b' to have a closed loop line shape. The third dam pattern 17c may be formed of the same material as the bank 14 together with the bank 14 and may be substantially the same as the third dam pattern 17c described above with reference to FIGS. 3, 4, and 6, and thus, like reference numerals refer to like elements and their repetitive descriptions are omitted.

As described above, except for that the first dam pattern 17a and the second dam pattern 17b' include different materials, the dam pattern portion 17 according to another embodiment of the present disclosure may be substantially the same as the dam pattern portion 17 described above with reference to FIGS. 3, 4, and 6, and thus, like the dam pattern portion 17 described above, the loss (or removal) of the metal pattern layer MPL for the eaves structure may be prevented, reduced or minimized in forming (or manufacturing) the device isolation portion 15, whereby the device isolation portion 15 may be normally formed (or manufactured).

Figure 9:
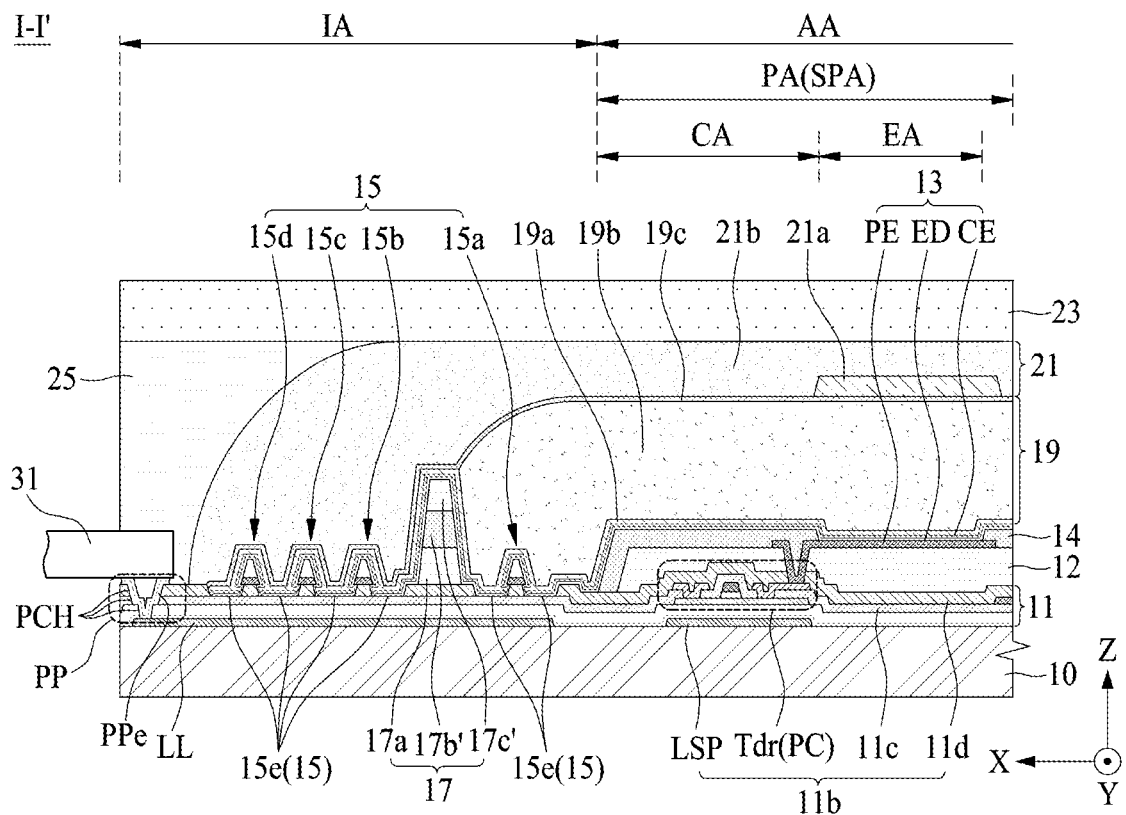
FIG. 9 is another cross-sectional view taken along line I-I' illustrated in FIG. 1.
Figure 10:
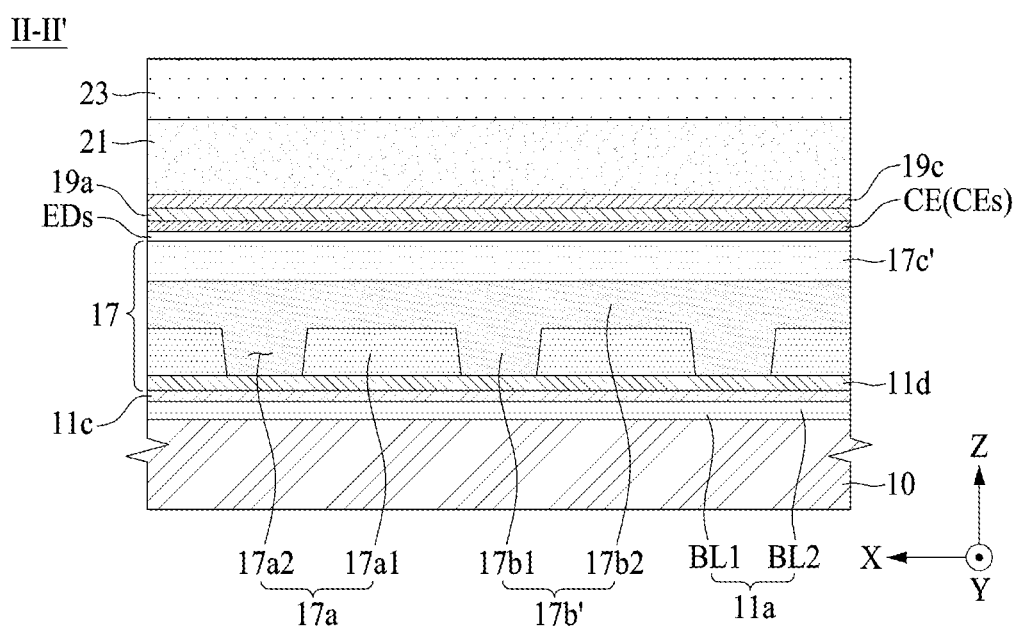
FIG. 10 is another cross-sectional view taken along line II-IP illustrated in FIG. 1.

FIG. 9 is another cross-sectional view taken along line I-I' illustrated in FIG. 1, and FIG. 10 is another cross-sectional view taken along line II-IF illustrated in FIG. 1. FIGS. 9 and 10 illustrate an embodiment implemented by modifying a structure of the dam pattern portion illustrated in FIGS. 1 to 6. In describing FIGS. 9 and 10, therefore, elements which are the same or correspond to the elements of FIGS. 1 to 6 are referred to by like reference numerals, and thus, their repetitive descriptions are omitted or will be briefly given below.

Referring to FIGS. 9 and 10, a dam pattern portion 17 according to another embodiment of the present disclosure may include a first dam pattern 17a and a second dam pattern 17b'.

The first dam pattern 17a may include the same material as the planarization layer 12. The first dam pattern 17a may include a plurality of line dam patterns 17a1 and a plurality of pattern disconnection portions 17a2. The first dam pattern 17a may include a structure (or pattern disconnection portions 17a2) for preventing the loss (or removal) of a metal pattern layer for the eaves structure in forming (or manufacturing) the device isolation portion 15 and may be substantially the same as the first dam pattern 17a described above with reference to FIGS. 3, 4, and 6, and thus, like reference numerals refer to like elements and their repetitive descriptions are omitted.

The second dam pattern 17b' may be disposed on the first dam pattern 17a to have a closed loop line shape. The second dam pattern 17b' may include the same material as the bank 14. The second dam pattern 17b' may include a plurality of protrusion patterns 17b1 and a closed loop line pattern 17b2. Except for that the second dam pattern 17b' is formed of the same material as the bank 14 together with the bank 14, the second dam pattern 17b' may be substantially the same as the second dam pattern 17b described above with reference to FIGS. 3, 4, and 6, and thus, like reference numerals refer to like elements and their repetitive descriptions are omitted. Accordingly, the second dam pattern 17b' may include a material which differs from the first dam pattern 17a, and thus, a boundary portion between the first dam pattern 17a and the second dam pattern 17b' may be clearly differentiated.

The dam pattern portion 17 according to another embodiment of the present disclosure may further include a third dam pattern 17c'.

The third dam pattern 17c' may be disposed on the second dam pattern 17b' to have a closed loop line shape. The third dam pattern 17c' according to an embodiment of the present disclosure may include the same material as the planarization layer 12. The third dam pattern 17c' may include a material which differs from the second dam pattern 17b', and thus, a boundary portion between the second dam pattern 17b' and the third dam pattern 17c' may be clearly differentiated. Except for that the third dam pattern 17c' is formed of the same material as the planarization layer 12 on the second dam pattern 17b' after a process of forming (or manufacturing) the bank 14, the third dam pattern 17c' may be substantially the same as the third dam pattern 17c described above with reference to FIGS. 3, 4, and 6, and thus, its repeated description is omitted.

As described above, except for that the first dam pattern 17a and the second dam pattern 17b' include different materials and the second dam pattern 17b' and the third dam pattern 17c' include different materials, the dam pattern portion 17 according to another embodiment of the present disclosure may be substantially the same as the dam pattern portion 17 described above with reference to FIGS. 3, 4, and 6, and thus, like the dam pattern portion 17 described above, the loss (or removal) of the metal pattern layer MPL for the eaves structure may be prevented, reduced or minimized in forming (or manufacturing) the device isolation portion 15, whereby the device isolation portion 15 may be normally formed (or manufactured).

Figure 11:
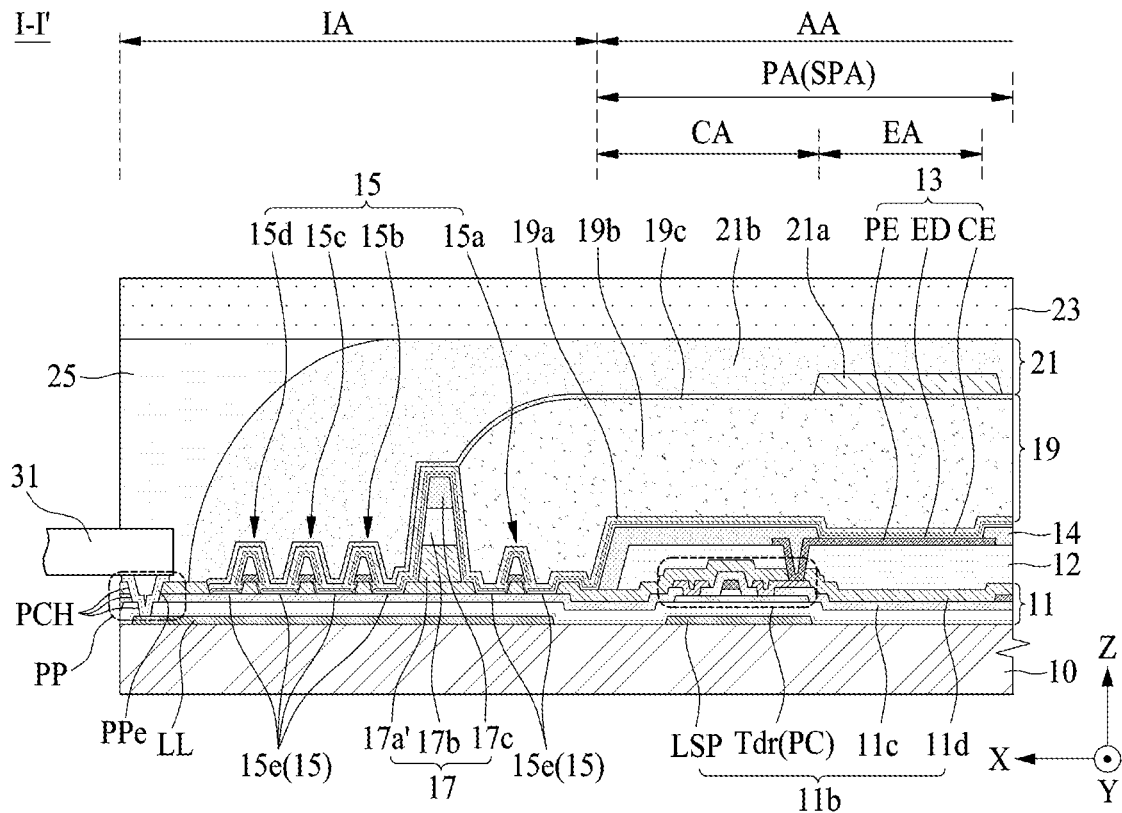
FIG. 11 is another cross-sectional view taken along line I-I' illustrated in FIG. 1.
Figure 12:
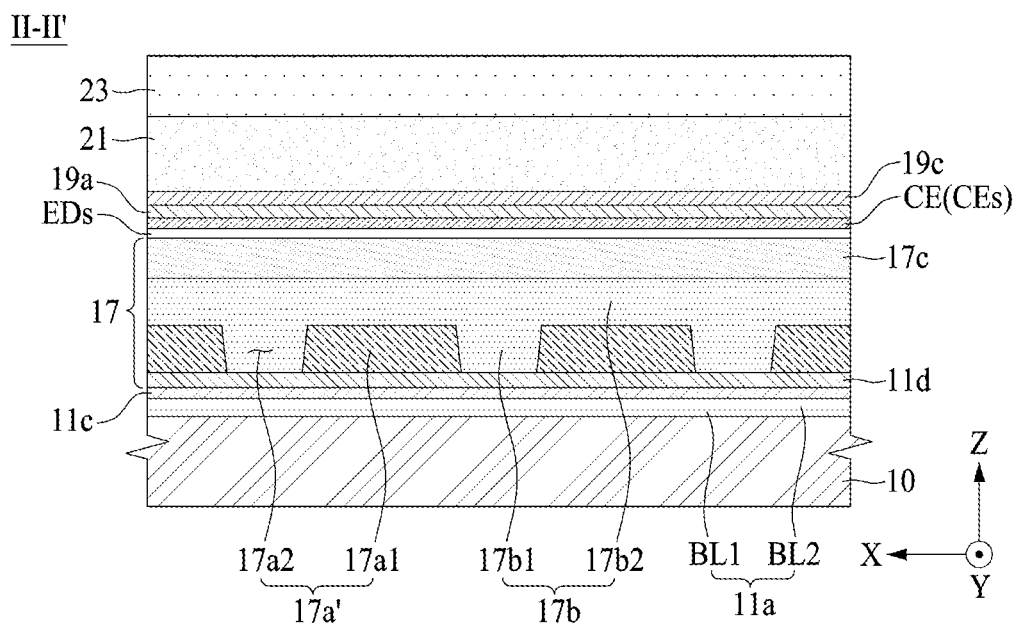
FIG. 12 is another cross-sectional view taken along line II-IP illustrated in FIG. 1.

FIG. 11 is another cross-sectional view taken along line I-I' illustrated in FIG. 1, and FIG. 12 is another cross-sectional view taken along line II-IF illustrated in FIG. 1. FIGS. 11 and 12 illustrate an embodiment implemented by modifying a structure of the dam pattern portion illustrated in FIGS. 1 to 6. In describing FIGS. 11 and 12, therefore, elements which are the same or correspond to the elements of FIGS. 1 to 6 are referred to by like reference numerals, and thus, their repetitive descriptions are omitted or will be briefly given below.

Referring to FIGS. 11 and 12, a dam pattern portion 17 according to another embodiment of the present disclosure may include a first dam pattern 17a' and a second dam pattern 17b.

The first dam pattern 17a' may be include a material including a color filter (or a wavelength conversion member) disposed in a wavelength conversion layer 21. For example, the first dam pattern 17a' may be formed in a single-layer or multi-layer structure which includes at least one wavelength conversion member or color filter layer disposed in the wavelength conversion layer 21. For example, the first dam pattern 17a' may include at least one of a red color filter, a green color filter, and a blue color filter.

The first dam pattern 17a' may include a plurality of line dam patterns 17a1 and a plurality of pattern disconnection portions 17a2. Except for that the first dam pattern 17a' includes a structure (or pattern disconnection portions 17a2) for preventing the loss (or removal) of a metal pattern layer for the eaves structure in forming (or manufacturing) the device isolation portion 15 and includes a material including a color filter (or a wavelength conversion member), the first dam pattern 17a' may be substantially the same as the first dam pattern 17a described above with reference to FIGS. 3, 4, and 6, and thus, its repeated description is omitted.

The second dam pattern 17b may be disposed on the first dam pattern 17a' to have a closed loop line shape. The second dam pattern 17b may include a plurality of protrusion patterns 17b1 and a closed loop line pattern 17b2. Except for that the second dam pattern 17b is formed of the same material as the planarization layer 12 together with the planarization layer 12, the second dam pattern 17b may be substantially the same as the second dam pattern 17b described above with reference to FIGS. 3, 4, and 6, and thus, like reference numerals refer to like elements and their repetitive descriptions are omitted. Accordingly, the second dam pattern 17b may include a material which differs from the first dam pattern 17a', and thus, a boundary portion between the first dam pattern 17a' and the second dam pattern 17b may be clearly differentiated.

The dam pattern portion 17 according to another embodiment of the present disclosure may further include a third dam pattern 17c.

The third dam pattern 17c may be disposed on the second dam pattern 17b to have a closed loop line shape. The third dam pattern 17c may be formed of the same material as the bank 14 together with the bank 14 and may be substantially the same as the third dam pattern 17c described above with reference to FIGS. 3, 4, and 6, and thus, like reference numerals refer to like elements and their repetitive descriptions are omitted.

As described above, except for that the first dam pattern 17a' includes a material including a color filter (or a wavelength conversion member), the dam pattern portion 17 according to another embodiment of the present disclosure may be substantially the same as the dam pattern portion 17 described above with reference to FIGS. 3, 4, and 6, and thus, like the dam pattern portion 17 described above, the loss (or removal) of the metal pattern layer MPL for the eaves structure may be prevented, reduced or minimized in forming (or manufacturing) the device isolation portion 15, whereby the device isolation portion 15 may be normally formed (or manufactured).

Alternatively, in the dam pattern portion 17 according to another embodiment of the present disclosure, the first dam pattern 17a' may be changed to the same material as the planarization layer 12, the second dam pattern 17b may be changed to a material including a color filter (or a wavelength conversion member), and the third dam pattern 17c may be changed to the same material as the planarization layer 12. Even in this case, except for that the second dam pattern 17b includes the material including the color filter (or the wavelength conversion member) and the third dam pattern 17c includes the same material as the planarization layer 12, the dam pattern portion 17 according to another embodiment of the present disclosure may be substantially the same as the dam pattern portion 17 described above with reference to FIGS. 3, 4, and 6, and thus, like the dam pattern portion 17 described above, the loss (or removal) of the metal pattern layer MPL for the eaves structure may be prevented, reduced or minimized in forming (or manufacturing) the device isolation portion 15, whereby the device isolation portion 15 may be normally formed (or manufactured).

Alternatively, in the dam pattern portion 17 according to another embodiment of the present disclosure, the first dam pattern 17a' may be changed to the same material as the planarization layer 12, the second dam pattern 17b may be changed to a material including a color filter (or a wavelength conversion member), and the third dam pattern 17c may be changed to the same material as the bank 14. Even in this case, except for that the second dam pattern 17b includes the material including the color filter (or the wavelength conversion member) and the third dam pattern 17c includes the same material as the bank 14, the dam pattern portion 17 according to another embodiment of the present disclosure may be substantially the same as the dam pattern portion 17 described above with reference to FIGS. 3, 4, and 6, and thus, like the dam pattern portion 17 described above, the loss (or removal) of the metal pattern layer MPL for the eaves structure may be prevented, reduced or minimized in forming (or manufacturing) the device isolation portion 15, whereby the device isolation portion 15 may be normally formed (or manufactured).

Figure 13:
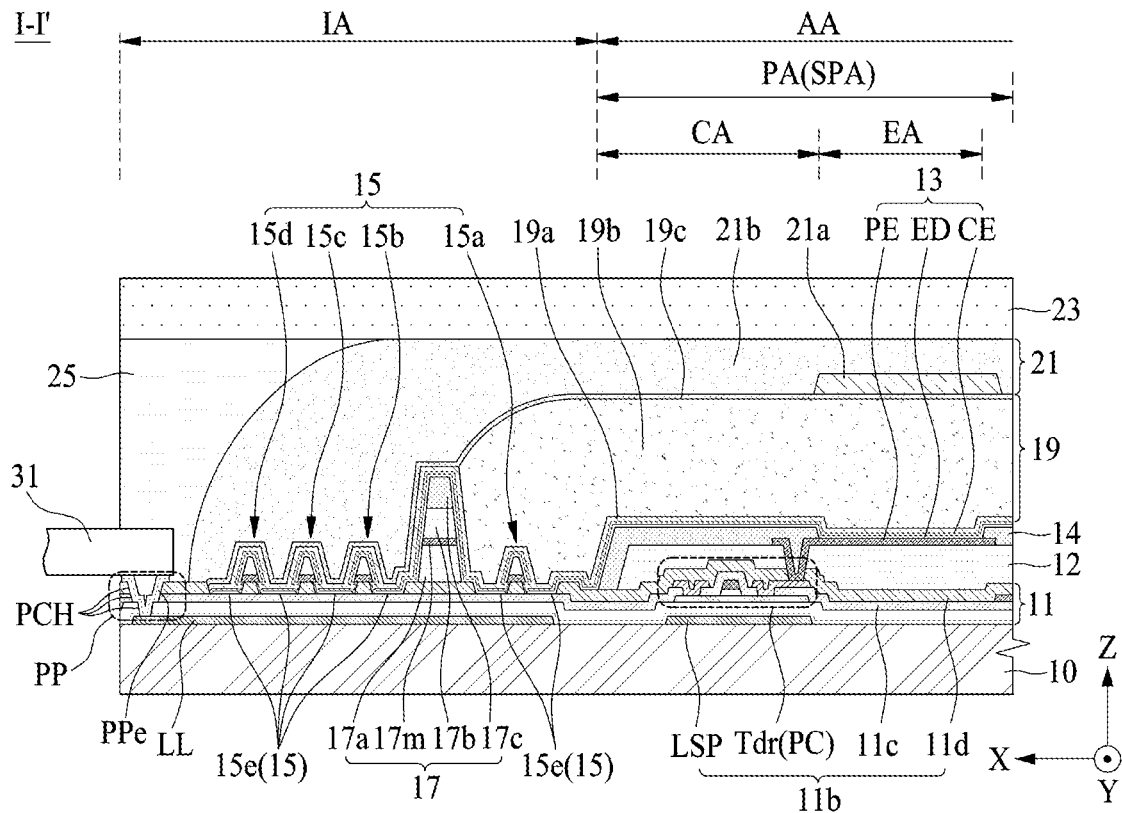
FIG. 13 is another cross-sectional view taken along line I-I' illustrated in FIG. 1.
Figure 14:
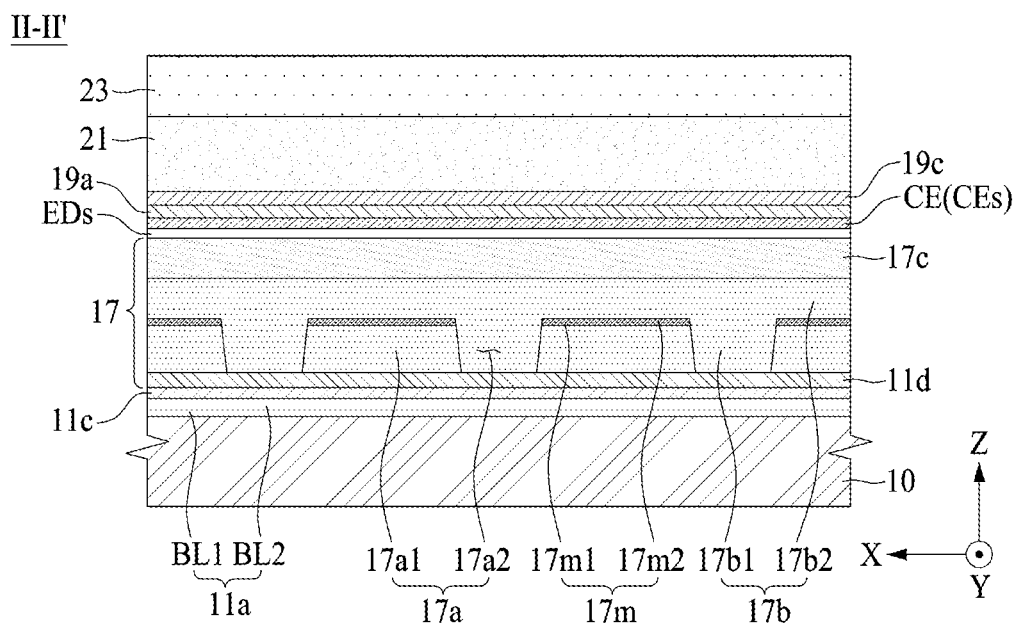
FIG. 14 is another cross-sectional view taken along line II-IP illustrated in FIG. 1.

FIG. 13 is another cross-sectional view taken along line I-I' illustrated in FIG. 1, and FIG. 14 is another cross-sectional view taken along line II-IP illustrated in FIG. 1. FIGS. 13 and 14 illustrate an embodiment implemented by modifying a structure of the dam pattern portion illustrated in FIGS. 1 to 6. In describing FIGS. 13 and 14, therefore, elements which are the same or correspond to the elements of FIGS. 1 to 6 are referred to by like reference numerals, and thus, their repetitive descriptions are omitted or will be briefly given below.

Referring to FIGS. 13 and 14, a dam pattern portion 17 according to another embodiment of the present disclosure may include a first dam pattern 17a, a metal dam pattern 17m, and a second dam pattern 17b.

The first dam pattern 17a may include the same material as the planarization layer 12. The first dam pattern 17a may include a plurality of line dam patterns 17a1 and a plurality of pattern disconnection portions 17a2. The first dam pattern 17a may include a structure (or dam disconnection portions 17a2) for preventing the loss (or removal) of a metal pattern layer for the eaves structure in forming (or manufacturing) the device isolation portion 15 and may be substantially the same as the first dam pattern 17a described above with reference to FIGS. 3, 4, and 6, and thus, its repeated description is omitted.

The metal dam pattern 17m may be disposed on the first dam pattern 17a. The metal dam pattern 17m according to an embodiment of the present disclosure may be disposed on only each of the plurality of line dam patterns 17a1 of the first dam pattern 17a. For example, the metal dam pattern 17m may not be disposed in each of the plurality of pattern disconnection portions 17a2 of the first dam pattern 17a. Accordingly, the metal dam pattern 17m may be referred to as the term such as a middle dam pattern, a middle metal dam pattern, a discontinuous metal dam pattern, a discontinuity metal dam pattern, a dotted-line metal dam pattern, or the like.

The metal dam pattern 17m may include a one or more-layer metal layer. For example, the metal dam pattern 17m may be formed of the same material as the pixel electrode PE together with the pixel electrode PE.

The metal dam pattern 17m according to an embodiment of the present disclosure may include a first dam metal layer 17m1 directly contacting the first dam pattern 17a and a second dam metal layer 17m2 disposed on the first dam metal layer 17m1.

The first dam metal layer 17m1 and the second dam metal layer 17m2 may be formed of the same material as the pixel electrode PE together with the pixel electrode PE disposed in the display area AA. For example, the first dam metal layer 17m1 may include the same material as the first pixel electrode layer of the pixel electrode PE. The second dam metal layer 17m2 may include the same material as the second pixel electrode layer of the pixel electrode PE. For example, the first dam metal layer 17m1 and the second dam metal layer 17m2 may be formed together with a pixel electrode layer, including a metal material capable of absorbing hydrogen, of a plurality of pixel electrode layers configuring the pixel electrode PE. For example, the metal dam pattern 17m may include a metal layer including titanium (Ti) or a metal layer including molybdenum titanium alloy (MoTi).

The second dam pattern 17b may be disposed on the metal dam pattern 17m to have a closed loop line shape. The second dam pattern 17b is formed of the same material as the planarization layer 12. The second dam pattern 17b may include a plurality of protrusion patterns 17b1 and a closed loop line pattern 17b2. Except for that the second dam pattern 17b is filled (or buried) between the line dam patterns 17a1 of the first dam pattern 17a and is disposed on the metal dam pattern 17m, the second dam pattern 17b may be substantially the same as the second dam pattern 17b described above with reference to FIGS. 3, 4, and 6, and thus, its repeated description is omitted. Accordingly, the metal dam pattern 17m may be disposed between the first dam pattern 17a and the second dam pattern 17b including the same material, and thus, a boundary portion between the first dam pattern 17a and the second dam pattern 17b may be clearly differentiated.

The dam pattern portion 17 according to another embodiment of the present disclosure may further include a third dam pattern 17c.

The third dam pattern 17c may be disposed on the second dam pattern 17b to have a closed loop line shape. The third dam pattern 17c may be formed of the same material as the bank 14 together with the bank 14 and may be substantially the same as the third dam pattern 17c described above with reference to FIGS. 3, 4, and 6, and thus, like reference numerals refer to like elements and their repetitive descriptions are omitted.

As described above, except for that the metal dam pattern 17m is disposed between the first dam pattern 17a and the second dam pattern 17b, the dam pattern portion 17 according to another embodiment of the present disclosure may be substantially the same as the dam pattern portion 17 described above with reference to FIGS. 3, 4, and 6, and thus, like the dam pattern portion 17 described above, the loss (or removal) of the metal pattern layer MPL for the eaves structure may be prevented, reduced or minimized in forming (or manufacturing) the device isolation portion 15, whereby the device isolation portion 15 may be normally formed (or manufactured). Also, in the dam pattern portion 17 according to another embodiment of the present disclosure, as a height (or a thickness) based on a height (or a thickness) of the metal dam pattern 17m increases, the spread or overflow of the encapsulation layer 19 may be effectively prevented. Moreover, the dam pattern portion 17 according to another embodiment of the present disclosure may further include the metal dam pattern 17m including a metal material capable of absorbing hydrogen, thereby preventing or minimizing a characteristic variation of a TFT and/or a light emitting device caused by hydrogen.

Figure 15:
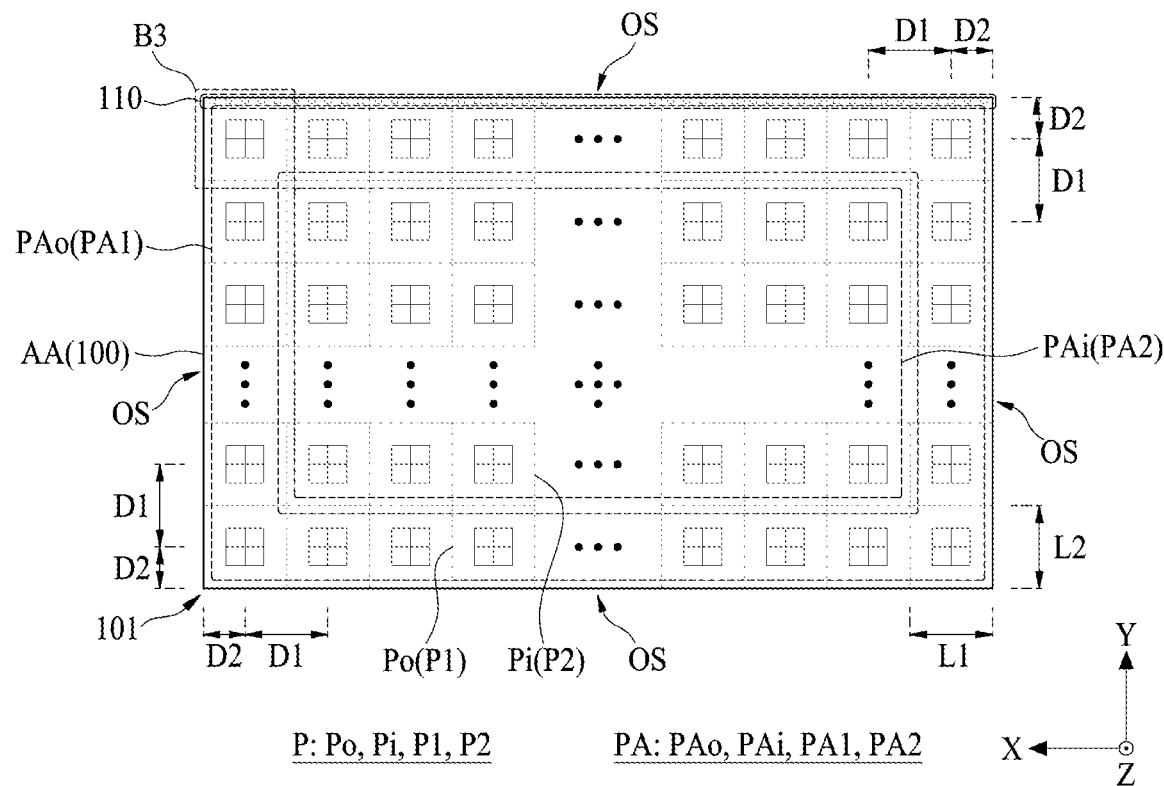
FIG. 15 is a plan view illustrating a light emitting display apparatus according to another embodiment of the present disclosure.
Figure 16:
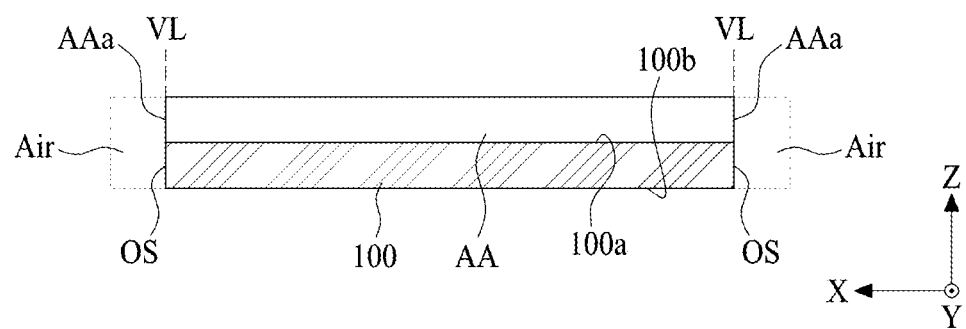
FIG. 16 is a side view schematically illustrating a light emitting display apparatus according to another embodiment of the present disclosure.
Figure 17:
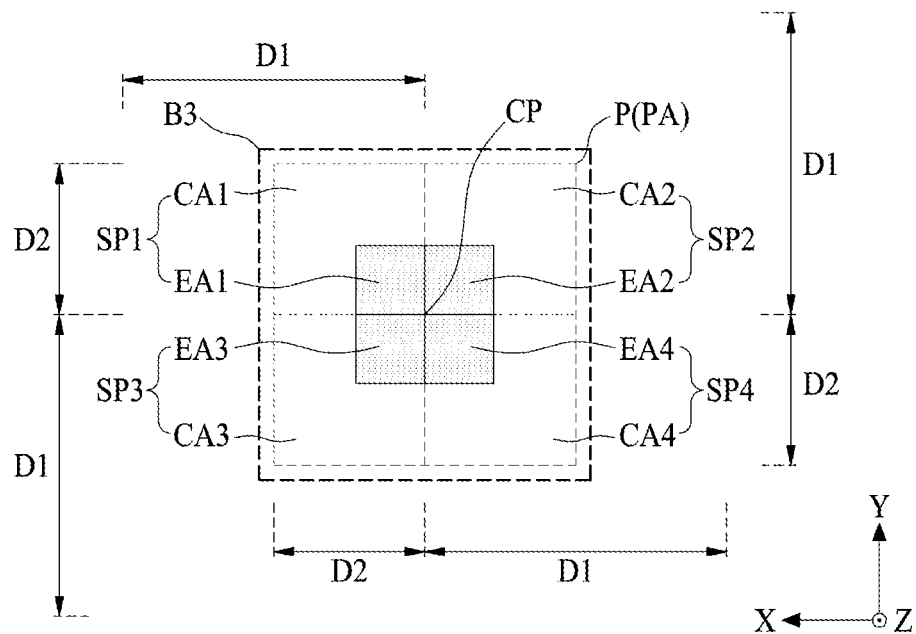
FIG. 17 is an enlarged view of a region 'B3' illustrated in FIG. 15.
Figure 18:
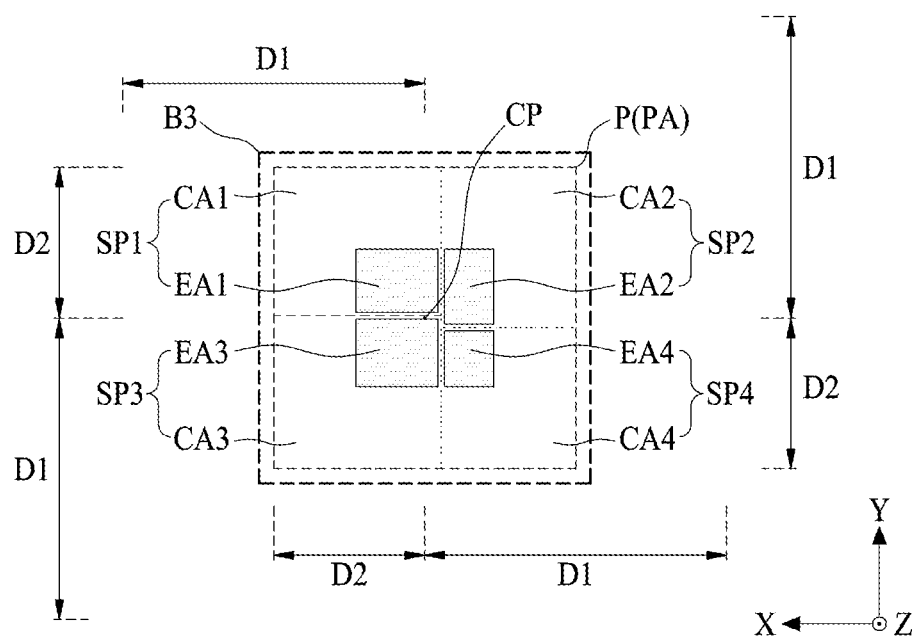
FIG. 18 is another enlarged view of a region 'B3' illustrated in FIG. 15.

FIG. 15 is a plan view illustrating a light emitting display apparatus according to another embodiment of the present disclosure, FIG. 16 is a side view schematically illustrating a light emitting display apparatus according to another embodiment of the present disclosure, FIG. 17 is an enlarged view of a region 'B3' illustrated in FIG. 15, and FIG. 18 is another enlarged view of a region 'B3' illustrated in FIG. 15.

Referring to FIGS. 15 to 18, the light emitting display apparatus (or a light emitting display panel) according to another embodiment of the present disclosure may include a first substrate 100 including a display area AA, and a plurality of pixels P which are arranged at a first interval D1 in the display area AA of the first substrate 100.

The first substrate 100 may include a first surface 100a, a second surface 100b, and an outer surface OS. The first surface 100a of the first substrate 100 may be defined as a front surface, a top surface, or an upper surface facing a front surface (or a forward direction) of the light emitting display apparatus. The second surface 100b of the first substrate 100 may be defined as a back surface, a rear surface, a bottom surface, or a lower surface facing a back surface (or a rearward direction) of the light emitting display apparatus. The outer surface OS of the first substrate 100 may be defined as a side surface, a lateral surface, or a sidewall, which extends along an outer periphery between the first surface 100a and the second surface 100b, faces the lateral surface (or the lateral direction) of the light emitting display apparatus, and is exposed to air. For example, when the first substrate 100 has a hexahedral structure, the outer surface OS of the first substrate 100 may include side surfaces of the hexahedral structure.

The outer surface OS of the first substrate 100 may be formed in parallel with a thickness direction Z of the light emitting display apparatus. For example, the outer surface OS of the first substrate 100 may include a first outer surface which is parallel to a first direction X, a second outer surface which is parallel to the first outer surface, a third outer surface which is parallel to a second direction Y crossing to the first direction X and is connected between one end of the first outer surface and one end of the second outer surface, and a fourth outer surface which is parallel to the third outer surface and is connected between the other end of the first outer surface and the other end of the second outer surface. The first direction X may be a first lengthwise direction (for example, a widthwise direction) of the first substrate 100 or the light emitting display apparatus, and the second direction Y may be a second lengthwise direction (for example, a lengthwise direction) of the first substrate 100 or the light emitting display apparatus.

The display area AA of the first substrate 100 may be an area which displays an image and may be referred to as a display portion or an active portion. A size of the display area AA may be the same as or substantially the same as the first substrate 100 (or the light emitting display apparatus). For example, a size of the display area AA may be the same as a total size of the first surface 100a of the first substrate 100. Therefore, the display area AA may be implemented (or disposed) on the whole front surface of the first substrate 100, and thus, the first substrate 100 may not include an opaque non-display area which is provided along an edge portion of the first surface 100a to surround all of the display area AA. Accordingly, a whole front surface of the light emitting display apparatus may implement the display area AA.

An end (or an outermost portion) AAa of the display area AA may overlap or may be substantially aligned with the outer surface OS of the first substrate 100. For example, a lateral surface AAa of the display portion AA may be substantially coplanar with the outer surface OS of the first substrate 100. In other words, the lateral surface of the display portion AA and the outer surface OS of the first substrate 100 may be aligned at substantially the same position. The lateral surface AAa of the display portion AA may not be surrounded by a separate mechanism and may be surrounded by only air. As another example, the lateral surface of the display portion AA may overlap or may be substantially aligned with the outer surface OS of the first substrate 100. Therefore, the outer surface OS of the first substrate 100 corresponding to the end AAa of the display area AA may directly contacts air without being surrounded by a separate mechanism or may surrounded by air, and thus, the light emitting display apparatus according to the present disclosure may have an air-bezel structure or a non-bezel structure where the end AAa of the display area AA (or the lateral surface of the display portion AA) is surrounded by air instead of an opaque non-display area.

The display area (or the display portion) AA according to an embodiment may include a plurality of pixel areas PA.

The plurality of pixel areas PA according to an embodiment may be arranged (or disposed) at the first interval D1 in the display area AA of the first substrate 100. Two pixel areas PA adjacent to each other in the first direction X and the second direction Y of the first substrate 100 may have the same first interval D1 without an error range of a manufacturing process. The first interval D1 may be a pitch (or a pixel pitch) between two adjacent pixel areas PA. For example, the first interval D1 may be a shortest distance (or a shortest length) between center portions of two adjacent pixel areas PA. Optionally, the pixel pitch may be a size between one end and the other end of a pixel area PA parallel to the first direction X. Also, as another example, the pixel pitch may be referred to as a size between one end and the other end of a pixel area PA parallel to the second direction Y.

Each of the plurality of pixel areas PA may have a first length L1 parallel to the first direction X and a second length L2 parallel to the second direction Y. Each of the first length L1 and the second length L2 may be the same as the first interval D1. For example, the first length L1 may be referred to as a first width, a widthwise length, or a widthwise width. The second length L2 may be referred to as a second width, a lengthwise length, or a lengthwise width. The first length L1 or the second length L2 of the pixel area PA may be referred to as a pixel pitch.

A second interval D2 between each of outermost pixel areas PAo among the plurality of pixel areas PA and the outer surface OS of the first substrate 100 may be half or less of the first interval D1 so that the whole front surface of the first substrate 100 (or the whole front surface of the light emitting display apparatus) is referred to as a display area AA. For example, the second interval D2 may be a shortest distance (or a shortest length) between a center portion of the outermost pixel area PAo and the outer surface OS of the first substrate 100.

When the second interval D2 is greater than half of the first interval D1, the first substrate 100 may have a greater size than the display area AA by an area between an end of the outermost pixel area PAo (or the end AAa of the display area AA) and the outer surface OS of the first substrate 100, and thus, an area between the end of the outermost pixel area PAo and the outer surface OS of the first substrate 100 may be provided as a non-display area surrounding all of the display area AA. Therefore, the first substrate 100 may necessarily include a bezel area based on a non-display area surrounding all of the display area AA. On the other hand, when the second interval D2 is half or less of the first interval D1, the end of the outermost pixel area PAo (or the end AAa of the display area AA) may overlap the outer surface OS of the first substrate 100 or may be disposed in a space outside the outer surface OS of the first substrate 100, and thus, the display area AA may be implemented (or disposed) on the whole front surface of the first substrate 100.

The display area (or the display portion) AA according to an embodiment may include the outermost pixel area PAo and an internal pixel area (or an inner pixel area) PAi.

The outermost pixel area PAo may be disposed along an edge portion (or a periphery portion) of the first substrate 100 among the plurality of pixel areas PA. For example, the outermost pixel area PAo may be referred to as a first pixel area PAi.

The internal pixel area PAi may be a pixel area other than the outermost pixel area PAo among the plurality of pixel areas PA, or may be surrounded by the outermost pixel area PAo. The internal pixel area PAi may be referred to as a second pixel area PA2.

Each of a plurality of pixels P may be disposed in a corresponding pixel area PA of the plurality of pixel areas PA defined on the first surface 100a of the first substrate 100. For example, the display area AA may be a pixel array which includes the plurality of pixels P arranged on the first substrate 100. The pixels P of the pixel array may be immediately adjacent to one another in the first direction X and the second direction Y. For example, the pixels P of the pixel array may be immediately adjacent to one another in the first direction X and the second direction Y without a separation space (or a spaced apart). As another example, an end of the plurality of outermost pixels Po in the pixel array may match to overlap one another at the outer surface OS of the first substrate 100, or may be aligned at the outer surface OS of the first substrate 100 on the same plane. For example, each pixel P of the pixel array may be arranged on the first substrate 100 to have a pixel pitch D1 in the first direction X and the second direction Y, and an interval D2 between a center portion of each of the outermost pixels Po and the outer surface OS of the first substrate 100 may be half or less of the pixel pitch D1.

The display area (or the display portion) AA according to an embodiment may include an outermost pixel Po and an internal pixel (or an inner pixel) Pi.

The outermost pixel Po may be disposed at the edge portion (or a periphery portion) of the first substrate 100 among the plurality of pixel areas PA. For example, the outermost pixel Po may be referred to as a first pixel P1 disposed in the outermost pixel area PAo.

The internal pixel Pi may be a pixel other than the outermost pixel Po among the plurality of pixels P, or may be disposed to be surrounded by the outermost pixel Po. For example, the internal pixel Pi may be referred to as a second pixel P2. The internal pixel Pi (or the second pixel P2) may be implemented to have a configuration or a structure, which differs from the outermost pixel Po (or the first pixel P1).

The second interval D2 between each of the outermost pixels Po of the plurality of pixels P and the outermost surface OS of the first substrate 100 may be half or less of the first interval D1 so that the whole front surface of the first substrate 100 (or the whole front surface of the light emitting display apparatus) is referred to as the display area AA. The first interval D1 may be a shortest distance (or a shortest length) between center portions of two adjacent pixels P. The second interval D2 may be a shortest distance (or a shortest length) between a center portion of the outermost pixel Po and the outer surface OS of the first substrate 100.

Referring to FIGS. 17 and 18, each of the plurality of pixels P according to another embodiment may include first to fourth subpixels SP1 to SP4.

The first subpixel SP1 may be disposed in a first subpixel area of the pixel area PA, the second subpixel SP2 may be disposed in a second subpixel area of the pixel area PA, the third subpixel SP3 may be disposed in a third subpixel area of the pixel area PA, and the fourth subpixel SP4 may be disposed in a fourth subpixel area of the pixel area PA. As an embodiment, the first subpixel SP1 may be implemented to emit light of a first color, the second subpixel SP2 may be implemented to emit light of a second color, the third subpixel SP3 may be implemented to emit light of a third color, and the fourth subpixel SP4 may be implemented to emit light of a fourth color. For example, each of the first to fourth colors may be different. For example, the first color may be red, the second color may be blue, the third color may be white, and the fourth color may be green. As another embodiment, some of the first to fourth colors may be the same. For example, the first color may be red, the second color may be first green, the third color may be second green, and the fourth color may be blue.

The first to fourth subpixels SP1 to SP4 may respectively include a plurality of emission areas EA1 to EA4 and a plurality of circuit areas CA1 to CA4

The emission areas EA1 to EA4 (or a light emitting portion) may be may be disposed close to the central portion CP of the pixel P inside the subpixel area.

The emission areas EA1 to EA4 of each of the first to fourth subpixels SP1 to SP4 according to an embodiment may be implemented to have the same size (or same area) inside the corresponding pixel P or the pixel area PA as illustrated in FIG. 17. For example, the emission areas EA1 to EA4 of each of the first to fourth subpixels SP1 to SP4 may have a uniform quad structure or a uniform stripe structure. For example, each of the emission areas EA1 to EA4 having a uniform quad structure or a uniform stripe structure may be disposed close to a center portion CP of the pixel P to have a size which is smaller than each of four equal division regions of the pixel P.

The emission areas EA1 to EA4 of each of the first to fourth subpixels SP1 to SP4 according to another embodiment may be implemented to have different sizes inside the corresponding pixel P or the pixel area PA as illustrated in FIG. 18. For example, the emission areas EA1 to EA4 of each of the first to fourth subpixels SP1 to SP4 may have a non-uniform quad structure or a non-uniform stripe structure.

In each of the first to fourth subpixels SP1 to SP4 having a non-uniform quad structure (or a non-uniform stripe structure), a size of each of the emission areas EA1 to EA4 may be set based on a resolution, emission efficiency, or image quality. As an embodiment, when the emission areas EA1 to EA4 have a non-uniform quad structure (or a non-uniform stripe structure), among the emission areas EA1 to EA4 of the first to fourth subpixels SP1 to SP4, the emission area EA4 of the fourth subpixel SP4 may have a smallest size, and the emission area EA3 of the third subpixel SP3 may have a largest size.

In the first to fourth subpixels SP1 to SP4, each of the emission areas EA1 to EA4 may be spaced apart from each other in the first direction X and the second direction Y, but embodiments of the present disclosure are not limited thereto, and may be immediately adjacent to each other without a separation space (or a spaced apart).

The circuit areas CA1 to CA4 of each of the first to fourth subpixels SP1 to SP4 may be disposed around (or near) a corresponding emission area among the emission areas EA1 to EA4. Each of the circuit areas CA1 to CA4 may include a pixel circuit, signal lines, and power lines for emitting a corresponding subpixel among the first to fourth subpixels SP1 to SP4. For example, the circuit areas CA1 to CA4 may be referred to as a non-emission area, or a periphery portion.

Alternatively, in order to increase an aperture ratio of the subpixels SP1 to SP4 corresponding to sizes of the emission areas EA1 to EA4 or decrease the pixel pitch D1 as a resolution of the pixel P is higher, the emission areas EA1 to EA4 of the first to fourth subpixels SP1 to SP4 may extend to the circuit areas CA1 to CA4 to overlap some or all of the circuit areas CA1 to CA4. For example, each of the emission areas EA1 to EA4 of the first to fourth subpixels SP1 to SP4 may be implemented on the substrate 100 to overlap a corresponding circuit area of the circuit areas CA1 to CA4. In this case, the emission areas EA1 to EA4 may have a size which is equal to or greater than the circuit areas CA1 to CA4.

Alternatively, each of the plurality of pixels P according to another embodiment of the present disclosure may include first to third subpixels SP1 to SP3.

The emission areas EA1 to EA3 of the first to third subpixels SP1 to SP3 may respectively have a rectangular shape which includes a short side parallel to the first direction X and a long side parallel to the second direction Y, and for example, may be disposed a 1×3 form or a 1×3 stripe form. For example, the first subpixel may be a red subpixel, the second subpixel may be a blue subpixel, and the third subpixel may be a green subpixel, but embodiments of the present disclosure are not limited thereto.

The light emitting display apparatus according to another embodiment of the present disclosure may further include a pad part 110 including a plurality of pads which are disposed in the display area AA of the first substrate 100 and are selectively coupled to the plurality of pixels P. For example, the pad part 110 may be a first pad part or a front pad part.

The pad part 110 may be included in the outmost pixels Po disposed at a first edge portion among the first surface of the first substrate 100 parallel to the first direction X. That is, the outermost pixels Po disposed at the first edge portion of the first substrate 100 may include at least one or more of the plurality of pads. Therefore, the plurality of pads may be disposed or included within the display area AA, and thus, a non-display area (or a bezel area) based on the pad part 110 may not be formed or may not be at the first substrate 100. Therefore, the outermost pixels Po (or the first pixel P1) may be include the pad part 110, and thus, may be implemented to have a configuration or a structure which differs from an inner pixel Pi (or the second pixel P2) that does not include the pad part 110.

According to an embodiment, when the pad part 110 is not provided inside the outermost pixels Po and is disposed between the outermost pixels Po and the outer surface OS of the first substrate 100, the first substrate 100 may include a non-display area corresponding to an area where the pad part 110 is provided, and due to the non-display area, the second interval D2 between the outermost pixels Po and the outer surface OS of the first substrate 100 may be greater than half of the first interval D1, all of the first substrate 100 may not be implemented as the display area AA, and a separate bezel (or a separate mechanism) for covering the non-display area may be needed. On the other hand, the pad part 110 according to an embodiment of the present disclosure may be disposed between the center portion of the outermost pixels Po and the outer surface OS of the first substrate 100 and may be included inside (or within) the outermost pixels Po, and thus, a non-display area (or a bezel area) based on the pad part 110 may not be formed or may not be between the outermost pixels Po and the outer surface OS of the first substrate 100.

Therefore, the light emitting display apparatus according to another embodiment of the present disclosure may have an air-bezel structure where a whole first substrate 100 including the pad part 110 is implemented as the display area AA, and thus, all outer surfaces (or outer surfaces of the display panel) OS of the first substrate 100 aligned with an end of the display area AA are surrounded by only air without a separate mechanism.

Figure 19:
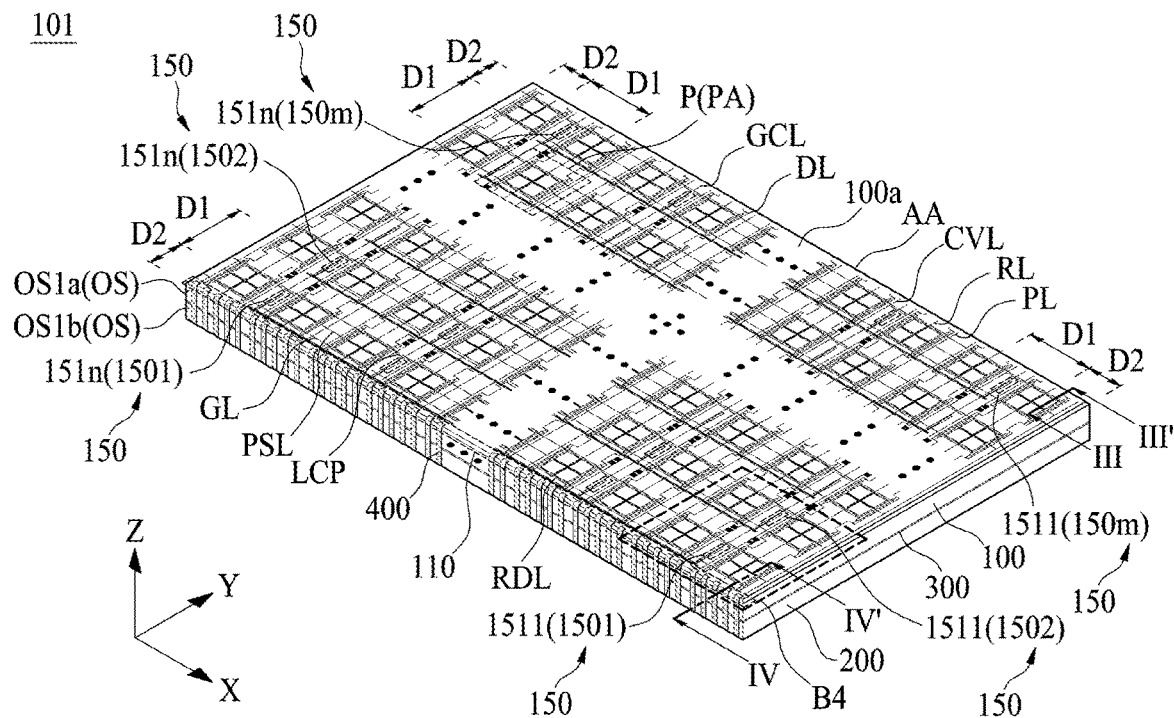
FIG. 19 is a front perspective view illustrating the light emitting display apparatus illustrated in FIG. 15.
Figure 20:
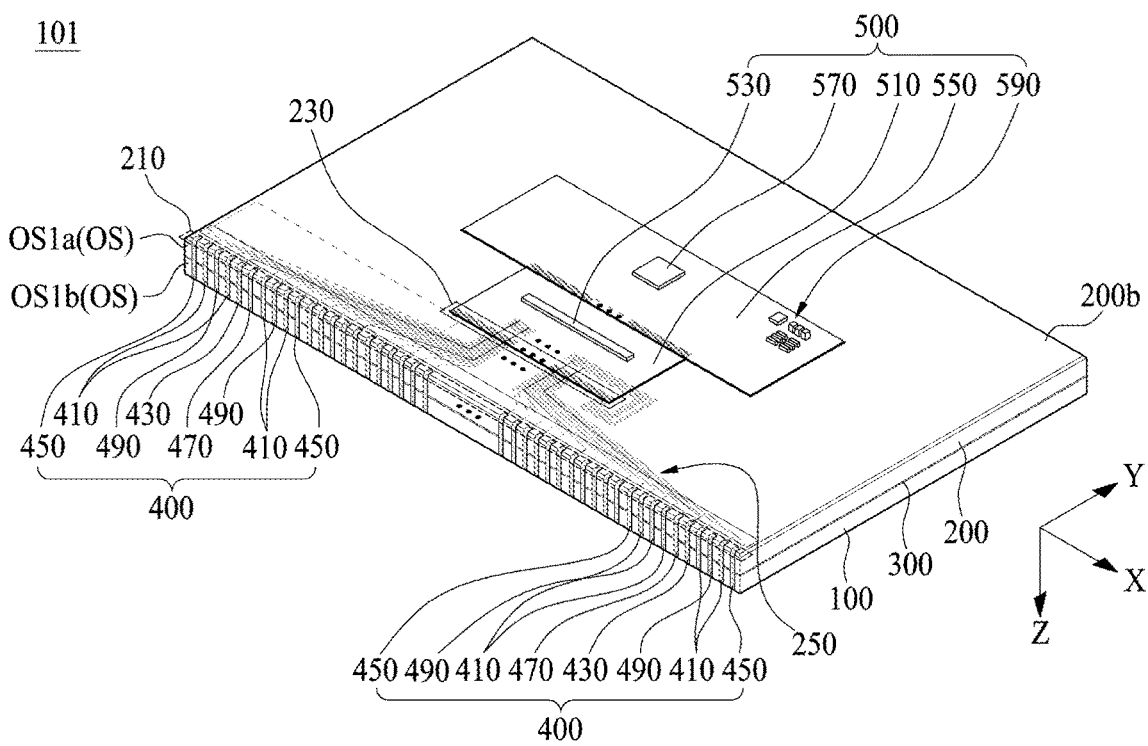
FIG. 20 is a diagram illustrating a rear surface of the light emitting display apparatus illustrated in FIG. 15.

FIG. 19 is a front perspective view illustrating the light emitting display apparatus illustrated in FIG. 15, and FIG. 20 is a diagram illustrating a rear surface of the light emitting display apparatus illustrated in FIG. 15.

Referring to FIGS. 19 and 20, the light emitting display apparatus 101 according to another embodiment of the present disclosure may include a first substrate 100, a second substrate 200, a coupling member 300, and a routing portion 400.

The first substrate 100 may be referred to as a display substrate, a pixel array substrate, an upper substrate, a front substrate, or a base substrate. The first substrate 100 may be a glass substrate, or may be a thin glass substrate or a plastic substrate, which is bendable or flexible.

The first substrate 100 according to an embodiment may include a plurality of pixel driving lines and a plurality of pixels P.

The pixel driving lines may be provided over a first surface 100a of the first substrate 100 and may transfer a signal needed for driving (emitting light) of each of the plurality of pixels P. For example, the pixel driving line may include a plurality of data lines DL, a plurality of gate lines GL, a plurality of pixel driving power lines (or a first power line) PL, a plurality of pixel common voltage lines (or a second power line) CVL, and a plurality of pixel reference voltage lines (or a sensing line) RL.

According to an embodiment, each of the plurality of data lines DL, the plurality of gate lines GL, the plurality of pixel driving power lines PL, the plurality of pixel common voltage lines CVL, and the plurality of pixel reference voltage lines RL may be directly coupled to each of the pads of the first pad part 110 disposed at a first edge portion among of the first surface 100a of the first substrate 100 or may be coupled to through a pad connection line (or a pad link line).

The first pad part 110 may be included within a plurality of outermost pixels Po disposed at the first edge portion of the first substrate 100 parallel to a first direction X. Here, the first edge portion among the first surface 100a of the first substrate 100 may include a first outer surface (or one side surface) OS1a among an outer surface OS of the first substrate 100.

The first pad part 110 may include a plurality of first pads which are disposed in parallel with one another in the first direction X on a passivation layer 11d exposed at the first edge portion of the first surface 100a of the first substrate 100.

The plurality of pixels P may be respectively disposed in a plurality of pixel areas PA which are arranged at a first interval (or a first pitch) D1 in the first direction X and a second direction Y. Each of the plurality of pixels P may include a light emitting device (or a light emitting element), which emits light based on a top emission type based on a signal supplied through corresponding pixel driving line adjacent thereto and irradiates the light onto a portion above the first surface 100a of the first substrate 100, and a pixel circuit which is coupled to pixel driving lines adjacent thereto to allow the light emitting device to emit light. For example, the pixel circuit may include a driving thin film transistor (TFT) which provides the light emitting device with a data current corresponding to a data signal supplied through the data line DL.

A distance between an outermost pixel of the plurality of pixels P and the outer surface OS of the first substrate 100 may be half or less of the first interval D1. A second interval D2 between a center portion of the outermost pixel and the outer surface OS of the first substrate 100 may be half or less of the first interval D1, and thus, a whole front surface of the first substrate 100 (or a whole front surface of the light emitting display apparatus) may be implemented as the display area AA. Accordingly, the light emitting display apparatus according to another embodiment of the present disclosure may have an air-bezel structure where the display area AA is surrounded by air.

The first substrate 100 according to an embodiment may further include a gate driving circuit 150 which is disposed in the display area AA.

The gate driving circuit 150 according to an embodiment may be implemented with a shift register including a plurality of stage circuit portions 1501 to 150m (where m is an integer of 2 or more). For example, the light emitting display apparatus according to another embodiment of the present disclosure may include a shift register which is disposed in the display area AA of the first substrate 100 to supply the scan signal to the pixel P.

Each of the plurality of stage circuit portions 1501 to 150m may include a plurality of branch circuits 1511 to 151n (where n is an integer of 2 or more) which are disposed spaced apart from one another in each horizontal line of the first substrate 100 in the first direction X. The plurality of branch circuits 1511 to 151n may include at least one or more TFT (or a branch TFT) and may be disposed between at least one or more pixels P (or pixel areas PA) within one horizontal line along the first direction X. For example, the branch circuits 1511 to 151*n* may be disposed one by one between two adjacent pixels P (or pixel areas PA) within one horizontal line along the first direction X. Each of the plurality of stage circuit portions 1501 to 150*m* may generate the scan signal in a predetermined or selected order in response to a gate control signal supplied through the first pad part 110 and may supply the scan signal to the gate line GL. For example, the gate control signal may include a start signal, a plurality of shift clocks, at least one gate driving voltage, and at least one gate common voltage.

The first substrate 100 may further include a plurality of gate control line groups GCL which are coupled to the gate driving circuit 150. Each of the gate control line groups GCL may be selectively coupled to the plurality of branch circuits 1511 to 151*n* respectively disposed in the plurality of stage circuit portions 1501 to 150*m*.

The gate control line group GCL according to an embodiment may include a start signal line, a plurality of shift clock lines, at least one gate driving voltage line, and at least one gate common voltage line. The plurality of shift clock lines according to an embodiment may be divided (or classified) into a plurality of scan clock lines and a plurality of carry clock lines. Here, the plurality of carry clock lines may be omitted.

The first pad part 110 may further include a first gate pad part including a plurality of first gate pads coupled to the gate control line group GCL.

The second substrate 200 may be referred to as a wiring substrate, a link substrate, a lower substrate, a rear substrate, or link glass. The second substrate 200 may be a glass substrate, or may be a thin glass substrate or a plastic substrate, which is bendable or flexible. The second substrate 200 may include the same material as the first substrate 100. For example, the size of the second substrate 200 and the size of the first substrate 100 may be the same or substantially the same.

The second substrate 200 may be coupled (or connected) to a second surface of the first substrate 100 by the coupling member 300. The second substrate 200 may include a front surface which faces the second surface of the first substrate 100 or is coupled to the coupling member 300, a rear surface (or a back surface) opposite to the front surface, and an outer surface OS between the front surface and the rear surface. The second substrate 200 may transfer a signal to the pixel driving lines and may increase the stiffness of the first substrate 100.

The light emitting display apparatus according to another embodiment of the present disclosure may further include a second pad part 210 disposed over the second substrate 200.

The second pad part 210 may be disposed at a first edge portion of a rear surface 200*b* of the second substrate 200 overlapping the first pad part 110 disposed on the first substrate 100. The first edge portion of the rear surface 200*b* of the second substrate 200 may include a first outer surface (or one surface) OS1*b* of the outer surface OS of the second substrate 200.

The second pad part 210 may include a plurality of second pads which are arranged at a certain interval in the first direction X to respectively overlap the pads of the first pad part 110.

The light emitting display apparatus according to another embodiment of the present disclosure may further include a third pad part (or an input pad part) 230 and a link line portion 250 which are disposed on the second substrate 200.

A third pad part 230 may be disposed at the rear surface 200*b* of the second substrate 200. For example, the third pad part 230 may be disposed at a center portion adjacent to the first edge portion of the rear surface 200*b* of the second substrate 200. The third pad part 230 according to an embodiment may include a plurality of third pads (or input pads) which are spaced apart from one another by a certain interval.

The link line portion 250 may be disposed between the second pad part 210 and the third pad part 230. For example, the link line portion 250 may include a plurality of link lines which individually (or a one-to-one relationship) couple the second pads of the second pad part 210 to the third pads of the third pad part 230.

The coupling member 300 may be disposed between the first substrate 100 and the second substrate 200. The first substrate 100 and the second substrate 200 may be opposite-bonded to each other by the coupling member 300. For example, the second surface 100*b* (see FIG. 24) of the first substrate 100 may be coupled to one surface of the coupling member 300, and the front surface of the second substrate 200 may be coupled to the other surface of coupling member 300. Accordingly, the first substrate 100 and the second substrate 200 opposite-bonded (or coupled) to each other by the coupling member 300 may be referred to as a light emitting display panel.

The routing portion 400 may be referred to as a side routing portion or a printing line portion. The routing portion 400 may be disposed to surround the outer surface OS of the first substrate 100 and the outer surface OS of the second substrate 200. The routing portion 400 according to an embodiment may include a plurality of routing lines 410, 430, 450, 470, and 490 which are disposed at each of the first outer surface (or one surface) OS1*a* among the outer surface OS of the first substrate 100 and the first outer surface (or one surface) OS1*b* among the outer surface OS of the second substrate 200.

Each of the plurality of routing lines 410, 430, 450, 470, and 490 may be formed to surround each of the first outer surface OS1*a* of the first substrate 100 and the first outer surface OS1*b* of the second substrate 200. As an embodiment, the plurality of routing lines 410, 430, 450, 470, and 490 may be individually (or a one-to-one relationship) coupled between the pads of the first pad part 110 and the pads of the second pad part 210.

Alternatively, the second substrate 200 may be omitted, and in this case, the second pad part 210, the third pad part (or input pad part) 230, and the link line part 250 may be directly disposed at the rear surface of the first substrate 100. Moreover, the routing portion 400 may include a plurality of routing lines 410, 430, 450, 470, and 490 disposed to surround the outer surface OS of the first substrate 100.

The light emitting display apparatus 101 according to an embodiment of the present disclosure may further include a driving circuit unit 500.

The driving circuit unit 500 may drive (or emit light) the pixels P disposed on the first substrate 100 based on digital video data and a timing synchronization signal supplied from a display driving system to allow the display area AA to display an image corresponding to image data. The driving circuit unit 500 may be coupled to the third pad part 230 disposed on the rear surface 200*b* of the second substrate 200 and may output, to the third pad part 230, a data signal, a gate control signal, and a driving power for driving (or emitting light) the pixels P disposed on the first substrate 100. For example, the driving circuit unit 500 may have a size which is smaller than the second substrate 200, and thus, may be covered by the second substrate 200 and may not be exposed at the outer surface of the second substrate 200 or the outer surface of the first substrate 100.

The driving circuit unit 500 according to an embodiment may include a flexible circuit film 510, a driving integrated circuit (IC) 530, a printed circuit board (PCB) 550, a timing controller 570, and a power circuit unit 590. The driving circuit unit 500 having such a configuration may be substantially the same as the driving circuit unit 30 illustrated in FIG. 1, and thus, their repetitive descriptions are omitted or may be brief.

The flexible circuit film 510 may be coupled to the third pad part 230 disposed at the rear surface 200b of the second substrate 200.

The driving IC 530 may be mounted at the flexible circuit film 510. The driving IC 530 may be coupled to the plurality of data lines DL, the plurality of pixel driving power lines PL, the plurality of pixel common voltage lines CVL, and a plurality of reference voltage lines RL through the flexible circuit film 510, the third pad part 230, the link line portion 250, the second pad part 210, the routing portion 400, and the first pad part 110. The driving IC 530 may receive subpixel data and a data control signal provided from the timing controller 570, and convert the subpixel data into an analog data signal based on the data control signal to supply the analog data signal to a corresponding data line DL. Also, the driving IC 530 may generate a reference voltage, a pixel driving voltage, and a pixel common voltage and may supply the reference voltage, the pixel driving voltage, and the pixel common voltage to corresponding voltage line RL, power line PL, and common voltage line CVL.

The driving IC 530 may sense a characteristic value of a driving TFT disposed in the pixel P through the plurality of reference voltage lines RL disposed on the first substrate 100, generate sensing raw data corresponding to a sensing value, and provide the sensing raw data to the timing controller 570.

The PCB 550 may be coupled to the other edge portion of the flexible circuit film 510. The PCB 550 may transfer a signal and power between elements of the driving circuit unit 500.

The timing controller 570 may be mounted at the PCB 550 and may receive the digital video data and the timing synchronization signal provided from the display driving system through a user connector disposed at the PCB 550.

The timing controller 570 may align the digital video data based on the timing synchronization signal to generate pixel data matching a pixel arrangement structure disposed in the display area AA and may provide the generated pixel data to the driving IC 530.

The timing controller 570 may generate each of the data control signal and the gate control signal based on the timing synchronization signal, control a driving timing of the driving IC 530 based on the data control signal, and control a driving timing of the gate driving circuit 150 based on the gate control signal. For example, the timing synchronization signal may include a vertical synchronization signal, a horizontal synchronization signal, a data enable signal, and a main clock (or a dot clock).

The timing controller 570 may drive each of the driving IC 530 and the gate driving circuit 150 based on an external sensing mode during a predetermined or selected external sensing period, generate compensation data for compensating for a characteristic variation of the driving TFT of each pixel P based on the sensing raw data provided from the driving IC 530, and modulate pixel data based on the generated compensation data. For example, the timing controller 570 may drive each of the driving IC 530 and the gate driving circuit 150 based on the external sensing mode for each external sensing period corresponding to a blank period (or a vertical blank period) of the vertical synchronization signal.

The power circuit unit 590 may be mounted at the PCB 550 and may generate various source voltages needed for displaying an image on the pixels P by an input power supplied from the outside to provide the generated source voltage to a corresponding circuit.

Figure 21:
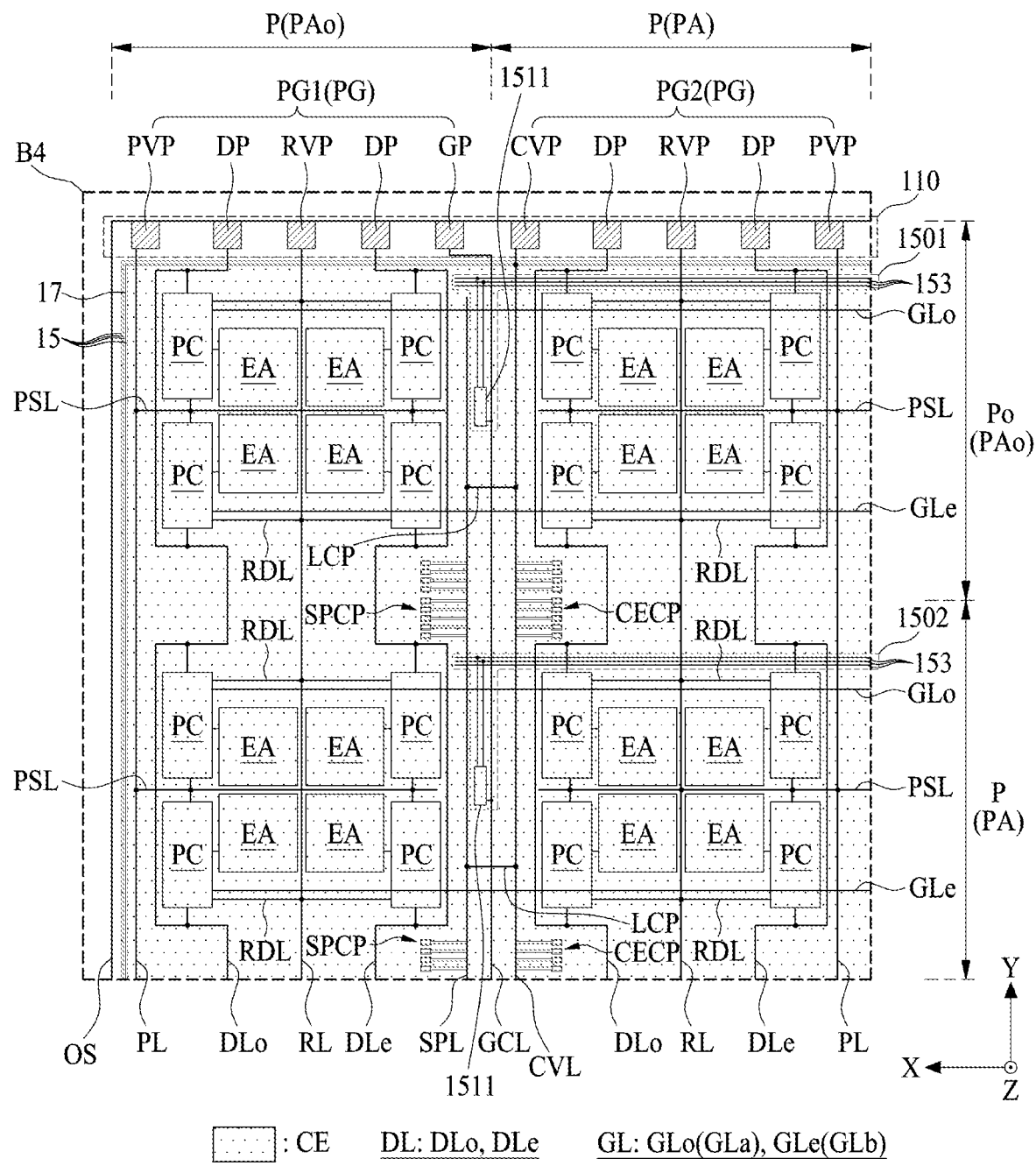
FIG. 21 is an enlarged view of a region 'B4' illustrated in FIG. 19.
Figure 22:
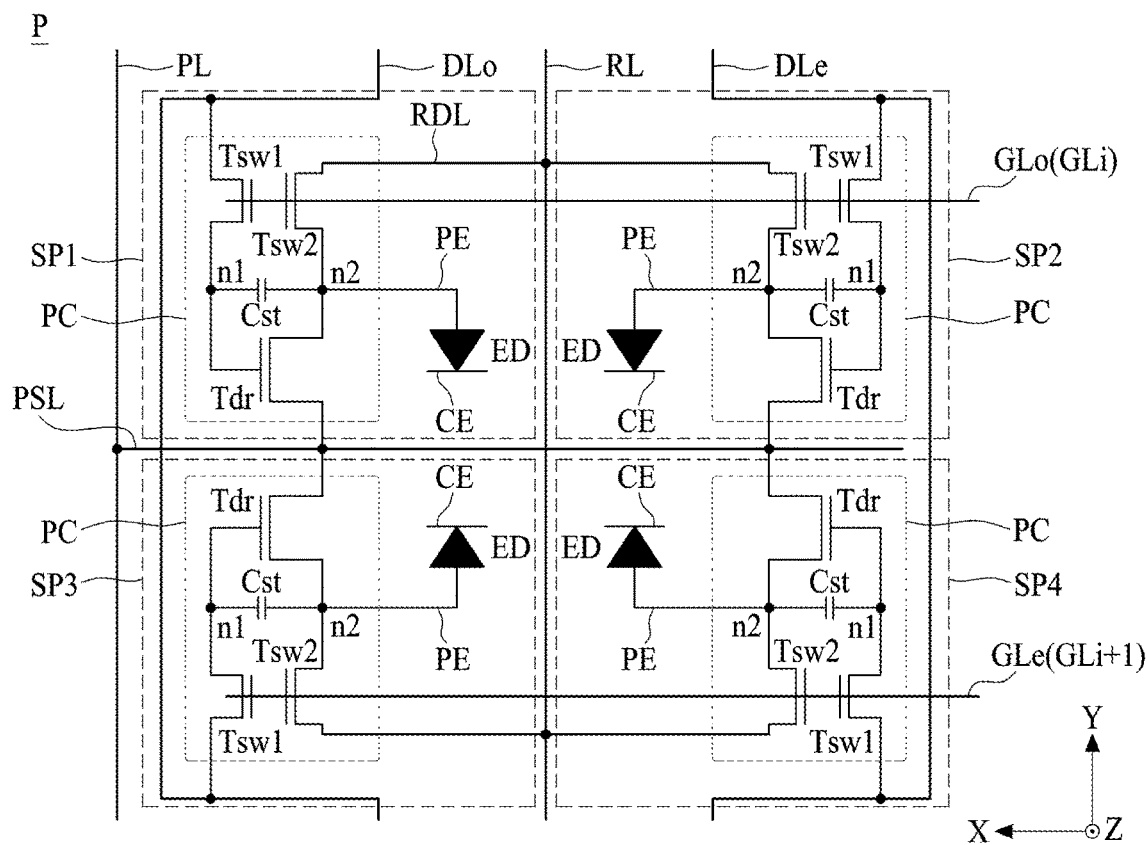
FIG. 22 is a circuit diagram illustrating one pixel illustrated in FIGS. 15 and 19.

FIG. 21 is an enlarged view of a region 'B4' illustrated in FIG. 19, and FIG. 22 is a circuit diagram illustrating one pixel illustrated in FIGS. 15 and 19. FIGS. 21 and 22 are diagrams for describing a plurality of pixels disposed on a first substrate.

Referring to FIGS. 19, 21, and 22, a first substrate 100 according to an embodiment of the present disclosure may include a plurality of data lines DL, a plurality of gate lines GL, a plurality of pixel driving power lines PL, a plurality of pixel common voltage lines CVL, a plurality of pixels P, a common electrode CE, a plurality of common electrode contact portions CECP, a first pad part 110, a device isolation portion 15, and a dam pattern portion 17.

The plurality of data lines DL may extend long in a second direction Y and may be disposed spaced apart from one another by a predetermined or selected interval in a display area AA of the first substrate 100 along the first direction X. For example, in the plurality of data lines DL, an odd-numbered data line DLo may be disposed at a first edge portion of each of a plurality of pixel areas PA arranged at the first substrate 100 along the second direction Y, and an even-numbered data line DLe may be disposed at a second edge portion of each of the plurality of pixel areas PA arranged at the first substrate 100 along the second direction Y.

The plurality of gate lines GL may extend long in the first direction X and may be disposed spaced apart from one another by a predetermined or selected interval in the display area AA of the first substrate 100 along the second direction Y. For example, an odd-numbered gate line GLo among the plurality of gate lines GL may be disposed at a third edge portion of each of the plurality of pixel areas PA arranged on the first substrate 100 along the first direction X. An even-numbered gate line GLe among the plurality of gate lines GL may be disposed at a fourth edge portion of each of the plurality of pixel areas PA arranged on the first substrate 100 along the first direction X.

The plurality of pixel driving power lines PL may extend long in the second direction Y and may be disposed spaced apart from one another by a predetermined or selected interval in the display area AA of the first substrate 100 along the first direction X. For example, in the plurality of pixel driving power lines PL, an odd-numbered pixel driving power line PL may be disposed at a first edge portion of an odd-numbered pixel area PA with respect to the first direction X, and an even-numbered pixel driving power line PL may be disposed at a second edge portion of an even-numbered pixel area PA with respect to the first direction X.

Two adjacent pixel driving power lines PL among the plurality of pixel driving power lines PL may be coupled to a plurality of power sharing lines PSL disposed in each of pixel areas PA arranged in the second direction Y. For example, the plurality of pixel driving power lines PL may be electrically coupled to one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be prevented, reduced or minimized. Accordingly, the light emitting display apparatus according to the present disclosure may prevent, reduce or minimize the degradation in image quality caused by a deviation of the pixel driving power supplied to each of the pixels P.

Each of the plurality of power sharing lines PSL may branch from an adjacent pixel driving power line PL in parallel with the first direction X and may be disposed in a middle region of each pixel area PA.

The plurality of pixel common voltage lines CVL may extend long in the second direction Y and may be disposed spaced apart from one another by a predetermined or selected interval in the display area AA of the first substrate 100 along the first direction X. For example, each of the plurality of pixel common voltage lines CVL may be disposed at a first edge portion of an even-numbered pixel area PA with respect to the first direction X.

The plurality of reference voltage lines RL may extend long in the second direction Y and may be disposed spaced apart from one another by a predetermined or selected interval in the display area AA of the first substrate 100 in the first direction X. Each of the plurality of reference voltage lines RL may be disposed in a center region of each of the pixel areas PA arranged in the second direction Y.

Each of the plurality of reference voltage lines RL may be shared by two adjacent subpixels ((SP1, SP2) (SP3, SP4)) in the first direction X in each pixel area PA. To this end, each of the plurality of reference voltage lines RL may include a reference branch line RDL. The reference branch line RDL may branch (or protrude) to the two adjacent subpixels ((SP1, SP2) (SP3, SP4)) in the first direction X in each pixel area PA and may be electrically coupled to the two adjacent subpixels ((SP1, SP2) (SP3, SP4)).

The plurality of pixels P may be respectively disposed in the plurality of pixel areas PA which is defined to have an equal size in the display area AA of the substrate 100.

Each of the plurality of pixels P may include at least three subpixels. For example, each of the plurality of pixels P may include first to fourth subpixels SP1 to SP4.

Each of the first to fourth subpixels SP1 to SP4 may include a pixel circuit PC and a light emitting device ED.

The pixel circuit PC according to an embodiment may be disposed in a circuit area of the pixel area PA and may be coupled to gate lines GLo and GLe adjacent thereto, data lines DLo and DLe adjacent thereto, and the pixel driving power line PL. For example, a pixel circuit PC disposed in a first subpixel SP1 may be coupled to an odd-numbered data line DLo and an odd-numbered gate line GLo, a pixel circuit PC disposed in a second subpixel SP2 may be coupled to an even-numbered data line DLe and an odd-numbered gate line GLo, a pixel circuit PC disposed in a third subpixel SP3 may be coupled to an odd-numbered data line DLo and an even-numbered gate line GLe, and a pixel circuit PC disposed in a fourth subpixel SP4 may be coupled to an even-numbered data line DLe and an even-numbered gate line GLe.

The pixel circuit PC of each of the first to fourth subpixels SP1 to SP4 may sample a data signal supplied from corresponding data lines DLo and DLe in response to a scan signal supplied from corresponding gate lines GLo and GLe and may control a current flowing from the pixel driving power line PL to the light emitting device ED based on a sampled data signal.

The pixel circuit PC according to an embodiment may sample a data signal by three TFTs Tsw1, Tsw2, and Tdr and one capacitor Cst illustrated in FIG. 2, and may control a current flowing in the light emitting device ED based on a sampled data signal. Except for that the first switching TFT Tsw1 and the second switching TFT Tsw2 in the pixel circuit PC are simultaneously turn on or off in response to one scan signal supplied from corresponding gate lines GLo and Gle, the pixel circuit PC may be substantially the same as the pixel circuit PC described above with reference to FIG. 2, and thus, its repetitive description is omitted or may be brief.

The pixel circuit PC of each of the first to fourth subpixels SP1 to SP4 according to another embodiment may be implemented as a pixel driving chip through a semiconductor manufacturing process, disposed in a circuit area of a corresponding pixel area PA, and coupled to gate lines GLo and GLe adjacent thereto, data lines DLo and DLe adjacent thereto, and the pixel driving power line PL. For example, the pixel driving chip may be a minimum-unit microchip or one chipset and may be a semiconductor packaging device which includes two or more transistors and one or more capacitors and has a fine size. Such a pixel driving chip may sample a data signal supplied from corresponding data lines DLo and DLe in response to a scan signal supplied from corresponding gate lines GLo and GLe and may control a current flowing from the pixel driving power line PL to the light emitting device ED based on a sampled data signal.

The light emitting device ED may be disposed in an emission area EA of the pixel area PA, electrically coupled to the pixel circuit PC, and electrically coupled to the common electrode CE. The light emitting device ED may emit light with a current flowing from the pixel circuit PC to the common electrode CE. The light emitting device ED may be substantially the same as the light emitting device ED illustrated in FIG. 2, and thus, its repetitive description is omitted or may be brief.

The common electrode CE may be disposed in a display area AA of the first substrate 100 and may be electrically coupled to the light emitting device ED of each of the plurality of pixels P. For example, the common electrode CE may be disposed in a region, other than a first pad part 110 disposed in the first substrate 100, of the display area AA of the first substrate 100.

Each of the plurality of common electrode contact portions CECP may electrically couple the common electrode CE to a corresponding pixel common voltage line CVL of the plurality of pixel common voltage lines CVL in between two adjacent pixels P of the plurality of pixels P overlapping each of the plurality of pixel common voltage lines CVL. With respect to the second direction Y, each of the plurality of common electrode contact portions CECP according to an embodiment may be electrically coupled to a corresponding pixel common voltage line CVL of the plurality of pixel common voltage lines CVL at a portion between the plurality of pixels P or at a boundary portion between the plurality of pixels P and may be electrically coupled to a portion of the common electrode CE, and thus, may electrically couple the common electrode CE to a corresponding pixel common voltage line CVL of the plurality of pixel common voltage lines CVL.

Each of the plurality of common electrode contact portions CECP may be disposed between at least two adjacent pixels P among the plurality of pixels P to electrically couple the common electrode CE to each of the plurality of pixel common voltage lines CVL, and thus, may prevent, reduce or minimize the voltage drop (IR drop) of the pixel common power caused by a surface resistance of the common electrode CE. Accordingly, the light emitting display apparatus according to the present disclosure may prevent, reduce or minimize the degradation in image quality caused by a deviation of the pixel driving power supplied to each of the pixels P arranged in the display area AA.

According to an embodiment, each of the plurality of common electrode contact portions CECP may be formed together with a pixel electrode PE having a two-layer structure so as to be electrically coupled to each of the plurality of pixel common voltage lines CVL. Each of the plurality of common electrode contact portions CECP may be coupled to the common electrode CE through a side contact structure having a "("-shaped cross-sectional structure or a "<"-shaped cross-sectional structure. For example, when each of the plurality of common electrode contact portions CECP is formed of first and second metal layers, each of the plurality of common electrode contact portions CECP may include a side contact structure corresponding to an undercut structure or a tapered structure formed on the lateral surface of the first metal layer by an etching speed difference between the first metal layer and the second metal layer. For example, when each of the plurality of common electrode contact portions CECP is formed of first to three metal layers, each of the plurality of common electrode contact portions CECP may include a side contact structure corresponding to an undercut structure or a tapered structure formed on the lateral surface of the second metal layer by an etching speed difference between the second metal layer and the third metal layer.

The first pad part 110 may be disposed at a first edge portion among the first surface of the first substrate 100 parallel to the first direction X. The first pad part 110 may be disposed at a third edge portion of each of outermost pixel areas PAo disposed at the first edge portion of the first substrate 100. With respect to the second direction Y, an end of the first pad part 110 may overlap or may be aligned with an end of each of the outermost pixel areas PAo. Therefore, the first pad part 110 may be included (or disposed) in each of the outermost pixel areas PAo disposed at the first edge portion of the first substrate 100, and thus, a non-display area (or a bezel area) based on the first pad part 110 may not be formed or may not be on in the first substrate 100.

The first pad part 110 may include a plurality of first pads which are disposed in parallel with one another in the first direction X at the first edge portion of the first substrate 100.

The first pad part 110 according to an embodiment may include a plurality of pad groups PG. Two or more pad groups PG among the plurality of pad groups PG may include at least one data pad DP and at least one gate pad GP. For example, the first pad part 110 according to an embodiment may include a plurality of pad groups PG which are arranged in the order of a pixel driving voltage pad PVP, a data pad DP, a reference voltage pad RVP, a data pad DP, a gate pad GP, a pixel common voltage pad CVP, a data pad DP, a reference voltage pad RVP, a data pad DP, and a pixel driving voltage pad PVP along the first direction X.

Each of the plurality of pad groups PG may be coupled to two adjacent pixels P disposed along the first direction X. For example, the plurality of pad groups PG may include a first pad group PG1 including a pixel driving voltage pad PVP, a data pad DP, a reference voltage pad RVP, a data pad DP, and a gate pad GP continuously disposed in an odd-numbered pixel area PA along the first direction X, and a second pad group PG2 including a pixel common voltage pad CVP, a data pad DP, a reference voltage pad RVP, a data pad DP, and a pixel driving voltage pad PVP continuously disposed in an even-numbered pixel area PA along the first direction X.

The first substrate 100 according to the present disclosure may further include a plurality of secondary power lines SPL and a plurality of secondary power contact portions SPCP.

Each of the plurality of secondary power lines SPL may extend long in the second direction Y and may be disposed adjacent to a corresponding pixel common voltage line CVL of the plurality of pixel common voltage lines CVL. Each of the plurality of secondary power lines SPL may be electrically coupled to an adjacent pixel common voltage line CVL without being electrically coupled to the pixel common voltage pad CVP and may be supplied with a pixel common power through the adjacent pixel common voltage line CVL. To this end, the first substrate 100 according to the present disclosure may further include a plurality of line connection patterns LCP which electrically couple a pixel common voltage line CVL and a secondary power line SPL adjacent to each other.

Each of the plurality of line connection patterns LCP may be disposed on the first substrate 100 to overlap a pixel common voltage line CVL and a secondary power line SPL adjacent to each other and may electrically couple a pixel common voltage line CVL and a secondary power line SPL adjacent to each other by a line jumping structure. For example, one side of each of the plurality of line connection patterns LCP may be electrically coupled to a portion of the secondary power line SPL through a first line contact hole formed in an insulation layer on the secondary power line SPL, and the other side of each of the plurality of line connection patterns LCP may be electrically coupled to a portion of the pixel common voltage line CVL through a second line contact hole formed in an insulation layer on the pixel common voltage line CVL.

Each of the plurality of secondary power contact portions SPCP may electrically couple the common electrode CE to each of the plurality of secondary power lines SPL in between the plurality of pixels P overlapping each of the plurality of secondary power lines SPL. With respect to the second direction Y, each of the plurality of secondary power contact portions SPCP according to an embodiment may be electrically coupled to each of the plurality of secondary power lines SPL at a portion between the plurality of pixels P or a boundary portion between the plurality of pixels P and may be electrically coupled to a portion of the common electrode CE, and thus, may electrically couple the common electrode CE to each of the plurality of secondary power lines SPL. Therefore, the common electrode CE may be additionally coupled to each of the plurality of secondary power lines SPL through the secondary power contact portions SPCP. Accordingly, the light emitting display apparatus according to an embodiment of the present disclosure may prevent, reduce or minimize the degradation in image quality caused by a deviation of the pixel common power supplied to each of the pixels P arranged in the display area AA. Also, in the light emitting display apparatus according to the present disclosure, although the pixel common voltage pad CVP coupled to each of the plurality of secondary power lines SPL is not additionally disposed (or formed), the pixel common power may be supplied to the common electrode CE in each of the plurality of pixel areas PA. Each of the plurality of secondary power contact portions SPCP may electrically couple a corresponding secondary power line of the plurality of secondary power lines SPL to the common electrode CE through a side contact structure having a side contact structure having a "(''-shaped cross-sectional structure or a ")''-shaped cross-sectional structure, like each of the plurality of common electrode contact portions CECP.

The device isolation portion 15 may be disposed in a second region surrounding the first region of the first substrate 100. For example, the second region of the first substrate 100 may be an edge portion of the first substrate 100 or an edge portion of the outermost pixel Po. The first region of the first substrate 100 may be a remaining portion other than the second region. The device separation portion 15 may be implemented to prevent lateral penetration of water or moisture in the lateral direction of the light emitting display panel to prevent, reduce or minimize a degradation of the light emitting device ED due to the lateral water penetration. The device isolation portion 15 may be implemented inside the outermost pixel Po disposed along the edge portion of the first substrate 100. For example, the device isolation portion 15 may include at least two isolation patterns disposed between the outer surface OS of the first substrate 100 and the emission area of the outermost pixel Po. Except that the device isolation portion 15 is configured to be disposed inside the outermost pixel Po disposed along one edge portion of the first substrate 100, the device isolation portion 15 may be substantially the same as the device isolation portion 15 illustrated in FIGS. 1 to 14, and thus, like reference numerals refer to like elements and their repetitive descriptions are omitted or will be briefly given.

The dam pattern portion 17 may be disposed inside the device isolation portion 15. For example, the dam pattern portion 17 may be disposed between two adjacent isolation patterns among the at least two or more device isolation patterns 15a, 15b, 15c, and 15d. For example, the dam pattern portion 17 may be implemented in a closed loop line form to surround the first device isolation pattern 15a, and may be implemented to be surrounded by the second to fourth device isolation patterns 15b, 15c, and 15d. For example, the dam pattern portion 17 may be disposed between the first device isolation pattern 15a and the second device isolation pattern 15b of the device isolation portion 15.

The dam pattern portion 17 may include a structure (or structure element) to prevent the metal pattern layer for the eaves structure from being lost (or removed) when the device isolation portion 15 is formed (or manufactured). Except that the dam pattern portion 17 is configured to be disposed inside the outermost pixel Po disposed along one edge portion of the first substrate 100, the dam pattern portion 17 may be substantially the same as the dam pattern portion 17 illustrated in FIGS. 1 to 14, and thus, like reference numerals refer to like elements and their repetitive descriptions are omitted or will be briefly given.

Figure 23:
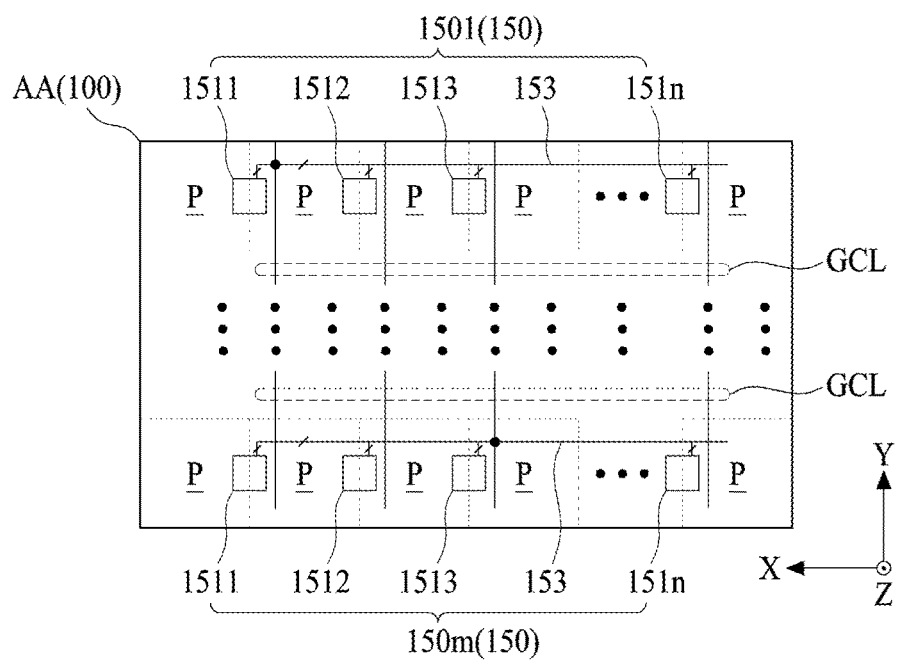
FIG. 23 is a diagram illustrating a gate driving circuit disposed in a display area illustrated in FIGS. 19 and 21.

FIG. 23 is a diagram illustrating a gate driving circuit disposed in a display area illustrated in FIGS. 19 and 21.

Referring to FIGS. 19, 21, and 23, a gate driving circuit 150 according to an embodiment of the present disclosure may be disposed in a display area AA of a first substrate 100 and may be coupled to a gate control line group GCL disposed in the display area AA of the first substrate 100.

First, the gate control line group GCL may include a plurality of gate control lines coupled to the gate driving circuit 150 in the display area AA of the first substrate 100. The gate control line group GCL according to an embodiment may include a start signal line, a plurality of shift clock lines, at least one gate driving voltage line, and at least one gate common voltage line. Each of the lines of the gate control line group GCL may extend long in the second direction Y and may be disposed spaced apart from one another by a predetermined or selected interval in the display area AA of the first substrate 100 in the first direction X. For example, each of the lines of the gate control line group GCL may be disposed between at least one or more pixels P in the first direction X.

A gate driving circuit 150 according to an embodiment may be implemented with a shift register including a plurality of stage circuit portions 1501 to 150m.

Each of the plurality of stage circuit portions 1501 to 150m may be individually disposed at each horizontal line of a first surface 100a of the first substrate 100 in the first direction X and may be dependently coupled to one another in the second direction Y. Each of the plurality of stage circuit portions 1501 to 150m may generate a scan signal in a predetermined or selected order in response to a gate control signal supplied through the first pad part 110 and the gate control line group GCL and may supply the scan signal to a corresponding gate line GL.

Each of the plurality of stage circuit portions 1501 to 150m according to an embodiment may include a plurality of branch circuits 1511 to 151n and a branch network 153.

Each of the plurality of branch circuits 1511 to 151n may be selectively coupled to the lines of the gate control line group GCL through the branch network 153 and may be electrically coupled to one another through the branch network 153. Each of the plurality of branch circuits 1511 to 151n may generate the scan signal based on a gate control signal supplied through each of lines of the gate control line group GCL, and may supply the scan signal to a corresponding gate line GL.

Each of the plurality of branch circuits 1511 to 151n may include at least one TFT among a plurality of TFTs configuring each of the stage circuit portions 1501 to 150m. Any one of the plurality of branch circuits 1511 to 151n may include a pull-up TFT coupled to the gate line GL. Another one of the plurality of branch circuits 1511 to 151n may include a pull-down TFT coupled to the gate line GL.

Each of the plurality of branch circuits 1511 to 151n according to an embodiment may be disposed in a circuit area between two adjacent pixels P or in a circuit area between two pixels P, in each horizontal line of the first substrate 100, but embodiments of the present disclosure are not limited thereto. For example, each of the plurality of branch circuits 1511 to 151n may be disposed in a circuit area between at least one or more adjacent pixels P based on the number of TFTs configuring one stage circuit portion and the number of pixels P disposed in one horizontal line.

The branch network 153 may be disposed in each horizontal line of the first substrate 100 and may electrically couple the plurality of branch circuits 1511 to 151n to each other. The branch network 153 according to an embodiment may include a plurality of control nodes and a network line.

The plurality of control nodes may be disposed in each horizontal line of the first substrate 100 and may be selectively coupled to the plurality of branch circuits 1511 to 151n in one horizontal line. For example, the plurality of control nodes may be disposed in an upper edge region (or a lower edge region) among pixel areas arranged in each horizontal line of the first substrate 100.

The network line may be selectively coupled to the lines of the gate control line group GCL disposed in the first substrate 100 and may be selectively coupled to the plurality of branch circuits 1511 to 151n. For example, the network line may transfer the gate control signal, supplied through the lines of the gate control line group GCL, to corresponding branch circuits 1511 to 151n and may transfer a signal between the plurality of branch circuits 1511 to 151n.

As described above, according to the present embodiment, because the gate driving circuit 150 is disposed in the display area AA of the first substrate 100, a second interval D2 between a center portion of the outermost pixel area PAo and each of the outer surfaces OS of the first substrate may be equal to or less than half of a first interval (or a pixel pitch) D1 between adjacent pixel areas PA. For example, when the gate driving circuit 150 is not disposed in the display area AA of the substrate 10 and is disposed at an edge portion of the first substrate 100 as illustrated in FIG. 1, the second interval D2 may not be equal to or less than half of the first interval D1. Accordingly, in the light emitting display apparatus according to another embodiment of the present disclosure, the gate driving circuit 150 may be disposed in the display area AA of the first substrate 100, and thus, the second interval D2 may be implemented to be equal to or less than half of the first interval D1.

Figure 24:
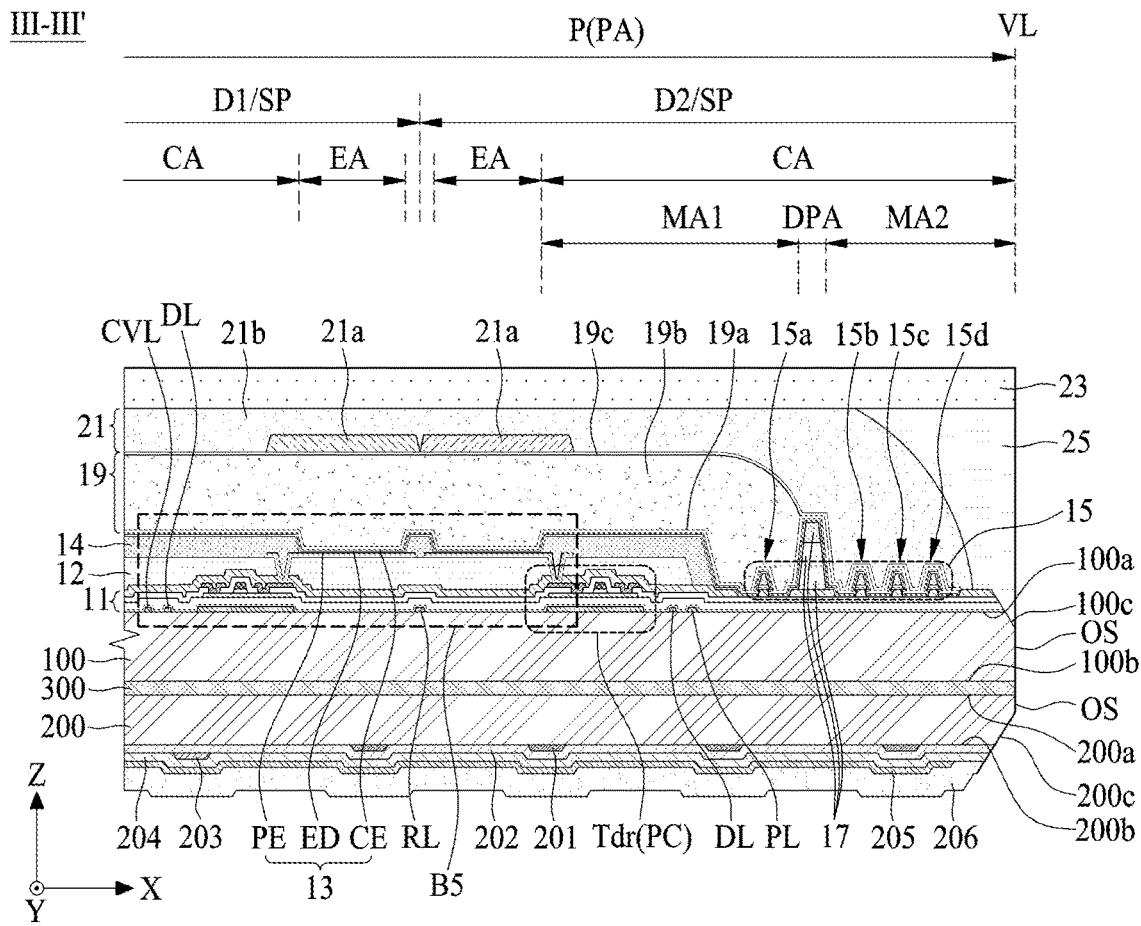
FIG. 24 is a cross-sectional view taken along line illustrated in FIG. 19.
Figure 25:
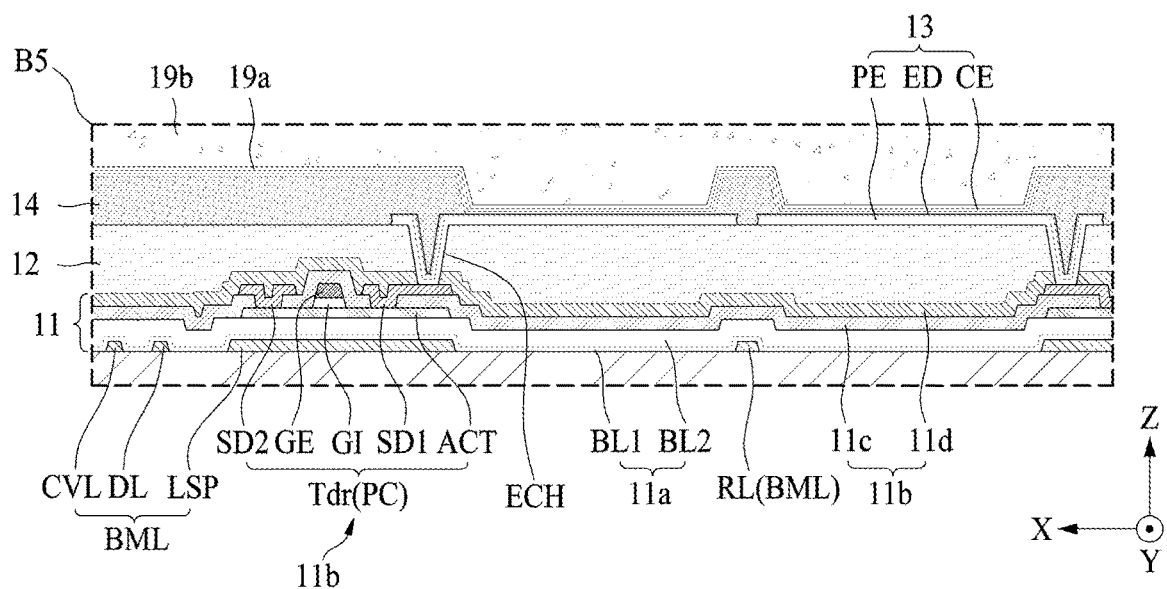
FIG. 25 is an enlarged view of a region 'B5' illustrated in FIG. 24.

FIG. 24 is a cross-sectional view taken along line illustrated in FIG. 19, and FIG. 25 is an enlarged view of a region 'B5' illustrated in FIG. 24. In describing the FIGS. 24 and 25, elements which are the same as or correspond to the elements of FIG. 19 are referred to by like reference numerals, and their repetitive descriptions are omitted or will be briefly given.

Referring to FIGS. 19, 24, and 25, a light emitting display apparatus according to another embodiment of the present disclosure may include a first substrate 100 and a second substrate 200 which are coupled (or bonded) to each other by a coupling member 300. In describing the first substrate 100 and the second substrate 200, elements which are the same as or correspond to the elements of FIG. 19 are referred to by like reference numerals, and their repetitive descriptions are omitted or will be briefly given below.

The first substrate 100 according to an embodiment may include a display portion AA.

The display portion AA may include a circuit layer 11, a planarization layer 12, a light emitting device layer 13, a bank 14, a device isolation portion 15, a dam pattern portion 17, an encapsulation layer 19, a wavelength conversion layer 21, a functional film 23, and a side sealing member 25. Except for an arrangement structure of a pixel circuit PC and a light emitting device ED of a pixel P, and a device isolation portion 15 and a dam pattern portion 17 disposed inside (or within) an outermost pixels Po of the first substrate 100, the elements disposed in the display portion AA are substantially the same as the elements disposed at the substrate 10 illustrated in FIGS. 3 to 14. In the following description, and thus, like reference numerals refer to like elements and their repetitive descriptions are omitted or will be briefly given.

The circuit layer 11 may be disposed on a first surface 100a of the first substrate 100. The circuit layer 11 may be referred to as a pixel array layer or a TFT array layer. The circuit layer 11 according to an embodiment may include a lower metal layer BML, a buffer layer 11a, and a circuit array layer 11b.

The lower metal layer BML may be used as a pixel driving line which is disposed in a second direction Y on the first surface 100a of the first substrate 100. For example, the lower metal layer BML may be formed on the first surface 10a of the first substrate 100, and then, may be patterned as a plurality of data lines DL, a plurality of pixel driving power lines PL, a plurality of pixel common voltage lines CVL, a plurality of reference voltage lines RL, a light blocking pattern LSP, and the gate control line group GCL by a patterning process.

The buffer layer 11a may be disposed on the first surface 100a of the first substrate 100 to cover the lower metal layer BML. The buffer layer 11a may include a first buffer layer BL1 covering the lower metal layer BML and a second buffer layer BL2 covering the first buffer layer BL1.

The circuit array layer 11b may include a pixel circuit PC including a driving TFT Tdr disposed in each of a plurality of pixel areas PA over the buffer layer 11a.

The driving TFT Tdr disposed in each of the plurality of pixel areas PA may include an active layer ACT, a gate insulation layer GI, a gate electrode GE, an interlayer insulation layer 11c, a first electrode (source/drain) SD1, a second electrode (source/drain) SD2, and a passivation layer 11d. Each of first and second switching TFTs Tsw1 and Tsw2 configuring the pixel circuit PC may be formed together with the driving TFT Tdr, and thus, their detailed descriptions are omitted or may be brief.

A source/drain metal layer implementing the source/drain electrodes SD1 and SD2 may be used as a pixel driving line which is disposed in a first direction X. For example, the source/drain metal layer may be formed over the first surface 100a of the first substrate 100, and then, may be patterned as a gate line GL, a network line and a plurality of control nodes of a branch network 153, a plurality of power sharing lines PSL, a plurality of line connection patterns LCP, and a reference branch line RDL through a patterning process.

The light emitting device layer 13 may be disposed over the planarization layer 12 and may emit light toward an upper side of the first surface 100a of the first substrate 100 based on a top emission type.

The light emitting device layer 13 according to an embodiment may include a pixel electrode PE, a light emitting device ED, and a common electrode CE.

The pixel electrode PE may be disposed over the planarization layer 12 overlapping an emission area EA of each of the plurality of pixel areas PA. The pixel electrode PE may be patterned and disposed in an island shape in each pixel area PA and may be electrically coupled to the first electrode (source/drain) SD1 of the driving TFT Tdr of a corresponding pixel circuit PC. One side of the pixel electrode PE may extend onto the first electrode (source/drain) SD1 of the driving TFT Tdr in the circuit areaCA of the pixel area PA and may be electrically coupled to the first electrode (source/drain) SD1 of the driving TFT Tdr through an electrode contact hole ECH provided in the planarization layer 12.

A metal layer (or a pixel electrode layer) implementing the pixel electrode PE may be used as pads PVP, DP, RVP, DP, GP, and CVP of a first pad part 110. For example, the metal layer implementing the pixel electrode PE may be formed over the first surface 100a of the first substrate 100, and then, may be patterned as the pads PVP, DP, RVP, DP, GP, and CVP of the first pad part 110 through a patterning process.

The light emitting device ED may be formed over the pixel electrode PE and may directly contact the pixel electrode PE. The light emitting device ED may be a common layer which is formed in common in each of a plurality of subpixels SP so as not to be distinguished by subpixel SP units. The light emitting device ED may react on a current flowing between the pixel electrode PE and the common electrode CE to emit white light (or blue light).

The common electrode CE may be formed over the light emitting device ED and may directly contact the light emitting device ED or may electrically and directly contact the light emitting device ED. The common electrode CE may include a transparent conductive material which transmits light emitted from the light emitting device ED.

The bank 14 may be disposed over the planarization layer 12 to cover an edge portion of the pixel electrode PE. The bank 14 may define an emission area EA (or an opening portion) of the subpixel SP and may electrically isolate pixel electrodes PE disposed in adjacent subpixel SP. The bank 14 may be formed to cover an electrode contact hole ECH provided in the subpixel SP. The bank 104 may be covered by the light emitting device ED.

The first substrate 100 according to an embodiment may further include a first margin area MA1, a second margin area MA2, and a dam pattern area DPA. For example, the first margin area MA1, the second margin area MA2, and the dam pattern area DPA may be a second region surrounding a first region of the first substrate 100.

The first margin area MA1 may be disposed between an emission area EA of the outermost pixel Po and the dam pattern area DPA. The first margin area MA1 may have a first width between an end of the emission area EA (or the bank 14) of the outermost pixel Po and the dam pattern area DPA based on a shadow area (or a tail portion) of the light emitting device ED inevitably occurring in a process of forming the light emitting device ED.

The second margin area MA2 may be disposed between the outer surface OS of the first substrate 100 and the dam pattern area DPA. The second margin area MA2 may have a second width between the outer surface OS of the first substrate 100 and the dam pattern area DPA based on the reliability margin of the light emitting device ED against water. The second margin area MA2 according to an embodiment may include a pad margin area overlapping the first pad part 110 disposed at a first edge portion among the first surface 100a of the first substrate 100.

The dam pattern area DPA may be disposed between the first margin area MA1 and the second margin area MA2. The dam pattern area DPA may have a third width corresponding to a width between the first margin area MA1 and the second margin area MA2.

A width of each of the first margin area MA1, the second margin area MA2, and the dam pattern area DPA may be implemented so that a second interval D2 between a center portion of the outermost pixel Po and the outer surface OS of the first substrate 100 is half or less of a first interval (or a pixel pitch) D1 between two adjacent pixel areas PA, with respect to the first direction X.

The device isolation portion 15 may be disposed in each of the first margin area MA1 and the second margin area MA2 defined in the outermost pixel Po. The device isolation portion 15 according to an embodiment includes at least one device isolation pattern 15a disposed in the first margin area MA1 and at least one device isolation patterns 15b, 15c, and 15d disposed in the second margin area MA2. For example, the device isolation portion 15 according to an embodiment includes a first device isolation pattern 15a disposed in the first margin area MA1, and second to fourth device isolation patterns 15b, 15c, and 15d disposed in the second margin area MA2. Except that the device isolation portion 15 is implemented in each of the first margin area MA1 and the second margin area MA2 defined in the outermost pixel Po, the device isolation portion 15 is substantially the same as the device isolation portion 15 illustrated in FIGS. 1 to 14, and thus, like reference numerals refer to like elements and their repetitive descriptions are omitted or will be briefly given.

The dam pattern portion 17 may be disposed to have a closed loop line shape in the dam pattern area DPA between the first margin area MA1 and the second margin area MA2. The dam pattern portion 17 may be implemented to be spaced apart from the end of the emission area EA by the first width of the first margin area MA1 with respect to the first direction X. Moreover, the dam pattern portion 17 may be implemented to be spaced apart from the outer surface OS of the first substrate 100 by the second width of the second margin area MA2 with respect to the first direction X. The dam pattern portion 17 may include a structure (or structure element) to prevent the metal pattern layer for the eaves structure from being lost (or removed) when the device isolation portion 15 is formed (or manufactured). Except that the dam pattern portion 17 is configured to be disposed inside the outermost pixel Po disposed along one edge portion of the first substrate 100, the dam pattern portion 17 may be substantially the same as the dam pattern portion 17 illustrated in FIGS. 1 to 14, and thus, like reference numerals refer to like elements and their repetitive descriptions are omitted or will be briefly given.

The encapsulation layer 19 may be disposed over a remaining portion except for an outermost edge portion of the first surface 100a of the first substrate 100 to cover the light emitting device layer 13. For example, the encapsulation layer 19 may be implemented to surround all of a front surface and lateral surfaces of the light emitting device layer 13. The encapsulation layer 19 according to an embodiment may include first to third encapsulation layers 19a, 19b, and 19c. The first to third encapsulation layers 19a, 19b, and 19c may be substantially the same as the first to third encapsulation layers 19a, 19b, and 19c of the encapsulation layer 19 illustrated in FIGS. 3 to 14, and thus, like reference numerals refer to like elements and their repetitive descriptions are omitted or will be briefly given.

The wavelength conversion layer 21 may convert a wavelength of light incident from the emission area EA of the subpixel SP. For example, the wavelength conversion layer 21 may convert white light (or blue light), which is incident from the emission area EA, into colored light corresponding to a corresponding subpixel SP. The wavelength conversion layer 21 according to an embodiment may include a plurality of wavelength conversion patterns 21a and a protection layer 21b. The wavelength conversion layer 21 may be substantially the same as the wavelength conversion layer 21 illustrated in FIGS. 3 to 14, and thus, like reference numerals refer to like elements and their repetitive descriptions are omitted or will be briefly given.

The functional film 23 may be disposed over the wavelength conversion layer 21. For example, the functional film 23 may be coupled to the wavelength conversion layer 21 by a transparent adhesive member. The functional film 23 according to an embodiment may further include at least one or more among an anti-reflection layer (or an anti-reflection film), a barrier layer (or a barrier film), and a light path control layer (or a light path control film) described above.

The side sealing member 25 may be formed between the first substrate 100 and the functional film 23 and may cover all of side (or lateral) surfaces of each of the circuit layer 11 and the wavelength conversion layer 21. For example, the side sealing member 25 may cover all of side surfaces of each of the circuit layer 11 and the wavelength conversion layer 21 which are exposed at the outside of the light emitting display apparatus, between the functional film 23 and the first substrate 100. Also, the side sealing member 25 may cover a first chamfer 100c which is formed (or disposed) at a corner portion between the first surface 100a and the outer surface OS of the first substrate 100 through a chamber process. For example, each of the outermost outer surface of the first substrate 100, an outer surface of the side sealing member 25, and an outer surface of the functional film 23 may be positioned (or aligned) at the same vertical line VL.

Figure 26:
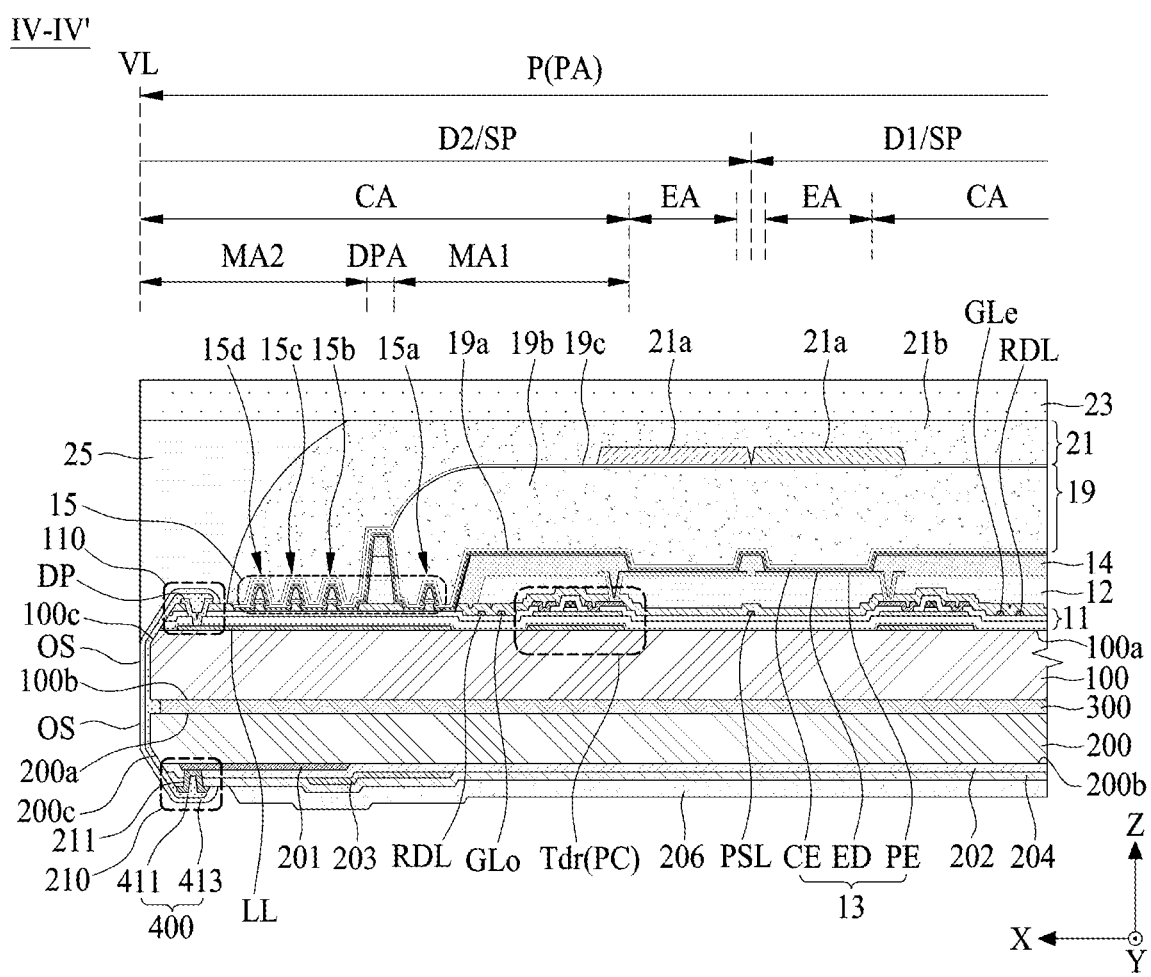
FIG. 26 is a cross-sectional view taken along line IV-IV' illustrated in FIG. 19.

Referring to FIGS. 20, 24, and 26, the second substrate 200 according to an embodiment may include a metal pattern layer coupled to the routing portion 400, and an insulation layer which insulates the metal pattern layer.

The metal pattern layer (or a conductive pattern layer) may include a plurality of metal layers. The metal pattern layer according to an embodiment may include a first metal layer 201, a second metal layer 203, and a third metal layer 205. The insulation layer may include a plurality of insulation layers. For example, the insulation layer may include a first insulation layer 202, a second insulation layer 204, and a third insulation layer 206. The insulation layer may be referred to as a rear insulation layer or a pattern insulation layer.

The first metal layer 201, the second metal layer 203, and the third metal layer 205 may be used as pads of the second pad part 210, pads of the third pad part 230, and link lines of the link line portion 250, which are disposed at the rear surface 200b of the second substrate 200. For example, the first metal layer 201 may be used as some link lines of the plurality of link lines, and the third metal layer 205 may be used as pads and the other link lines of the plurality of link lines. The second metal layer 203 may be used as a jumping line (or a bridge line) for electrically connecting link lines disposed on different layers.

The first insulation layer 202 may be implemented over the rear surface 200b of the second substrate 200 to cover the first metal layer 201. The second insulation layer 204 may be implemented over the first insulation layer 202 to cover the second metal layer 203. The third insulation layer 206 may be implemented over the second insulation layer 204 to cover the third metal layer 205.

The coupling member 300 may be disposed between the first substrate 100 and the second substrate 200. Therefore, the first substrate 100 and the second substrate 200 may be opposite-bonded to each other by a coupling member 300. The coupling member 300 according to an embodiment may be a transparent adhesive member or a double-sided tape including an OCA or an OCR. According to another embodiment, the coupling member 300 may include a glass fiber.

The coupling member 300 according to an embodiment may be disposed in a whole space between the first substrate 100 and the second substrate 200. For example, all of the second surface 100b of the first substrate 100 may be coupled to all of one surface of the coupling member 300, and all of a front surface 200a of the second substrate 200 may be coupled to all the other surface of the coupling member 300.

The coupling member 300 according to another embodiment may be disposed in a pattern structure between the first substrate 100 and the second substrate 200. For example, the coupling member 300 may have a line pattern structure or a mesh pattern structure. The mesh pattern structure may further include a bent portion which discharges an air bubble, occurring between the first substrate 100 and the second substrate 200 in a process of bonding the first substrate 100 to the second substrate 200, to the outside.

FIG. 26 is a cross-sectional view taken along line IV-IV' illustrated in FIG. 19 and is a diagram for describing a cross-sectional structure of a first pad part, a second pad part, and a routing portion of a light emitting display apparatus according to another embodiment of the present disclosure. In describing FIG. 26, elements which are the same or correspond to the elements of FIG. 19 are referred to by like reference numerals, and their repetitive descriptions are omitted or will be briefly described below.

Referring to FIGS. 19 to 21, and 26, in a light emitting display apparatus according to another embodiment of the present disclosure, a first pad part 110 may include a plurality of pads PVP, DP, RVP, GP, and CVP disposed at a first edge portion among a first surface 100a of a first substrate 100. For example, each of the pads PVP, DP, RVP, GP, and CVP of the first pad part 110 may be electrically coupled to a corresponding line through a pad contact hole. For example, each of a plurality of pixel common voltage pads CVP disposed in the first pad part 110 may be individually coupled to a corresponding pixel common voltage line CVL of a plurality of pixel common voltage lines CVL through a pad contact hole.

In the light emitting display apparatus according to another embodiment of the present disclosure, a second pad part 210 may include a plurality of second pads 211 which are disposed at a first edge portion overlapping the first pad part 110 among a rear surface 200b of the second substrate 200.

Each of the plurality of second pads 211 may be electrically coupled to a corresponding link line through a pad contact hole disposed in a first insulation layer 202 and/or a second insulation layer 204 disposed at the rear surface 200b of the second substrate 200. Also, the plurality of second pads 211 may be respectively and individually coupled to the pads PVP, DP, RVP, GP, and CVP of the first pad part 110 through a routing portion 400.

The routing portion 400 may be disposed to surround an outer surface OS of the first substrate 100 and an outer surface OS of the second substrate 200. For example, the routing portion 400 may be disposed at each of a first outer surface (or one surface) OS1a among the outer surface OS of the first substrate 100 and a first outer surface (or one surface) OS1b among the outer surface OS of the second substrate 200.

The routing portion 400 according to an embodiment may include a plurality of routing lines 411 which are disposed at each of the first outer surface (or one surface) OS1a among the outer surface OS of the first substrate 100 and the first outer surface (or one surface) OS1b among the outer surface OS of the second substrate 200.

Each of the plurality of routing lines 411 may be formed to surround each of the first outer surface OS1a of the first substrate 100 and the first outer surface OS1b of the second substrate 200. For example, each of the plurality of routing lines 411 may be formed through a printing process using a conductive paste. For example, the conductive paste may include Ag paste, but embodiments of the present disclosure are not limited thereto.

In each of the plurality of routing lines 411, one end portion thereof may surround a first chamfer 100c and each of the pads PVP, DP, RVP, GP, and CVP of the first pad part 110 disposed at a first edge portion of the first substrate 100, the other end portion thereof may surround a second chamfer 200c and the second pad 211 of the second pad part 210 disposed at a first edge portion of the second substrate 200, and a center portion thereof between the one end portion and the other end portion may surround each of the first outer surface OS1a of the first substrate 100 and the first outer surface OS1b of the second substrate 200.

The routing portion 400 according to an embodiment of the present disclosure may further include an edge coating layer 413.

The edge coating layer 413 may be implemented to cover the plurality of routing lines 411. The edge coating layer 413 according to an embodiment may be implemented to cover all of the first edge portion and the first outer surface OS1a of the first substrate 100 and the first edge portion and the first outer surface OS1b of the second substrate 200, in addition to the plurality of routing lines 411. The edge coating layer 413 may prevent the corrosion of each of the plurality of routing lines 411 including a metal material or electrical short circuit between the plurality of routing lines 411. Also, the edge coating layer 413 may prevent, reduce or minimize the reflection of external light caused by the plurality of routing lines 411 and the pads of the first pad part 110. The edge coating layer 413 according to an embodiment may include a light blocking material including black ink.

A top surface of the edge coating layer 413 covering the first chamfer 100c of the first substrate 100 may be covered by the side sealing member 25.

An outer surface of the edge coating layer 413 may be an outermost outer surface of the first substrate 100. Thus, each of the outermost outer surface of the first substrate 100, an outer surface of the side sealing member 25, and an outer surface of the functional film 23 may be positioned (or aligned) at the same vertical line VL.

As described above, like the light emitting display apparatus illustrated in FIGS. 1 to 14, the light emitting display apparatus according to another embodiment of the present disclosure may prevent, reduce or minimize a reduction in reliability of the light emitting device ED caused by the lateral penetration of water or moisture according to loss or non-formation of the device isolation portion 15, and may have an air-bezel structure or a non-bezel structure where the display portion AA is surrounded by air instead of an opaque non-display area.

Figure 27:
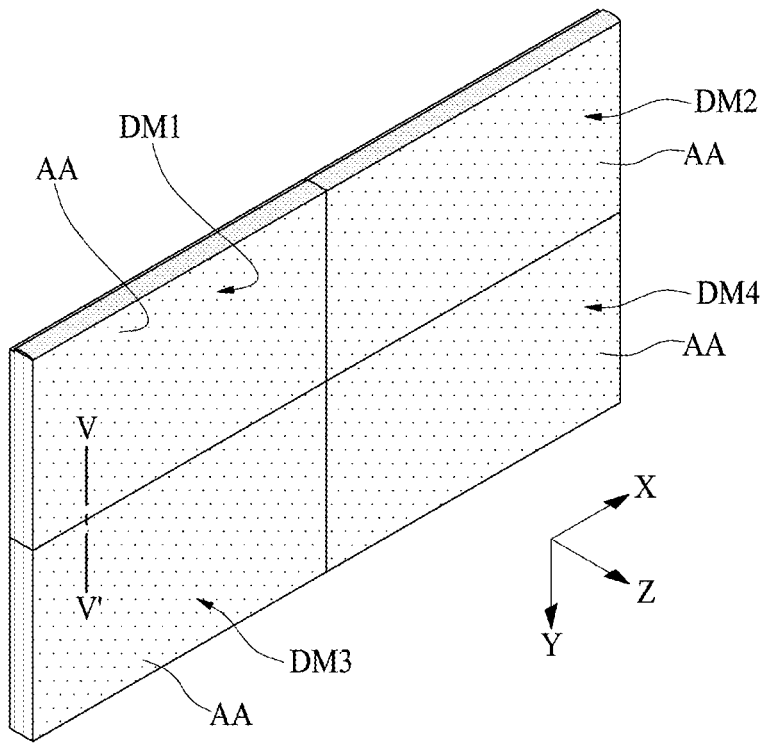
FIG. 27 is a diagram illustrating a multi-screen display apparatus according to an embodiment of the present disclosure.
Figure 28:
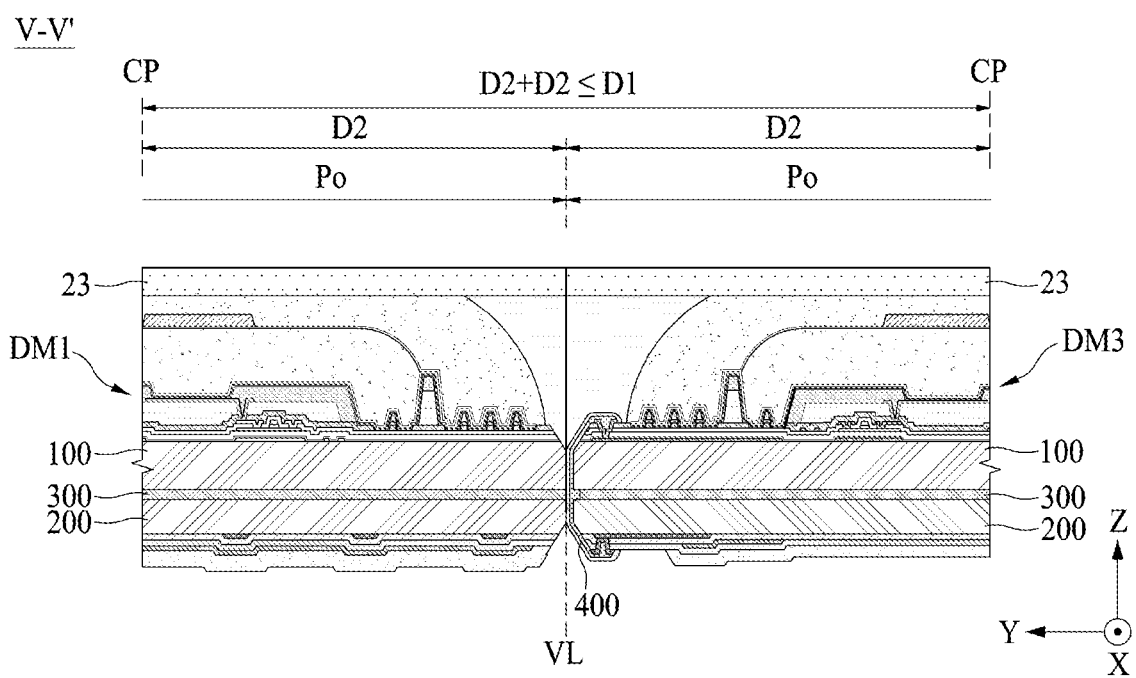
FIG. 28 is a cross-sectional view taken along line V-V' illustrated in FIG. 27.

FIG. 27 is a diagram illustrating a multi-screen display apparatus according to an embodiment of the present disclosure, and FIG. 28 is a cross-sectional view taken along line V-V' illustrated in FIG. 27. FIGS. 27 and 28 illustrate a multi-screen light emitting display apparatus implemented by tiling the display apparatus according to another embodiment of the present disclosure illustrated in FIGS. 15 to 26.

Referring to FIGS. 27 and 28, the multi-screen display apparatus (or a tiling display apparatus) according to an embodiment of the present disclosure may include a plurality of display apparatuses DM1 to DM4.

The plurality of display apparatuses DM1 to DM4 may each display an individual image or may divisionally display one image. Each of the plurality of display apparatuses DM1 to DM4 may include the light emitting display apparatus according to an embodiment of the present disclosure illustrated in FIGS. 15 to 26, and thus, their repetitive descriptions are omitted or will be briefly given.

The plurality of display apparatuses DM1 to DM4 may be tiled on a separate tiling frame to contact each other at a side surface thereof. For example, the plurality of display apparatuses DM1 to DM4 may be tiled to have an N×M form, thereby implementing a multi-screen display apparatus having a large screen. For example, N is a positive integer of 1 or more and M is a positive integer of 2 or more, but embodiments of the present disclosure are not limited thereto, for example, N is a positive integer of 2 or more and M is a positive integer of 1 or more.

Each of the plurality of display apparatuses DM1 to DM4 may not include a bezel area (or a non-display area) surrounding all of a display area AA where an image is displayed, and may have an air-bezel structure where the display area AA is surrounded by air. For example, in each of the plurality of display apparatuses DM1 to DM4, all of a first surface of a first substrate 100 may be implemented as the display area AA.

According to the present embodiment, in each of the plurality of display apparatuses DM1 to DM4, a second interval D2 between a center portion CP of an outermost pixel Po and an outermost outer surface VL of the first substrate 100 may be implemented to be half or less of a first interval D1 (or a pixel pitch) between adjacent pixels. Accordingly, in two adjacent display apparatuses DM1 to DM4 coupled to (or contacting) each other at side surfaces thereof along the first direction X and the second direction Y based on a lateral coupling manner, an interval "D2+D2" between adjacent outermost pixel areas PAo may be equal to or smaller than the first interval D1 between two adjacent pixels. Referring to FIG. 28, in first and third display apparatuses DM1 and DM3 coupled to (or contacting) each other at side surfaces thereof along the second direction Y, the interval "D2+D2" between a center portion CP of an outermost pixel Po of the first display apparatus DM1 and a center portion CP of an outermost pixel Po of the third display apparatus DM3 may be equal to or smaller than the first interval D1 (or a pixel pitch) between two adjacent pixels disposed in each of the first and third display apparatuses DM1 and DM3.

Therefore, the interval "D2+D2" between center portions CP of outermost pixels Po of two adjacent display apparatuses DM1 to DM4 coupled to (or contacting) each other at side surfaces thereof along the first direction X and the second direction Y may be equal to or smaller than the first interval D1 between two adjacent pixels disposed in each of the display apparatuses DM1 to DM4, and thus, there may be no seam or boundary portion between two adjacent display apparatuses DM1 to DM4, whereby there may be no dark area caused by a boundary portion provided between the display apparatuses DM1 to DM4. As a result, the image displayed on the multi-screen display apparatus in which the plurality of display apparatuses DM1, DM2, DM3, and DM4 is tiled in an N×M form may be displayed continuously without a sense of disconnection (or discontinuity) at boundary portion between the plurality of display apparatuses DM1, DM2, DM3, and DM4.

In FIGS. 27 and 28, it is illustrated that the plurality of display apparatuses DM1 to DM4 are tiled in a 2×2 form, but embodiments of the present disclosure are not limited thereto, and the plurality of display apparatuses DM1 to DM4 may be tiled in an x×1 form, a 1×y form, or an x×y form. For example, x and y may be two or more natural numbers equal to or different from each other. For example, x may be two or more natural numbers or equal to y. y may be two or more natural numbers or greater or smaller than x.

As described above, when display area AA of each of the plurality of display apparatuses DM1 to DM4 is one screen and displays one image, a multi-screen display apparatus according to the present disclosure may display an image which is not disconnected and is continuous at a boundary portion between the plurality of display apparatuses DM1 to DM4, and thus, the immersion of a viewer watching an image displayed by the multi-screen display apparatus may be enhanced.

A light emitting display apparatus according to the present disclosure will be described below.

A light emitting display apparatus according to some embodiments of the present disclosure comprises a substrate, a light emitting device layer including a light emitting device disposed on the substrate, a dam pattern portion disposed at an edge portion of the substrate, an encapsulation layer disposed on the light emitting device layer and including an organic material disposed in an inner region surrounded by the dam pattern portion, and a device isolation portion disposed at the edge portion of the substrate to isolate the light emitting device, the dam pattern portion comprises a discontinuous dam pattern disposed along the edge portion of the substrate.

According to some embodiments of the present disclosure, the dam pattern portion may further comprise a continuous dam pattern disposed on the discontinuous dam pattern to have a closed loop line shape.

According to some embodiments of the present disclosure, the discontinuous dam pattern may comprise a plurality of line dam patterns spaced apart from one another along the edge portion of the substrate, and a plurality of pattern disconnection portions between the plurality of line dam patterns, and the continuous dam pattern may be filled into each of the plurality of pattern disconnection portions and disposed on the plurality of line dam patterns.

According to some embodiments of the present disclosure, the discontinuous dam pattern and the continuous dam pattern may comprise the same material.

According to some embodiments of the present disclosure, the discontinuous dam pattern and the continuous dam pattern may comprise different materials.

The light emitting display apparatus according to some embodiments of the present disclosure may further comprise a planarization layer disposed under the light emitting device layer, and a wavelength conversion layer including a wavelength conversion member disposed on the encapsulation layer, the discontinuous dam pattern may comprise the same material as a material of the planarization layer or the wavelength conversion member.

The light emitting display apparatus according to some embodiments of the present disclosure may further comprise a planarization layer disposed under the light emitting device layer, a wavelength conversion layer including a wavelength conversion member disposed on the encapsulation layer, and a bank disposed on the planarization layer to define a pixel area in the substrate, the discontinuous dam pattern comprises the same material as a material of any one among the planarization layer, the wavelength conversion member, and the bank.

According to some embodiments of the present disclosure, the dam pattern portion may further comprise an auxiliary dam pattern disposed on the continuous dam pattern to have a closed loop line shape, and the auxiliary dam pattern may comprise the same material as a material of the planarization layer or the bank.

According to some embodiments of the present disclosure, the dam pattern portion may further comprise a metal dam pattern disposed on the discontinuous dam pattern, and a continuous dam pattern disposed on the metal dam pattern to have a closed loop line shape.

According to some embodiments of the present disclosure, the discontinuous dam pattern may comprise a plurality of line dam patterns spaced apart from one another along the edge portion of the substrate, and a plurality of pattern disconnection portions between the plurality of line dam patterns, the metal dam pattern may be disposed on the plurality of line dam patterns, and the continuous dam pattern may be filled into each of the plurality of pattern disconnection portions and disposed on the metal dam pattern.

According to some embodiments of the present disclosure, the device isolation portion may comprise a first device isolation pattern surrounded by the dam pattern portion, and a second device isolation pattern surrounding by the dam pattern portion.

A light emitting display apparatus according to some embodiments of the present disclosure may comprise a substrate, a device isolation portion including a first device isolation pattern and a second device isolation pattern disposed at an edge portion of the substrate to have an eaves structure, a light emitting device layer disposed on the substrate, a dam pattern portion disposed between the first device isolation pattern and the second device isolation pattern, and an encapsulation layer including an organic material disposed on the light emitting device layer and disposed in an inner region surrounded by the dam pattern portion, the light emitting device layer may comprise a light emitting device including an isolation region isolated by the device isolation portion, and the dam pattern portion may comprise a first dam pattern including a plurality of line dam patterns spaced apart from one another and a second dam pattern filled between the plurality of line dam patterns and disposed on the plurality of line dam patterns.

According to some embodiments of the present disclosure, the first dam pattern and the second dam pattern may comprise the same material.

A light emitting display apparatus according to some embodiments of the present disclosure may further comprise a planarization layer disposed under the light emitting device layer, the first dam pattern and the second dam pattern may comprise the same material as a material of the planarization layer.

According to some embodiments of the present disclosure, the dam pattern portion may further comprise a metal dam pattern disposed between the first dam pattern and the second dam pattern, the second dam pattern may be filled between the plurality of line dam patterns and disposed on the metal dam pattern.

A light emitting display apparatus according to some embodiments of the present disclosure may further comprise a passivation layer disposed on the substrate to support the dam pattern portion, each of the first device isolation pattern and the second device isolation pattern may comprise a first isolation structure implemented as the passivation layer, a metal pattern layer disposed on the first isolation structure, the metal pattern layer being wider than a top surface of the first isolation structure, and a second isolation structure formed on the metal pattern layer.

According to some embodiments of the present disclosure, a lateral surface of the first isolation structure may be configured to have an undercut structure with respect to the metal pattern layer, and the light emitting device may be isolated by the undercut structure.

According to some embodiments of the present disclosure, the encapsulation layer may comprise a first encapsulation layer disposed on the light emitting device layer and the device isolation portion, a second encapsulation layer including an organic material disposed in an inner region surrounded by the dam pattern portion, and a third encapsulation layer surrounding the second encapsulation layer disposed inside the dam pattern portion and the first encapsulation layer disposed outside from the dam pattern portion.

According to some embodiments of the present disclosure, the substrate may comprise a display area including a plurality of pixels having the light emitting device, and a size of the display area may be the same as a size of the substrate.

A multi-screen display apparatus according to the present disclosure will be described below.

A multi-screen display apparatus according to some embodiments of the present disclosure may comprise a plurality of display apparatuses disposed along at least one direction of a first direction and a second direction crossing the first direction, each of the plurality of display apparatuses may comprise a light emitting display apparatus, the light emitting display apparatus may comprise a substrate, a light emitting device layer including a light emitting device disposed on the substrate, a dam pattern portion disposed at an edge portion of the substrate, an encapsulation layer disposed on the light emitting device layer and including an organic material disposed in an inner region surrounded by the dam pattern portion, and a device isolation portion disposed at the edge portion of the substrate to isolate the light emitting device, the dam pattern portion may comprise a discontinuous dam pattern disposed along the edge portion of the substrate.

A multi-screen display apparatus according to some embodiments of the present disclosure may comprise a plurality of display apparatuses disposed along at least one direction of a first direction and a second direction crossing the first direction, each of the plurality of display apparatuses may comprise a light emitting display apparatus, the light emitting display apparatus may comprise a substrate, a device isolation portion including a first device isolation pattern and a second device isolation pattern disposed at an edge portion of the substrate to have an eaves structure, a light emitting device layer disposed on the substrate, a dam pattern portion disposed between the first device isolation pattern and the second device isolation pattern, and an encapsulation layer including an organic material disposed on the light emitting device layer and disposed in an inner region surrounded by the dam pattern portion, the light emitting device layer may comprise a light emitting device including an isolation region isolated by the device isolation portion, and the dam pattern portion may comprise a first dam pattern including a plurality of line dam patterns spaced apart from one another and a second dam pattern filled between the plurality of line dam patterns and disposed on the plurality of line dam patterns.

According to some embodiments of the present disclosure, the substrate of each of the plurality of display apparatuses may comprise a display area including a plurality of pixels having the light emitting device, and a size of the display area may be the same as a size of the substrate.

According to some embodiments of the present disclosure, the device isolation portion of each of the plurality of display apparatuses may comprise a first device isolation pattern surrounded by the dam pattern portion, and a second device isolation pattern surrounding the dam pattern portion.

According to some embodiments of the present disclosure, each of the plurality of display apparatuses may comprise a passivation layer disposed on the substrate to support the dam pattern portion, each of the first device isolation pattern and the second device isolation pattern may comprise a first isolation structure implemented as the passivation layer, a metal pattern layer disposed on the first isolation structure, the metal pattern layer being wider than a top surface of the first isolation structure, and a second isolation structure formed on the metal pattern layer.

According to some embodiments of the present disclosure, a lateral surface of the first isolation structure may be configured to have an undercut structure with respect to the metal pattern layer, and the light emitting device may be isolated by the undercut structure.

According to some embodiments of the present disclosure, the encapsulation layer of each of the plurality of display apparatuses may comprise a first encapsulation layer disposed on the light emitting device layer and the device isolation portion, a second encapsulation layer including an organic material disposed in an inner region surrounded by the dam pattern portion, and a third encapsulation layer surrounding the second encapsulation layer disposed inside the dam pattern portion and the first encapsulation layer disposed outside from the dam pattern portion.

The light emitting display apparatus according to the present disclosure may be applied to all electronic devices including a light emitting display panel. For example, the light emitting display apparatus according to the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A light emitting display apparatus comprising:
a substrate;
a light emitting device layer including a light emitting device disposed on the substrate;
a dam pattern portion disposed at an edge portion of the substrate and in contact with the light emitting device layer;

an encapsulation layer disposed on the light emitting device layer and including an organic material disposed in an inner region surrounded by the dam pattern portion; and
a device isolation portion disposed at the edge portion of the substrate to isolate the light emitting device,
wherein the dam pattern portion includes:
a discontinuous dam pattern disposed along the edge portion of the substrate and configured to include a plurality of line dam patterns spaced apart from one another to have a gap space, and
a continuous dam pattern disposed on the discontinuous dam pattern,
wherein the continuous dam pattern includes a plurality of protruding patterns protruding into the gap space between the plurality of line dam patterns.

2. The light emitting display apparatus of claim 1, wherein the continuous dam pattern is configured to have a closed loop line shape.

3. The light emitting display apparatus of claim 2,
wherein the discontinuous dam pattern further comprises:
a plurality of pattern disconnection portions corresponding to the gap space between the plurality of line dam patterns, and
wherein each of the plurality of protruding patterns is filled in each of the plurality of pattern disconnection portions.

4. The light emitting display apparatus of claim 2, further comprising:
a planarization layer disposed under the light emitting device layer;
a wavelength conversion layer including a wavelength conversion member disposed on the encapsulation layer; and
a bank disposed on the planarization layer, the bank bordering a pixel area in the substrate,
wherein the discontinuous dam pattern comprises the same material as a material of any one among the planarization layer, the wavelength conversion member, and the bank.

5. The light emitting display apparatus of claim 4, wherein:
the dam pattern portion further comprises an auxiliary dam pattern disposed on the continuous dam pattern to have a closed loop line shape, and
the auxiliary dam pattern comprises the same material as a material of the planarization layer or the bank.

6. The light emitting display apparatus of claim 1, wherein the discontinuous dam pattern and the continuous dam pattern comprise the same material.

7. The light emitting display apparatus of claim 1, wherein the discontinuous dam pattern and the continuous dam pattern comprise different materials.

8. The light emitting display apparatus of claim 1, further comprising:
a planarization layer disposed under the light emitting device layer; and
a wavelength conversion layer including a wavelength conversion member disposed on the encapsulation layer,
wherein the discontinuous dam pattern comprises the same material as a material of the planarization layer or the wavelength conversion member.

9. The light emitting display apparatus of claim 1, wherein the dam pattern portion further comprises:
a metal dam pattern between the discontinuous dam pattern and the continuous dam pattern.

10. The light emitting display apparatus of claim 9,
wherein the discontinuous dam pattern further comprises:
a plurality of pattern disconnection portions corresponding to the gap space between the plurality of line dam patterns,
wherein the metal dam pattern is disposed on the plurality of line dam patterns, and
wherein each of the plurality of protruding patterns is filled in each of the plurality of pattern disconnection portions.

11. The light emitting display apparatus of claim 1, wherein the device isolation portion comprises:
a first device isolation pattern surrounded by the dam pattern portion; and
a second device isolation pattern surrounding the dam pattern portion.

12. The light emitting display apparatus of claim 11, further comprising a passivation layer disposed on the substrate to support the dam pattern portion,
wherein each of the first device isolation pattern and the second device isolation pattern comprises:
a first isolation structure implemented as the passivation layer;
a metal pattern layer disposed on the first isolation structure, the metal pattern layer being wider than a top surface of the first isolation structure; and
a second isolation structure formed on the metal pattern layer.

13. The light emitting display apparatus of claim 12,
wherein a lateral surface of the first isolation structure is configured to have an undercut structure with respect to the metal pattern layer, and
wherein the light emitting device is isolated by the undercut structure.

14. The light emitting display apparatus of claim 1, wherein the encapsulation layer comprises:
a first encapsulation layer disposed on the light emitting device layer and the device isolation portion;
a second encapsulation layer including an organic material disposed in the inner region surrounded by the dam pattern portion; and
a third encapsulation layer surrounding the second encapsulation layer, the third encapsulation layer being disposed inside from the dam pattern portion and the first encapsulation layer being disposed outside from the dam pattern portion.

15. The light emitting display apparatus of claim 1, wherein:
the substrate comprises a display area including a plurality of pixels having the light emitting device.

16. A multi-screen display apparatus comprising:
a plurality of display apparatuses disposed along at least one direction of a first direction and a second direction crossing the first direction,
wherein each of the plurality of display apparatuses includes a light emitting display apparatus, the light emitting display apparatus including:
a substrate;
a light emitting device layer including a light emitting device disposed on the substrate;
a dam pattern portion disposed at an edge portion of the substrate and in contact with the light emitting device layer;
an encapsulation layer disposed on the light emitting device layer and including an organic material disposed in an inner region surrounded by the dam pattern portion; and a device isolation portion disposed at the edge portion of the substrate to isolate the light emitting device, wherein the dam pattern portion includes:
- a discontinuous dam pattern disposed along the edge portion of the substrate and configured to include a plurality of line dam patterns spaced apart from one another to have a gap space, and
- a continuous dam pattern disposed on the discontinuous dam pattern,
  - wherein the continuous dam pattern includes a plurality of protruding patterns protruding into the gap space between the plurality of line dam patterns.

17. The multi-screen display apparatus of claim 16, wherein:

the substrate of each of the plurality of display apparatuses comprises a display area including a plurality of pixels having the light emitting device.

18. The multi-screen display apparatus of claim 16, wherein the encapsulation layer comprises:
- a first encapsulation layer disposed on the light emitting device layer and the device isolation portion;
- a second encapsulation layer including an organic material disposed in an inner region surrounded by the dam pattern portion; and
- a third encapsulation layer surrounding the second encapsulation layer disposed inside from the dam pattern portion and the first encapsulation layer disposed outside from the dam pattern portion.

19. A light emitting display apparatus comprising:
- a substrate;
- a light emitting device layer including a light emitting device disposed on the substrate;
- a dam pattern portion disposed at an edge portion of the substrate;
- an encapsulation layer disposed on the light emitting device layer and including an organic material disposed in an inner region surrounded by the dam pattern portion; and
- a device isolation portion disposed at the edge portion of the substrate to isolate the light emitting device, wherein the dam pattern portion includes:
- a discontinuous dam pattern disposed along the edge portion of the substrate, and
- a continuous dam pattern disposed on the discontinuous dam pattern, and
  - wherein the discontinuous dam pattern and the continuous dam pattern comprise a same material.

20. The light emitting display apparatus of claim 19, wherein the dam pattern portion further comprises a metal dam pattern disposed between the discontinuous dam pattern and the continuous dam pattern.

* * * * *